United States Patent [19]
Maeno

[11] Patent Number: 5,592,424
[45] Date of Patent: Jan. 7, 1997

[54] SEMICONDUCTOR INTEGRATED CIRCUIT DEVICE

[75] Inventor: Hideshi Maeno, Itami, Japan

[73] Assignee: Mitsubishi Denki Kabushiki Kaisha, Tokyo, Japan

[21] Appl. No.: 521,585

[22] Filed: Aug. 30, 1995

[30] Foreign Application Priority Data

Feb. 27, 1995 [JP] Japan .................................. 7-038474

[51] Int. Cl.⁶ ...................................................... G11C 7/00
[52] U.S. Cl. ................... 365/201; 365/189.12; 365/239; 365/240; 365/233
[58] Field of Search .............................. 365/201, 189.12, 365/239, 240, 230.08, 233

[56] References Cited

U.S. PATENT DOCUMENTS

| | | | |
|---|---|---|---|
| 4,677,590 | 6/1987 | Bisotto et al. | 365/240 |
| 4,899,307 | 2/1990 | Lenoski | 365/240 |
| 4,959,813 | 9/1990 | Todoroki | 365/240 |

FOREIGN PATENT DOCUMENTS 63-204325  8/1988  Japan .
6251600   of 1994 Japan .

OTHER PUBLICATIONS

International Test Conference 1992, Paper 31.1, pp. 598–607, 1992, M. Nicolaidis, "Transparent Bist For Rams".

*Primary Examiner*—David C. Nelms
*Assistant Examiner*—Vu A. Le
*Attorney, Agent, or Firm*—Oblon, Spivak, McClelland, Maier & Neustadt, P.C.

[57] ABSTRACT

A semiconductor integrated circuit device easily finds whether an error is located in an X decoder or a Y decoder. Circuit generating full cyclic sequences (36) and (38) are disposed which correspond to an X decoder (32) and a Y decoder (33), respectively, of a memory circuit (21). A specific state detection circuit (37) detects a specific address state of the circuit generating full cyclic sequence (36) so that one of an X address and a Y address is changed only after the other one of the X address and the Y address is thoroughly changed. Since when the error was created is known, which one of the X decoder and the Y decoder is responsible for the error is easily found.

12 Claims, 40 Drawing Sheets

FIG. 2

| TIME T | A4 (XA2) | A3 (XA1) | A2 (XA0) | A1 (YA1) | A0 (YA0) | ADDRESS A4~0 (DECIMAL) | X ADDRESS XA2~0 (DECIMAL) | Y ADDRESS YA1~0 (DECIMAL) |
|---|---|---|---|---|---|---|---|---|
| 0  | 0 | 0 | 0 | 0 | 0 | 0  | 0 | 0 |
| 1  | 0 | 0 | 0 | 1 | 0 | 2  | 0 | 2 |
| 2  | 0 | 0 | 0 | 1 | 1 | 3  | 0 | 3 |
| 3  | 0 | 0 | 0 | 0 | 1 | 1  | 0 | 1 |
| 4  | 1 | 0 | 0 | 0 | 0 | 16 | 4 | 0 |
| 5  | 1 | 0 | 0 | 1 | 0 | 18 | 4 | 2 |
| 6  | 1 | 0 | 0 | 1 | 1 | 19 | 4 | 3 |
| 7  | 1 | 0 | 0 | 0 | 1 | 17 | 4 | 1 |
| 8  | 0 | 1 | 0 | 0 | 0 | 8  | 2 | 0 |
| 9  | 0 | 1 | 0 | 1 | 0 | 10 | 2 | 2 |
| 10 | 0 | 1 | 0 | 1 | 1 | 11 | 2 | 3 |
| 11 | 0 | 1 | 0 | 0 | 1 | 9  | 2 | 1 |
| 12 | 1 | 0 | 1 | 0 | 0 | 20 | 5 | 0 |
| 13 | 1 | 0 | 1 | 1 | 0 | 22 | 5 | 2 |
| 14 | 1 | 0 | 1 | 1 | 1 | 23 | 5 | 3 |
| 15 | 1 | 0 | 1 | 0 | 1 | 21 | 5 | 1 |
| 16 | 1 | 1 | 0 | 0 | 0 | 24 | 6 | 0 |
| 17 | 1 | 1 | 0 | 1 | 0 | 26 | 6 | 2 |
| 18 | 1 | 1 | 0 | 1 | 1 | 27 | 6 | 3 |
| 19 | 1 | 1 | 0 | 0 | 1 | 25 | 6 | 1 |
| 20 | 1 | 1 | 1 | 0 | 0 | 28 | 7 | 0 |
| 21 | 1 | 1 | 1 | 1 | 0 | 30 | 7 | 2 |
| 22 | 1 | 1 | 1 | 1 | 1 | 31 | 7 | 3 |
| 23 | 1 | 1 | 1 | 0 | 1 | 29 | 7 | 1 |
| 24 | 0 | 1 | 1 | 0 | 0 | 12 | 3 | 0 |
| 25 | 0 | 1 | 1 | 1 | 0 | 14 | 3 | 2 |
| 26 | 0 | 1 | 1 | 1 | 1 | 15 | 3 | 3 |
| 27 | 0 | 1 | 1 | 0 | 1 | 13 | 3 | 1 |
| 28 | 0 | 0 | 1 | 0 | 0 | 4  | 1 | 0 |
| 29 | 0 | 0 | 1 | 1 | 0 | 6  | 1 | 2 |
| 30 | 0 | 0 | 1 | 1 | 1 | 7  | 1 | 3 |
| 31 | 0 | 0 | 1 | 0 | 1 | 5  | 1 | 1 |

FIG. 4

| TIME T | A 4 (XA2) | A 3 (XA1) | A 2 (XA0) | A 1 (YA1) | A 0 (YA0) | ADDRESS A4~0 (DECIMAL) | X ADDRESS XA2~0 (DECIMAL) | Y ADDRESS YA1~0 (DECIMAL) |
|---|---|---|---|---|---|---|---|---|
| 0 | 0 | 0 | 0 | 0 | 0 | 0 | 0 | 0 |
| 1 | 1 | 0 | 0 | 0 | 0 | 16 | 4 | 0 |
| 2 | 0 | 1 | 0 | 0 | 0 | 8 | 2 | 0 |
| 3 | 1 | 0 | 1 | 0 | 0 | 20 | 5 | 0 |
| 4 | 1 | 1 | 0 | 0 | 0 | 24 | 6 | 0 |
| 5 | 1 | 1 | 1 | 0 | 0 | 28 | 7 | 0 |
| 6 | 0 | 1 | 1 | 0 | 0 | 12 | 3 | 0 |
| 7 | 0 | 0 | 1 | 0 | 0 | 4 | 1 | 0 |
| 8 | 0 | 0 | 0 | 1 | 0 | 2 | 0 | 2 |
| 9 | 1 | 0 | 0 | 1 | 0 | 18 | 4 | 2 |
| 10 | 0 | 1 | 0 | 1 | 0 | 10 | 2 | 2 |
| 11 | 1 | 0 | 1 | 1 | 0 | 24 | 5 | 2 |
| 12 | 1 | 1 | 0 | 1 | 0 | 26 | 6 | 2 |
| 13 | 1 | 1 | 1 | 1 | 0 | 30 | 7 | 2 |
| 14 | 0 | 1 | 1 | 1 | 0 | 14 | 3 | 2 |
| 15 | 0 | 0 | 1 | 1 | 0 | 6 | 1 | 2 |
| 16 | 0 | 0 | 0 | 1 | 1 | 3 | 0 | 3 |
| 17 | 1 | 0 | 0 | 1 | 1 | 19 | 4 | 3 |
| 18 | 0 | 1 | 0 | 1 | 1 | 11 | 2 | 3 |
| 19 | 1 | 0 | 1 | 1 | 1 | 23 | 5 | 3 |
| 20 | 1 | 1 | 0 | 1 | 1 | 27 | 6 | 3 |
| 21 | 1 | 1 | 1 | 1 | 1 | 31 | 7 | 3 |
| 22 | 0 | 1 | 1 | 1 | 1 | 15 | 3 | 3 |
| 23 | 0 | 0 | 1 | 1 | 1 | 7 | 1 | 3 |
| 24 | 0 | 0 | 0 | 0 | 1 | 1 | 0 | 1 |
| 25 | 1 | 0 | 0 | 0 | 1 | 17 | 4 | 1 |
| 26 | 0 | 1 | 0 | 0 | 1 | 9 | 2 | 1 |
| 27 | 1 | 0 | 1 | 0 | 1 | 21 | 5 | 1 |
| 28 | 1 | 1 | 0 | 0 | 1 | 25 | 6 | 1 |
| 29 | 1 | 1 | 1 | 0 | 1 | 29 | 7 | 1 |
| 30 | 0 | 1 | 1 | 0 | 1 | 13 | 3 | 1 |
| 31 | 0 | 0 | 1 | 0 | 1 | 5 | 1 | 1 |

FIG. 7

| TIME T | A4 (XA2) | A3 (XA1) | A2 (XA0) | A1 (YA1) | A0 (YA0) | ADDRESS A4~0 (DECIMAL) | X ADDRESS XA2~0 (DECIMAL) | Y ADDRESS YA1~0 (DECIMAL) |
|---|---|---|---|---|---|---|---|---|
| 0 | 0 | 0 | 0 | 0 | 0 | 0 | 0 | 0 |
| 1 | 1 | 0 | 0 | 0 | 0 | 16 | 4 | 0 |
| 2 | 0 | 1 | 0 | 0 | 0 | 8 | 2 | 0 |
| 3 | 1 | 0 | 1 | 0 | 0 | 20 | 5 | 0 |
| 4 | 1 | 1 | 0 | 0 | 0 | 24 | 6 | 0 |
| 5 | 1 | 1 | 1 | 0 | 0 | 28 | 7 | 0 |
| 6 | 0 | 1 | 1 | 0 | 0 | 12 | 3 | 0 |
| 7 | 0 | 0 | 1 | 0 | 0 | 4 | 1 | 0 |
| 8 | 0 | 0 | 0 | 1 | 0 | 2 | 0 | 2 |
| 9 | 1 | 0 | 0 | 1 | 0 | 18 | 4 | 2 |
| 10 | 0 | 1 | 0 | 1 | 0 | 10 | 2 | 2 |
| 11 | 1 | 0 | 1 | 1 | 0 | 24 | 5 | 2 |
| 12 | 1 | 1 | 0 | 1 | 0 | 26 | 6 | 2 |
| 13 | 1 | 1 | 1 | 1 | 0 | 30 | 7 | 2 |
| 14 | 0 | 1 | 1 | 1 | 0 | 14 | 3 | 2 |
| 15 | 0 | 0 | 1 | 1 | 0 | 6 | 1 | 2 |
| 16 | 0 | 0 | 0 | 1 | 1 | 3 | 0 | 3 |
| 17 | 1 | 0 | 0 | 1 | 1 | 19 | 4 | 3 |
| 18 | 0 | 1 | 0 | 1 | 1 | 11 | 2 | 3 |
| 19 | 1 | 0 | 1 | 1 | 1 | 23 | 5 | 3 |
| 20 | 1 | 1 | 0 | 1 | 1 | 27 | 6 | 3 |
| 21 | 1 | 1 | 1 | 1 | 1 | 31 | 7 | 3 |
| 22 | 0 | 1 | 1 | 1 | 1 | 15 | 3 | 3 |
| 23 | 0 | 0 | 1 | 1 | 1 | 7 | 1 | 3 |
| 24 | 0 | 0 | 0 | 0 | 1 | 1 | 0 | 1 |
| 25 | 1 | 0 | 0 | 0 | 1 | 17 | 4 | 1 |
| 26 | 0 | 1 | 0 | 0 | 1 | 9 | 2 | 1 |
| 27 | 1 | 0 | 1 | 0 | 1 | 21 | 5 | 1 |
| 28 | 1 | 1 | 0 | 0 | 1 | 25 | 6 | 1 |
| 29 | 1 | 1 | 1 | 0 | 1 | 29 | 7 | 1 |
| 30 | 0 | 1 | 1 | 0 | 1 | 13 | 3 | 1 |
| 31 | 0 | 0 | 1 | 0 | 1 | 5 | 1 | 1 |

FIG. 9

| TIME T | A4 (XA2) | A3 (XA1) | A2 (XA0) | A1 (YA1) | A0 (YA0) | ADDRESS A4~0 (DECIMAL) | X ADDRESS XA2~0 (DECIMAL) | Y ADDRESS YA1~0 (DECIMAL) |
|---|---|---|---|---|---|---|---|---|
| 0 | 0 | 0 | 0 | 0 | 0 | 0 | 0 | 0 |
| 1 | 1 | 0 | 0 | 0 | 0 | 16 | 4 | 0 |
| 2 | 0 | 1 | 0 | 0 | 0 | 8 | 2 | 0 |
| 3 | 1 | 0 | 1 | 0 | 0 | 20 | 5 | 0 |
| 4 | 1 | 1 | 0 | 0 | 0 | 24 | 6 | 0 |
| 5 | 1 | 1 | 1 | 0 | 0 | 28 | 7 | 0 |
| 6 | 0 | 1 | 1 | 0 | 0 | 12 | 3 | 0 |
| 7 | 0 | 0 | 1 | 0 | 0 | 4 | 1 | 0 |
| 8 | 0 | 0 | 0 | 1 | 0 | 2 | 0 | 2 |
| 9 | 1 | 0 | 0 | 1 | 0 | 18 | 4 | 2 |
| 10 | 0 | 1 | 0 | 1 | 0 | 10 | 2 | 2 |
| 11 | 1 | 0 | 1 | 1 | 0 | 24 | 5 | 2 |
| 12 | 1 | 1 | 0 | 1 | 0 | 26 | 6 | 2 |
| 13 | 1 | 1 | 1 | 1 | 0 | 30 | 7 | 2 |
| 14 | 0 | 1 | 1 | 1 | 0 | 14 | 3 | 2 |
| 15 | 0 | 0 | 1 | 1 | 0 | 6 | 1 | 2 |
| 16 | 0 | 0 | 0 | 1 | 1 | 3 | 0 | 3 |
| 17 | 1 | 0 | 0 | 1 | 1 | 19 | 4 | 3 |
| 18 | 0 | 1 | 0 | 1 | 1 | 11 | 2 | 3 |
| 19 | 1 | 0 | 1 | 1 | 1 | 23 | 5 | 3 |
| 20 | 1 | 1 | 0 | 1 | 1 | 27 | 6 | 3 |
| 21 | 1 | 1 | 1 | 1 | 1 | 31 | 7 | 3 |
| 22 | 0 | 1 | 1 | 1 | 1 | 15 | 3 | 3 |
| 23 | 0 | 0 | 1 | 1 | 1 | 7 | 1 | 3 |
| 24 | 0 | 0 | 0 | 0 | 1 | 1 | 0 | 1 |
| 25 | 1 | 0 | 0 | 0 | 1 | 17 | 4 | 1 |
| 26 | 0 | 1 | 0 | 0 | 1 | 9 | 2 | 1 |
| 27 | 1 | 0 | 1 | 0 | 1 | 21 | 5 | 1 |
| 28 | 1 | 1 | 0 | 0 | 1 | 25 | 6 | 1 |
| 29 | 1 | 1 | 1 | 0 | 1 | 29 | 7 | 1 |
| 30 | 0 | 1 | 1 | 0 | 1 | 13 | 3 | 1 |
| 31 | 0 | 0 | 1 | 0 | 1 | 5 | 1 | 1 |

FIG. 12

| TIME T | A4 (XA2) | A3 (XA1) | A2 (XA0) | A1 (YA1) | A0 (YA0) | ADDRESS A4~0 (DECIMAL) | X ADDRESS XA2~0 (DECIMAL) | Y ADDRESS YA1~0 (DECIMAL) |
|---|---|---|---|---|---|---|---|---|
| 0 | 1 | 0 | 0 | 0 | 0 | 16 | 4 | 0 |
| 1 | 0 | 1 | 0 | 0 | 0 | 8 | 2 | 0 |
| 2 | 1 | 0 | 1 | 0 | 0 | 20 | 5 | 0 |
| 3 | 1 | 1 | 0 | 0 | 0 | 24 | 6 | 0 |
| 4 | 1 | 1 | 1 | 0 | 0 | 28 | 7 | 0 |
| 5 | 0 | 1 | 1 | 0 | 0 | 12 | 3 | 0 |
| 6 | 0 | 0 | 1 | 0 | 0 | 4 | 1 | 0 |
| 7 | 0 | 0 | 0 | 0 | 0 | 0 | 0 | 0 |
| 8 | 1 | 0 | 0 | 1 | 0 | 18 | 4 | 2 |
| 9 | 0 | 1 | 0 | 1 | 0 | 10 | 2 | 2 |
| 10 | 1 | 0 | 1 | 1 | 0 | 24 | 5 | 2 |
| 11 | 1 | 1 | 0 | 1 | 0 | 26 | 6 | 2 |
| 12 | 1 | 1 | 1 | 1 | 0 | 30 | 7 | 2 |
| 13 | 0 | 1 | 1 | 1 | 0 | 14 | 3 | 2 |
| 14 | 0 | 0 | 1 | 1 | 0 | 6 | 1 | 2 |
| 15 | 0 | 0 | 0 | 1 | 0 | 2 | 0 | 2 |
| 16 | 1 | 0 | 0 | 1 | 1 | 19 | 4 | 3 |
| 17 | 0 | 1 | 0 | 1 | 1 | 11 | 2 | 3 |
| 18 | 1 | 0 | 1 | 1 | 1 | 23 | 5 | 3 |
| 19 | 1 | 1 | 0 | 1 | 1 | 27 | 6 | 3 |
| 20 | 1 | 1 | 1 | 1 | 1 | 31 | 7 | 3 |
| 21 | 0 | 1 | 1 | 1 | 1 | 15 | 3 | 3 |
| 22 | 0 | 0 | 1 | 1 | 1 | 7 | 1 | 3 |
| 23 | 0 | 0 | 0 | 1 | 1 | 3 | 0 | 3 |
| 24 | 1 | 0 | 0 | 0 | 1 | 17 | 4 | 1 |
| 25 | 0 | 1 | 0 | 0 | 1 | 9 | 2 | 1 |
| 26 | 1 | 0 | 1 | 0 | 1 | 21 | 5 | 1 |
| 27 | 1 | 1 | 0 | 0 | 1 | 25 | 6 | 1 |
| 28 | 1 | 1 | 1 | 0 | 1 | 29 | 7 | 1 |
| 29 | 0 | 1 | 1 | 0 | 1 | 13 | 3 | 1 |
| 30 | 0 | 0 | 1 | 0 | 1 | 5 | 1 | 1 |
| 31 | 0 | 0 | 0 | 0 | 1 | 1 | 0 | 1 |

FIG. 15

CHDIR1='1', CHDIR2='1'

| TIME T | A4 (XA2) | A3 (XA1) | A2 (XA0) | A1 (YA1) | A0 (YA0) | ADDRESS A4~0 (DECIMAL) | X ADDRESS XA2~0 (DECIMAL) | Y ADDRESS YA1~0 (DECIMAL) |
|---|---|---|---|---|---|---|---|---|
| 0  | 0 | 0 | 1 | 0 | 1 | 5  | 1 | 1 |
| 1  | 0 | 1 | 1 | 0 | 1 | 13 | 3 | 1 |
| 2  | 1 | 1 | 1 | 0 | 1 | 29 | 7 | 1 |
| 3  | 1 | 1 | 0 | 0 | 1 | 25 | 6 | 1 |
| 4  | 1 | 0 | 1 | 0 | 1 | 21 | 5 | 1 |
| 5  | 0 | 1 | 0 | 0 | 1 | 9  | 2 | 1 |
| 6  | 1 | 0 | 0 | 0 | 1 | 17 | 4 | 1 |
| 7  | 0 | 0 | 0 | 0 | 1 | 1  | 0 | 1 |
| 8  | 0 | 0 | 1 | 1 | 1 | 7  | 1 | 3 |
| 9  | 0 | 1 | 1 | 1 | 1 | 15 | 3 | 3 |
| 10 | 1 | 1 | 1 | 1 | 1 | 31 | 7 | 3 |
| 11 | 1 | 1 | 0 | 1 | 1 | 27 | 6 | 3 |
| 12 | 1 | 0 | 1 | 1 | 1 | 23 | 5 | 3 |
| 13 | 0 | 1 | 0 | 1 | 1 | 11 | 2 | 3 |
| 14 | 1 | 0 | 0 | 1 | 1 | 19 | 4 | 3 |
| 15 | 0 | 0 | 0 | 1 | 1 | 3  | 0 | 3 |
| 16 | 0 | 0 | 1 | 1 | 0 | 6  | 1 | 2 |
| 17 | 0 | 1 | 1 | 1 | 0 | 14 | 3 | 2 |
| 18 | 1 | 1 | 1 | 1 | 0 | 30 | 7 | 2 |
| 19 | 1 | 1 | 0 | 1 | 0 | 26 | 6 | 2 |
| 20 | 1 | 0 | 1 | 1 | 0 | 24 | 5 | 2 |
| 21 | 0 | 1 | 0 | 1 | 0 | 10 | 2 | 2 |
| 22 | 1 | 0 | 0 | 1 | 0 | 18 | 4 | 2 |
| 23 | 0 | 0 | 0 | 1 | 0 | 2  | 0 | 2 |
| 24 | 0 | 0 | 1 | 0 | 0 | 4  | 1 | 0 |
| 25 | 0 | 1 | 1 | 0 | 0 | 12 | 3 | 0 |
| 26 | 1 | 1 | 1 | 0 | 0 | 28 | 7 | 0 |
| 27 | 1 | 1 | 0 | 0 | 0 | 24 | 6 | 0 |
| 28 | 1 | 0 | 1 | 0 | 0 | 20 | 5 | 0 |
| 29 | 0 | 1 | 0 | 0 | 0 | 8  | 2 | 0 |
| 30 | 1 | 0 | 0 | 0 | 0 | 16 | 4 | 0 |
| 31 | 0 | 0 | 0 | 0 | 0 | 0  | 0 | 0 |

FIG. 16

CHDIR1='0', CHDIR2='0'

| TIME T | A4 (XA2) | A3 (XA1) | A2 (XA0) | A1 (YA1) | A0 (YA0) | ADDRESS A4~0 (DECIMAL) | X ADDRESS XA2~0 (DECIMAL) | Y ADDRESS YA1~0 (DECIMAL) |
|---|---|---|---|---|---|---|---|---|
| 0 | 0 | 0 | 0 | 0 | 0 | 0 | 0 | 0 |
| 1 | 1 | 0 | 0 | 0 | 0 | 16 | 4 | 0 |
| 2 | 0 | 1 | 0 | 0 | 0 | 8 | 2 | 0 |
| 3 | 1 | 0 | 1 | 0 | 0 | 20 | 5 | 0 |
| 4 | 1 | 1 | 0 | 0 | 0 | 24 | 6 | 0 |
| 5 | 1 | 1 | 1 | 0 | 0 | 28 | 7 | 0 |
| 6 | 0 | 1 | 1 | 0 | 0 | 12 | 3 | 0 |
| 7 | 0 | 0 | 1 | 0 | 0 | 4 | 1 | 0 |
| 8 | 0 | 0 | 0 | 1 | 0 | 2 | 0 | 2 |
| 9 | 1 | 0 | 0 | 1 | 0 | 18 | 4 | 2 |
| 10 | 0 | 1 | 0 | 1 | 0 | 10 | 2 | 2 |
| 11 | 1 | 0 | 1 | 1 | 0 | 24 | 5 | 2 |
| 12 | 1 | 1 | 0 | 1 | 0 | 26 | 6 | 2 |
| 13 | 1 | 1 | 1 | 1 | 0 | 30 | 7 | 2 |
| 14 | 0 | 1 | 1 | 1 | 0 | 14 | 3 | 2 |
| 15 | 0 | 0 | 1 | 1 | 0 | 6 | 1 | 2 |
| 16 | 0 | 0 | 0 | 1 | 1 | 3 | 0 | 3 |
| 17 | 1 | 0 | 0 | 1 | 1 | 19 | 4 | 3 |
| 18 | 0 | 1 | 0 | 1 | 1 | 11 | 2 | 3 |
| 19 | 1 | 0 | 1 | 1 | 1 | 23 | 5 | 3 |
| 20 | 1 | 1 | 0 | 1 | 1 | 27 | 6 | 3 |
| 21 | 1 | 1 | 1 | 1 | 1 | 31 | 7 | 3 |
| 22 | 0 | 1 | 1 | 1 | 1 | 15 | 3 | 3 |
| 23 | 0 | 0 | 1 | 1 | 1 | 7 | 1 | 3 |
| 24 | 0 | 0 | 0 | 0 | 1 | 1 | 0 | 1 |
| 25 | 1 | 0 | 0 | 0 | 1 | 17 | 4 | 1 |
| 26 | 0 | 1 | 0 | 0 | 1 | 9 | 2 | 1 |
| 27 | 1 | 0 | 1 | 0 | 1 | 21 | 5 | 1 |
| 28 | 1 | 1 | 0 | 0 | 1 | 25 | 6 | 1 |
| 29 | 1 | 1 | 1 | 0 | 1 | 29 | 7 | 1 |
| 30 | 0 | 1 | 1 | 0 | 1 | 13 | 3 | 1 |
| 31 | 0 | 0 | 1 | 0 | 1 | 5 | 1 | 1 |

FIG. 21

CHDIR1='0'

| TIME T | A 3 (XA2) | A 2 (XA1) | A 1 (XA0) | A 0 (YA0) | ADDRESS A3~0 (DECIMAL) | X ADDRESS XA2~0 (DECIMAL) | Y ADDRESS YA1 (DECIMAL) |
|---|---|---|---|---|---|---|---|
| 0 | 0 | 0 | 0 | 0 | 0 | 0 | 0 |
| 1 | 1 | 0 | 0 | 0 | 8 | 4 | 0 |
| 2 | 0 | 1 | 0 | 0 | 4 | 2 | 0 |
| 3 | 1 | 0 | 1 | 0 | 10 | 5 | 0 |
| 4 | 1 | 1 | 0 | 0 | 12 | 6 | 0 |
| 5 | 1 | 1 | 1 | 0 | 14 | 7 | 0 |
| 6 | 0 | 1 | 1 | 0 | 6 | 3 | 0 |
| 7 | 0 | 0 | 1 | 0 | 2 | 1 | 0 |
| 8 | 0 | 0 | 0 | 1 | 1 | 0 | 1 |
| 9 | 1 | 0 | 0 | 1 | 9 | 4 | 1 |
| 10 | 0 | 1 | 0 | 1 | 5 | 2 | 1 |
| 11 | 1 | 0 | 1 | 1 | 11 | 5 | 1 |
| 12 | 1 | 1 | 0 | 1 | 13 | 6 | 1 |
| 13 | 1 | 1 | 1 | 1 | 15 | 7 | 1 |
| 14 | 0 | 1 | 1 | 1 | 7 | 3 | 1 |
| 15 | 0 | 0 | 1 | 1 | 3 | 1 | 1 |

FIG. 22

CHDIR1='0'

| TIME T | A 3 (XA2) | A 2 (XA1) | A 1 (XA0) | A 0 (YA0) | ADDRESS A3~0 (DECIMAL) | X ADDRESS XA2~0 (DECIMAL) | Y ADDRESS YA1 (DECIMAL) |
|---|---|---|---|---|---|---|---|
| 0 | 0 | 0 | 1 | 1 | 3 | 1 | 1 |
| 1 | 0 | 1 | 1 | 1 | 7 | 3 | 1 |
| 2 | 1 | 1 | 1 | 1 | 15 | 7 | 1 |
| 3 | 1 | 1 | 0 | 1 | 13 | 6 | 1 |
| 4 | 1 | 0 | 1 | 1 | 11 | 5 | 1 |
| 5 | 0 | 1 | 0 | 1 | 5 | 2 | 1 |
| 6 | 1 | 0 | 0 | 1 | 9 | 4 | 1 |
| 7 | 0 | 0 | 0 | 1 | 1 | 0 | 1 |
| 8 | 0 | 0 | 1 | 0 | 2 | 1 | 0 |
| 9 | 0 | 1 | 1 | 0 | 6 | 3 | 0 |
| 10 | 1 | 1 | 1 | 0 | 14 | 7 | 0 |
| 11 | 1 | 1 | 0 | 0 | 12 | 6 | 0 |
| 12 | 1 | 0 | 1 | 0 | 10 | 5 | 0 |
| 13 | 0 | 1 | 0 | 0 | 4 | 2 | 0 |
| 14 | 1 | 0 | 0 | 0 | 8 | 4 | 0 |
| 15 | 0 | 0 | 0 | 0 | 0 | 0 | 0 |

FIG. 27

CHDIR1='0', CHDIR2='0'

| TIME T | A3 (XA2) | A2 (XA1) | A1 (XA0) | A0 (YA0) | ADDRESS A3~0 (DECIMAL) | X ADDRESS XA2~0 (DECIMAL) | Y ADDRESS YA1 (DECIMAL) |
|---|---|---|---|---|---|---|---|
| 0 | 0 | 0 | 0 | 0 | 0 | 0 | 0 |
| 1 | 0 | 0 | 0 | 1 | 1 | 0 | 1 |
| 2 | 1 | 0 | 0 | 0 | 8 | 4 | 0 |
| 3 | 1 | 0 | 0 | 1 | 9 | 4 | 1 |
| 4 | 0 | 1 | 0 | 0 | 4 | 2 | 0 |
| 5 | 0 | 1 | 0 | 1 | 5 | 2 | 1 |
| 6 | 1 | 0 | 1 | 0 | 10 | 5 | 0 |
| 7 | 1 | 0 | 1 | 1 | 11 | 5 | 1 |
| 8 | 1 | 1 | 0 | 0 | 12 | 6 | 0 |
| 9 | 1 | 1 | 0 | 1 | 13 | 6 | 1 |
| 10 | 1 | 1 | 1 | 0 | 14 | 7 | 0 |
| 11 | 1 | 1 | 1 | 1 | 15 | 7 | 1 |
| 12 | 0 | 1 | 1 | 0 | 6 | 3 | 0 |
| 13 | 0 | 1 | 1 | 1 | 7 | 3 | 1 |
| 14 | 0 | 0 | 1 | 0 | 2 | 1 | 0 |
| 15 | 0 | 0 | 1 | 1 | 3 | 1 | 1 |

FIG. 28

CHDIR1='1', CHDIR2='1'

| TIME T | A 3 (XA2) | A 2 (XA1) | A 1 (XA0) | A 0 (YA0) | ADDRESS A 3~0 (DECIMAL) | X ADDRESS XA2~0 (DECIMAL) | Y ADDRESS YA1 (DECIMAL) |
|---|---|---|---|---|---|---|---|
| 0 | 0 | 0 | 1 | 1 | 3 | 1 | 1 |
| 1 | 0 | 0 | 1 | 0 | 2 | 1 | 0 |
| 2 | 0 | 1 | 1 | 1 | 7 | 3 | 1 |
| 3 | 0 | 1 | 1 | 0 | 6 | 3 | 0 |
| 4 | 1 | 1 | 1 | 1 | 15 | 7 | 1 |
| 5 | 1 | 1 | 1 | 0 | 14 | 7 | 0 |
| 6 | 1 | 1 | 0 | 1 | 13 | 6 | 1 |
| 7 | 1 | 1 | 0 | 0 | 12 | 6 | 0 |
| 8 | 1 | 0 | 1 | 1 | 11 | 5 | 1 |
| 9 | 1 | 0 | 1 | 0 | 10 | 5 | 0 |
| 10 | 0 | 1 | 0 | 1 | 5 | 2 | 1 |
| 11 | 0 | 1 | 0 | 0 | 4 | 2 | 0 |
| 12 | 1 | 0 | 0 | 1 | 9 | 4 | 1 |
| 13 | 1 | 0 | 0 | 0 | 8 | 4 | 0 |
| 14 | 0 | 0 | 0 | 1 | 1 | 0 | 1 |
| 15 | 0 | 0 | 0 | 0 | 0 | 0 | 0 |

FIG. 40

| TIME T | A4 (XA2) | A3 (XA1) | A2 (XA0) | A1 (YA1) | A0 (YA0) | ADDRESS A4~0 (DECIMAL) | X ADDRESS XA2~0 (DECIMAL) | Y ADDRESS YA1~0 (DECIMAL) |
|---|---|---|---|---|---|---|---|---|
| 0 | 0 | 0 | 0 | 0 | 0 | 0 | 0 | 0 |
| 1 | 1 | 0 | 0 | 0 | 0 | 16 | 4 | 0 |
| 2 | 0 | 1 | 0 | 0 | 0 | 8 | 2 | 0 |
| 3 | 0 | 0 | 1 | 0 | 0 | 4 | 1 | 0 |
| 4 | 1 | 0 | 0 | 1 | 0 | 18 | 4 | 2 |
| 5 | 0 | 1 | 0 | 0 | 1 | 9 | 2 | 1 |
| 6 | 1 | 0 | 1 | 0 | 0 | 20 | 5 | 0 |
| 7 | 1 | 1 | 0 | 1 | 0 | 26 | 6 | 2 |
| 8 | 0 | 1 | 1 | 0 | 1 | 13 | 3 | 1 |
| 9 | 0 | 0 | 1 | 1 | 0 | 6 | 1 | 2 |
| 10 | 1 | 0 | 0 | 1 | 1 | 19 | 4 | 3 |
| 11 | 1 | 1 | 0 | 0 | 1 | 25 | 6 | 1 |
| 12 | 1 | 1 | 1 | 0 | 0 | 28 | 7 | 0 |
| 13 | 1 | 1 | 1 | 1 | 0 | 30 | 7 | 2 |
| 14 | 1 | 1 | 1 | 1 | 1 | 31 | 7 | 3 |
| 15 | 0 | 1 | 1 | 1 | 1 | 15 | 3 | 3 |
| 16 | 0 | 0 | 1 | 1 | 1 | 7 | 1 | 3 |
| 17 | 0 | 0 | 0 | 1 | 1 | 3 | 0 | 3 |
| 18 | 1 | 0 | 0 | 0 | 1 | 17 | 4 | 1 |
| 19 | 1 | 1 | 0 | 0 | 0 | 24 | 6 | 0 |
| 20 | 0 | 1 | 1 | 0 | 0 | 12 | 3 | 0 |
| 21 | 1 | 0 | 1 | 1 | 0 | 22 | 5 | 2 |
| 22 | 1 | 1 | 0 | 1 | 1 | 27 | 6 | 3 |
| 23 | 1 | 1 | 1 | 0 | 1 | 29 | 7 | 1 |
| 24 | 0 | 1 | 1 | 1 | 0 | 14 | 3 | 2 |
| 25 | 1 | 0 | 1 | 1 | 1 | 23 | 5 | 3 |
| 26 | 0 | 1 | 0 | 1 | 1 | 11 | 2 | 3 |
| 27 | 1 | 0 | 1 | 0 | 1 | 21 | 5 | 1 |
| 28 | 0 | 1 | 0 | 1 | 0 | 10 | 2 | 2 |
| 29 | 0 | 0 | 1 | 0 | 1 | 5 | 1 | 1 |
| 30 | 0 | 0 | 0 | 1 | 0 | 2 | 0 | 2 |
| 31 | 0 | 0 | 0 | 0 | 1 | 1 | 0 | 1 |

SEMICONDUCTOR INTEGRATED CIRCUIT DEVICE

BACKGROUND OF THE INVENTION

1. Field of the Invention

The present invention relates to a semiconductor integrated circuit device such as a memory test circuit which is used to test a semiconductor memory circuit.

2. Description of the Background Art

First Conventional Technique

As herein referred to, a first conventional technique is a technique disclosed by Japanese Patent Laid-Open Gazette No. 63-204325 which describes a memory test circuit which is formed as a semiconductor memory circuit.

FIG. 37 shows a unidirectional pseudo random number generating circuit according to the first conventional technique. The unidirectional pseudo random number generating circuit supplies an address signal to a semiconductor memory circuit in a pseudo random order (This type of pseudo random number generating circuit will be referred to as "a circuit generating full cyclic sequence".). In FIG. 37, denoted at 1 is a shift register which includes n stages, denoted at 2 and 2a are exclusive OR circuits, denoted at 4 is a shift clock terminal, denoted at 5 are output terminals, denoted at 6 is a initialization terminal and denoted at 7a is a zero detection circuit.

Second Conventional Technique

FIG. 38 shows a bi-directional pseudo random number generating circuit according to a second conventional technique. This pseudo random number generating circuit supplies an address signal to a semiconductor memory circuit in a pseudo random order or in a totally reverse pseudo random order ((This type of pseudo random number generating circuit will be referred to as "a bi-directional circuit generating full cyclic sequence".). In FIG. 38, denoted at 2, 2a and 2b are exclusive OR circuits, denoted at 4a is a forward direction shift clock terminal, denoted at 4b is a reverse direction shift clock terminal, denoted at 6 is a initialization terminal, denoted at 7a and 7b are zero detection circuits and denoted at 10 is a bi-directional series shift register which can shift data in two directions.

Third Conventional Technique

FIG. 39 shows a semiconductor integrated circuit device (memory test circuit) according to a third conventional technique which comprises a memory circuit 13 and a circuit generating full cyclic sequence 12 which serves as an address generating circuit 11. For convenience of description, FIG. 39 shows an X decoder 14, a Y decoder 15 and a memory cell 16 which are disposed within the memory circuit 13. Areas of the memory cell are numbered (0–31) in FIG. 39 also for convenience of description. The memory circuit 13 may be a RAM or a ROM.

The circuit generating full cyclic sequence 12 is formed by a shift register circuit 17 and a feedback circuit 18. The feedback circuit 18 is formed by NOR circuits 18a and 18b and an exclusive OR circuit (hereinafter "XOR circuit") 18c.

FIG. 40 shows an operation of the circuit of FIG. 39. FIG. 40 assumes that an address signal is set as A0=A1=A2=A3=A4=0 at a time T=0. This is realized by adding resetting means (not shown) to the circuit generating full cyclic sequence 12. As the time T changes, the shift register circuit 17 of the circuit generating full cyclic sequence 12 operates to change addresses as shown in the address columns of the table.

Since all values of an address signal ranging from 0 to 31 (two to the fifth power minus one) are generated, it is possible to access all words of the memory cell 16. FIG. 40 lists X addresses and Y addresses of the memory circuit 13 separately. Since only one shift register 17 generates addresses, an X address and a Y address change basically at the same time (In a rare case, one of the X address and the Y address does not change.).

When the memory circuit is constructed to include both an X decoder and a Y decoder, if the circuit according to the first conventional technique or the second conventional technique is disposed for the X addresses and the Y addresses, the circuits according to the first and the second conventional techniques must shift data under the control of a control signal or etc., which renders a system for generating a control signal or the like complex. Hence, a complex external control circuit becomes necessary. To avoid this, it is necessary to generate both X addresses and Y addresses while systematically and intentionally changing the addresses within the memory test circuit.

When a circuit failure is tested, whether the failure is originated from the X decoder 14 or the Y decoder 15 may need be efficiently located. From a view point of the efficiency of the test, it is desirable to update an X address after thoroughly changing a Y address or vice versa in a memory circuit test. However, since an X address and a Y address change basically at the same time in the memory circuit according to the third conventional technique described above, it is impossible to perform such a memory circuit test in which an X address is updated after a Y address is thoroughly changed or vice versa. Hence, to locate an error, i.e., whether the failure is due to the X decoder 14 or the Y decoder 15 is a time-consuming process.

In addition, an X address and a Y address change irregularly. Both an X address and a Y address may change or only one of the two may change at a time. When an address of a bit line or a word line fails to change, a previously accessed bit line or a previously accessed word line remains active but is accessed again during accessing of a next bit or word line. Hence, an access speed becomes very fast. On the other hand, when addresses of both a bit line and a word line change, it takes time for previously accessed bit and word lines to be active, an access speed slows down. Thus, an access speed varies depending on a condition, and therefore, it is impossible to accurately measure the access speed.

SUMMARY OF THE INVENTION

A semiconductor integrated circuit device according to a first aspect of the present invention comprises: a memory circuit which comprises a plurality of memory cells, an X decoder for designating an X address of the memory cells and a Y decoder for designating a Y address of the memory cells; and an address generating circuit for generating addresses of both the X decoder and the Y decoder, wherein the address generating circuit comprises: a first circuit generating full cyclic sequence for generating all values of an address of one of the X decoder and the Y decoder while sequentially, periodically and systematically changing the values of the address; a second circuit generating full cyclic sequence for generating all values of an address of the other one of the X decoder and the Y decoder while sequentially, periodically and systematically changing the values of the address; and a specific state detection circuit for detecting a specific address state in the first circuit generating full cyclic sequence and for rendering the second circuit generating full cyclic sequence inoperable when the first circuit generating full cyclic sequence is in a state other than the specific address state.

According to a second aspect of the present invention, in the semiconductor integrated circuit device of the first aspect, the first circuit generating full cyclic sequence comprises: a first shift register portion which corresponds to a bit number of an address to be generated; and a first feedback circuit for returning address data which is held in the first circuit generating full cyclic sequence as feedback so that the address data which is held in the first circuit generating full cyclic sequence is systematically changed. The second circuit generating full cyclic sequence comprises: a second shift register portion which corresponds to a bit number of an address to be generated; and a second feedback circuit for returning address data which is held in the second circuit generating full cyclic sequence as feedback so that the address data which is held in the second circuit generating full cyclic sequence is systematically changed. The memory cell circuit comprises: a first shift register circuit which is structured similar to the first shift register portion of the first circuit generating full cyclic sequence and connected to one of the X decoder and the Y decoder, the first shift register circuit operating similar to the first shift register portion in response to an output signal supplied from the first feedback circuit of the first circuit generating full cyclic sequence; and a second shift register circuit which is structured similar to the second shift register portion of the second circuit generating full cyclic sequence and connected to the other one of the X decoder and the Y decoder, the second shift register circuit operating similar to the second shift register portion in response to an output signal supplied from the second feedback circuit of the second circuit generating full cyclic sequence.

According to a third aspect of the present invention, in the semiconductor integrated circuit device of the second aspect, the address generating circuit further comprises a selector circuit for detecting whether the second circuit generating full cyclic sequence is in an operable state or an inoperable state in accordance with a signal which is supplied from the specific state detection circuit, the address generating circuit selects an output which is supplied from the first circuit generating full cyclic sequence if the second circuit generating full cyclic sequence is in the inoperable state but selects an output which is supplied from the second circuit generating full cyclic sequence if the second circuit generating full cyclic sequence is in the operable state. The memory circuit further comprises a gate circuit for transmitting an output from the selector circuit to the first shift register circuit if the second circuit generating full cyclic sequence is in the inoperable state in accordance with a signal which is supplied from the specific state detection circuit, the gate circuit transmitting fixed data to the first shift register circuit if the second circuit generating full cyclic sequence is in the operable state. An input terminal of the second shift register circuit of the memory circuit is connected to the selector circuit. The second shift register circuit performs a shifting operation under the control of the specific state detection circuit.

According to a fourth aspect of the present invention, in the semiconductor integrated circuit device of the second aspect, the first and the second circuit generating full cyclic sequences each comprise a bi-directional circuit generating full cyclic sequence for shifting data in two directions. The first circuit generating full cyclic sequence comprises: a first bi-directional shift register portion which corresponds to a bit number of an address to be generated; and a first bi-directional feedback circuit for returning address data which is held in the first bi-directional shift register portion as feedback so that the address data which is held in the first bi-directional shift register portion is systematically changed. The second circuit generating full cyclic sequence comprises: a second bi-directional shift register portion which corresponds to a bit number of an address to be generated; and a second bi-directional feedback circuit for returning address data which is held in the second bi-directional shift register portion as feedback so that the address data which is held in the second bi-directional shift register portion is systematically changed. The specific state detection circuit renders the second circuit generating full cyclic sequence inoperable if the first circuit generating full cyclic sequence is in a state other than a predetermined first state during a forward direction operation mode of the first circuit generating full cyclic sequence, the specific state detection circuit renders the second circuit generating full cyclic sequence inoperable if the first circuit generating full cyclic sequence is a state other than a predetermined second state during a reverse direction operation mode of the first circuit generating full cyclic sequence.

According to a fifth aspect of the present invention, in the semiconductor integrated circuit device of the fourth aspect, the address generating circuit further comprises: a first selector circuit which selects one of output signals of two directions which are supplied from the first circuit generating full cyclic sequence in accordance with a first operation mode switching signal which is supplied from outside; a second selector circuit which selects one of output signals of two directions which are supplied from the second circuit generating full cyclic sequence in accordance with a second operation mode switching signal which is supplied from outside; and a third selector circuit which detects whether the second circuit generating full cyclic sequence is in an operable state or an inoperable state in accordance with a signal which is supplied from the specific state detection circuit, the third selector circuit selects an output which is supplied from the first selector circuit when the second circuit generating full cyclic sequence is in the inoperable state but selects an output which is supplied from the second selector circuit when the second circuit generating full cyclic sequence is in the operable state. The memory cell circuit further comprises: a first bi-directional shift register circuit which is structured similar to the first shift bi-directional register portion of the first circuit generating full cyclic sequence and connected to one of the X decoder and the Y decoder, the direction of operation of the first bi-directional shift register circuit being switched in response to the first operation mode switching signal like the first shift bi-directional register portion; a second bi-directional shift register circuit which is structured similar to the second bi-directional shift register portion of the second circuit generating full cyclic sequence and connected to the other one of the X decoder and the Y decoder, the direction of operation of the second shift bi-directional register circuit being switched in response to the second operation mode switching signal like the second bi-directional shift register portion; a first gate circuit for detecting whether the second circuit generating full cyclic sequence is in an operable state or an inoperable state in accordance with a signal which is supplied from the specific state detection circuit, the first gate circuit transmitting an output from the third selector circuit to a forward direction input of the first bi-directional shift register circuit if the second circuit generating full cyclic sequence is in the inoperable state but transmitting predetermined fixed data to the forward direction input of the first bi-directional shift register circuit if the second circuit generating full cyclic sequence is in the operable state; and a second for detecting whether the second circuit generating full cyclic sequence is in an operable state or an inoperable state in accordance with a signal which is supplied from the specific state detection circuit, the second gate circuit transmitting an output from the third selector circuit to a reverse direction input of the first bi-directional shift register circuit if the second circuit generating full cyclic sequence is in the inoperable state but transmitting predetermined fixed data to the reverse direction input of the first bi-directional shift register circuit if the second circuit generating full cyclic sequence is in the operable state. The output signal from the third selector circuit is supplied to input terminals corresponding to two directions of the second circuit generating full cyclic sequence.

According to a sixth aspect of the present invention, in the semiconductor integrated circuit device of the first aspect, the first circuit generating full cyclic sequence is a bi-directional circuit generating full cyclic sequence which shifts data in two directions. The second circuit generating full cyclic sequence is a 1-bit circuit generating full cyclic sequence. The first circuit generating full cyclic sequence comprises: a bi-directional shift register portion which corresponds to a bit number of an address to be generated; and a bi-directional feedback circuit for returning address data which is held in the bi-directional shift register portion as feedback so that the address data which is held in the bi-directional shift register portion is changed. The specific state detection circuit renders the second circuit generating full cyclic sequence inoperable if the first circuit generating full cyclic sequence is in a state other than a predetermined first state during a forward direction operation mode of the first circuit generating full cyclic sequence, the specific state detection circuit renders the second circuit generating full cyclic sequence inoperable if the first circuit generating full cyclic sequence is a state other than a predetermined second state during a reverse direction operation mode of the first circuit generating full cyclic sequence.

According to a seventh aspect of the present invention, in the semiconductor integrated circuit device of the sixth aspect, the address generating circuit comprises: a first selector circuit which selects one of output signals of two directions which are supplied from the first circuit generating full cyclic sequence in accordance with a first operation mode switching signal which is supplied from outside; a second selector circuit which detects whether the second circuit generating full cyclic sequence is in an operable state or an inoperable state in accordance with a signal which is supplied from the specific state detection circuit, the second selector circuit selecting an output from the first selector circuit if the second circuit generating full cyclic sequence is in the inoperable state but selecting an output from the second circuit generating full cyclic sequence if the second circuit generating full cyclic sequence is in the operable state. The memory cell further comprises: a bi-directional shift register circuit which is structured similar to the bi-directional shift register portion of the first circuit generating full cyclic sequence and connected to one of the X decoder and the Y decoder, the direction of operation of the bi-directional shift register circuit being switched in response to the first operation mode switching signal like the bi-directional shift register portion of the first circuit generating full cyclic sequence; a 1-bit shift register circuit which is connected to the other one of the X decoder and the Y decoder, the 1-bit shift register circuit operating in accordance with a signal which is supplied from the specific state detection circuit; a first gate circuit for detecting whether the 1-bit shift register circuit is in an operable state or an inoperable state in accordance with a signal which is supplied from the specific state detection circuit, the first gate circuit transmitting an output from the second selector circuit to a forward direction input of the bi-directional shift register circuit if 1-bit shift register circuit is in the inoperable state but transmitting predetermined fixed data to the forward direction input of the bi-directional shift register circuit if 1-bit shift register circuit is in the operable state; and a second gate circuit for detecting whether the 1-bit shift register circuit is in an operable state or an inoperable state in accordance with a signal which is supplied from the specific state detection circuit, the second gate circuit transmitting an output from the second selector circuit to a reverse direction input of the bi-directional shift register circuit if 1-bit shift register circuit is in the inoperable state but transmitting predetermined fixed data to the reverse direction input of the bi-directional shift register circuit if 1-bit shift register circuit is in the operable state. An input terminal of the 1-bit shift register circuit is connected to the second selector circuit.

According to an eighth aspect of the present invention, in the semiconductor integrated circuit device of the first aspect, the first circuit generating full cyclic sequence is a 1-bit circuit generating full cyclic sequence. The second circuit generating full cyclic sequence is a bi-directional circuit generating full cyclic sequence which selects one of two directions as a shifting direction of shifting data in accordance with a first operation mode switching signal which is supplied from outside. The second circuit generating full cyclic sequence comprises: a bi-directional shift register portion which corresponds to a bit number of an address to be generated; and a bi-directional feedback circuit for returning address data which is held in the bi-directional shift register portion as feedback in the two directions so that the address data which is held in the bi-directional shift register portion is changed. The specific state detection circuit comprises an exclusive OR circuit which receives an output from the first circuit generating full cyclic sequence and a second operation mode switching signal which is supplied from outside, the specific state detection circuit rendering the second circuit generating full cyclic sequence inoperable only when the second operation mode switching signal coincides or does not coincide with an address state of the first 1-bit circuit generating full cyclic sequence.

According to a ninth aspect of the present invention, in the semiconductor integrated circuit device of the eighth aspect, the address generating circuit further comprises: a first selector circuit which selects one of output signals of two directions which are supplied from the second circuit generating full cyclic sequence in accordance with the first operation mode switching signal; a second selector circuit which detects whether the second circuit generating full cyclic sequence is in an operable state or an inoperable state in accordance with a signal which is supplied from the specific state detection circuit, the second selector circuit selecting an output from the first selector circuit if the second circuit generating full cyclic sequence is in the inoperable state but selecting an output from the first selector circuit if the second circuit generating full cyclic sequence is in the operable state. The memory cell further comprises: a bi-directional shift register circuit which is structured similar to the bi-directional shift register portion of the second circuit generating full cyclic sequence and connected to the other one of the X decoder and the Y decoder, the bi-directional shift register circuit receiving an output signal from the second selector circuit at a forward input and a reverse input of the bi-directional shift register circuit, the bi-directional shift register circuit being rendered inoperable in accordance with a signal which is supplied from the specific state detection circuit like the second circuit generating full cyclic sequence, the direction of operation of the bi-directional shift register circuit being switched in response to the first operation mode switching signal; a third selector circuit which detects whether the second circuit generating full cyclic sequence and the bi-directional shift register circuit are in an operable state or an inoperable state in accordance with a signal which is supplied from the specific state detection circuit, the third selector circuit selecting an output which is supplied from the second selector circuit when the second circuit generating full cyclic sequence and the bi-directional shift register circuit are in the inoperable state but selecting the second first operation mode switching signal when the second circuit generating full cyclic sequence and the bi-directional shift register circuit are in the operable state; and a 1-bit shift register circuit which is connected to the one of the X decoder and the Y decoder, the 1-bit shift register circuit receiving an output signal from the third selector circuit.

According to a tenth aspect of the present invention, in the semiconductor integrated circuit device of the eighth aspect, the address generating circuit further comprises a selector circuit which selects one of output signals of two directions which are supplied from the second circuit generating full cyclic sequence in accordance with the first operation mode switching signal. The memory cell further comprises: a 1-bit shift register circuit which is connected to the other one of the X decoder and the Y decoder, the 1-bit shift register circuit receiving an output signal from the first selector circuit; and a bi-directional shift register circuit which is structured similar to the bi-directional shift register portion of the second circuit generating full cyclic sequence and connected to the other one of the X decoder and the Y decoder, the bi-directional shift register circuit receiving an output signal from the selector circuit at a forward input and a reverse input of the bi-directional shift register circuit, the direction of operation of the bi-directional shift register circuit being switched in response to the first operation mode switching signal.

According to a eleventh aspect of the present invention, in the semiconductor integrated circuit device of the first aspect, the address generating circuit further comprises: an auxiliary specific state detection circuit which detects a specific address state within the second circuit generating full cyclic sequence and renders the first circuit generating full cyclic sequence if the second circuit generating full cyclic sequence is in a state other than the specific address state; and selection means which selects one of the specific state detection circuit and the auxiliary specific state detection circuit as a circuit to be rendered operable.

According to a twelfth aspect of the present invention, in the semiconductor integrated circuit device of the first aspect, the address generating circuit further comprises scan path selection means which allows the first and the second circuit generating full cyclic sequences to be serially connected to each other to establish a scan path or alternatively separates the first circuit generating full cyclic sequence from the second circuit generating full cyclic sequence.

As described above, in the semiconductor integrated circuit device of the first aspect of the present invention, the first circuit generating full cyclic sequence causes all values of an address of one of the X decoder and the Y decoder to be thoroughly, periodically and systematically changed and the second circuit generating full cyclic sequence thereafter allows an address of the other one of the X decoder and the Y decoder to be updated. This makes it possible to easily find which one of the X decoder and the Y decoder is responsible for an error. Further, since the same bit line or the same word line of the memory circuit is successively accessed, an access time test is accurately performed.

In the semiconductor integrated circuit device of the second aspect of the present invention, the first shift register portion of the first circuit generating full cyclic sequence of the address generating circuit operates similar to the first shift register circuit of each memory circuit (i.e., in synchronization with or with a predetermined bit number delayed). The second shift register portion of the second circuit generating full cyclic sequence of the address generating circuit operates similar to the second shift register circuit of each memory circuit (i.e., in synchronization with or with a predetermined bit number delayed). In such a structure, as compared with where all bits (registers) of the first and the second shift register portions are connected directly with all digits (terminals) of the X decoder and the Y decoder, the number of wire lines needed to connect the address generating circuit and the memory circuit is reduced.

The semiconductor integrated circuit device of the third aspect of the present invention uses the selector circuit and the gate circuit. This makes it possible to selectively supply the signal from the address generating circuit to the first shift register circuit or the second shift register circuit. Hence, data is transmitted to the shift register circuits via only one data transmission line, thereby greatly reducing the number of wire lines needed to connect the address generating circuit and the memory circuit.

In the semiconductor integrated circuit device of the fourth aspect of the present invention in which the bi-directional circuit generating full cyclic sequences which can easily switch increment of data and decrement of data are used to specify an address, the first circuit generating full cyclic sequence causes all values of an address of one of the X decoder and the Y decoder to be thoroughly, periodically and systematically changed and the second circuit generating full cyclic sequence thereafter allows an address of the other one of the X decoder and the Y decoder to be updated. This makes it possible to easily find which one of the X decoder and the Y decoder is responsible for an error. Further, since the same bit line or the same word line of the memory circuit is successively accessed, an access time test is accurately performed.

In the semiconductor integrated circuit device of the fifth aspect of the present invention, the first bi-directional shift register portion of the first circuit generating full cyclic sequence of the address generating circuit operates similar to the first bi-directional shift register circuit of each memory circuit (i.e., in synchronization with or with a predetermined bit number delayed). The second bi-directional bi-directional shift register portion of the second circuit generating full cyclic sequence of the address generating circuit operates similar to the second bi-directional shift register circuit of each memory circuit (i.e., in synchronization with or with a predetermined bit number delayed). In such a structure, as compared with where all bits (registers) of the first and the second bi-directional shift register portions are connected directly with all digits (terminals) of the X decoder and the Y decoder, the number of wire lines needed to connect the address generating circuit and the memory circuit is reduced.

Where a bi-directional circuit generating full cyclic sequence which can easily switch increment of data and decrement of data is used as the first circuit generating full cyclic sequence and a 1-bit circuit generating full cyclic sequence is used as the second circuit generating full cyclic sequence as in the semiconductor integrated circuit device of the sixth aspect of the present invention, the first circuit generating full cyclic sequence causes all values of an address of one of the X decoder and the Y decoder to be thoroughly, periodically and systematically changed and the second circuit generating full cyclic sequence thereafter allows an address of the other one of the X decoder and the Y decoder to be updated. This makes it possible to easily find which one of the X decoder and the Y decoder is responsible for an error. Further, since the same bit line or the same word line of the memory circuit is successively accessed, an access time test is accurately performed.

In the semiconductor integrated circuit device of the seventh aspect of the present invention, the first bi-directional shift register portion of the first circuit generating full cyclic sequence of the address generating circuit operates similar to the first bi-directional shift register circuit of each memory circuit (i.e., in synchronization with or with a predetermined bit number delayed). The second 1-bit circuit generating full cyclic sequence of the address generating circuit operates similar to the 1-bit shift register circuit of each memory circuit (i.e., in synchronization with or with a predetermined bit number delayed). In such a structure, as compared with where all bits (registers) of the bi-directional shift register portion and the second circuit generating full cyclic sequence are connected directly with all digits (terminals) of the X decoder and the Y decoder, the number of wire lines needed to connect the address generating circuit and the memory circuit is reduced. Use of a plurality of the selector circuits and the gate circuits in particular makes it possible to selectively supply the signal from the address generating circuit to the bi-directional shift register portion and the 1-bit shift register circuit and to transmit data to the shift register circuits via only one data transmission line. Hence, the number of wire lines needed to connect the address generating circuit and the memory circuit is greatly reduced.

Where a 1-bit circuit generating full cyclic sequence is used as the first circuit generating full cyclic sequence and a bi-directional circuit generating full cyclic sequence which can easily switch increment of data and decrement of data is used as the second circuit generating full cyclic sequence as in the semiconductor integrated circuit device of the eighth aspect of the present invention, the first circuit generating full cyclic sequence causes all values (binary values) of an address of one of the X decoder and the Y decoder to be thoroughly, periodically and systematically changed and the second circuit generating full cyclic sequence thereafter allows an address of the other one of the X decoder and the Y decoder to be updated. This makes it possible to easily find which one of the X decoder and the Y decoder is responsible for an error. Further, since the same bit line or the same word line of the memory circuit is successively accessed, an access time test is accurately performed.

Further, since an exclusive OR circuit is used as the specific state detection circuit, the specific state detection circuit is formed extremely simple, whereby the circuit area is largely reduced.

In the semiconductor integrated circuit devices of the ninth and the tenth aspects of the present invention, the first 1-bit circuit generating full cyclic sequence of the address generating circuit operates similar to the 1-bit shift register circuit of each memory circuit (i.e., in synchronization with or with a predetermined bit number delayed). The bi-directional shift register portion of the second circuit generating full cyclic sequence of the address generating circuit operates similar to the bi-directional shift register circuit of each memory circuit (i.e., in synchronization with or with a predetermined bit number delayed). In such a structure, as compared with where all bits (registers) of the first circuit generating full cyclic sequence and the bi-directional shift register portion are connected directly with all digits (terminals) of the X decoder and the Y decoder, the number of wire lines needed to connect the address generating circuit and the memory circuit is reduced.

In the semiconductor integrated circuit device of the ninth aspect of the present invention, in particular, use of the selector circuit makes it possible to selectively supply the signal from the address generating circuit to the bi-directional shift register portion and the 1-bit shift register circuit and to transmit data to the shift register circuits via only one data transmission line. Hence, the number of wire lines needed to connect the address generating circuit and the memory circuit is greatly reduced.

In the semiconductor integrated circuit device of the eleventh aspect of the present invention, it is allowed to freely decide which one of the first and the second circuit generating full cyclic sequences to render operable first. One of the first and the second circuit generating full cyclic sequences causes all values of an address of one of the X decoder and the Y decoder to be thoroughly, periodically and systematically changed and the other one of the first and the second circuit generating full cyclic sequences thereafter allows an address of the other one of the X decoder and the Y decoder to be updated. This makes it possible to easily find which one of the X decoder and the Y decoder is responsible for an error. Further, since the same bit line or the same word line of the memory circuit is successively accessed, an access time test is accurately performed.

In the semiconductor integrated circuit device of the twelfth aspect of the present invention, the scan path selection means freely determines whether to use the address generating circuit as a scan path. Hence, the semiconductor integrated circuit device of the twelfth aspect of the present invention has a wide range of applications.

Accordingly, it is an object of the present invention to offer a semiconductor integrated circuit device such as a memory test circuit which easily locate whether an error is due to an X decoder or a Y decoder and which is advantageous for an access time test testing continuous accessing to the same bit line or the same word line.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a view showing a change in each register value in the memory test circuit according to the first preferred embodiment of the present invention;

FIG. 4 is a view showing a change in each register value in the memory test circuit according to the second preferred embodiment of the present invention;

FIG. 7 is a view showing a change in each register value in the memory test circuit according to the third preferred embodiment of the present invention;

FIG. 9 is a view showing a change in each register value in the memory test circuit according to the fourth preferred embodiment of the present invention;

FIG. 12 is a view showing a change in each register value in the memory test circuit according to the fifth preferred embodiment of the present invention;

FIGS. 15 and 16 are views showing a change in each register value in the memory test circuit according to the sixth preferred embodiment of the present invention;

FIGS. 21 and 22 are views showing a change in each register value in the memory test circuit according to the eighth preferred embodiment of the present invention;

FIGS. 27 and 28 are views showing a change in each register value in the memory test circuit according to the tenth preferred embodiment of the present invention;

FIG. 40 is a view showing a change in each register value in the memory test circuit according to the third conventional technique.

DESCRIPTION OF THE PREFERRED EMBODIMENTS

FIRST PREFERRED EMBODIMENT

Figure 1:
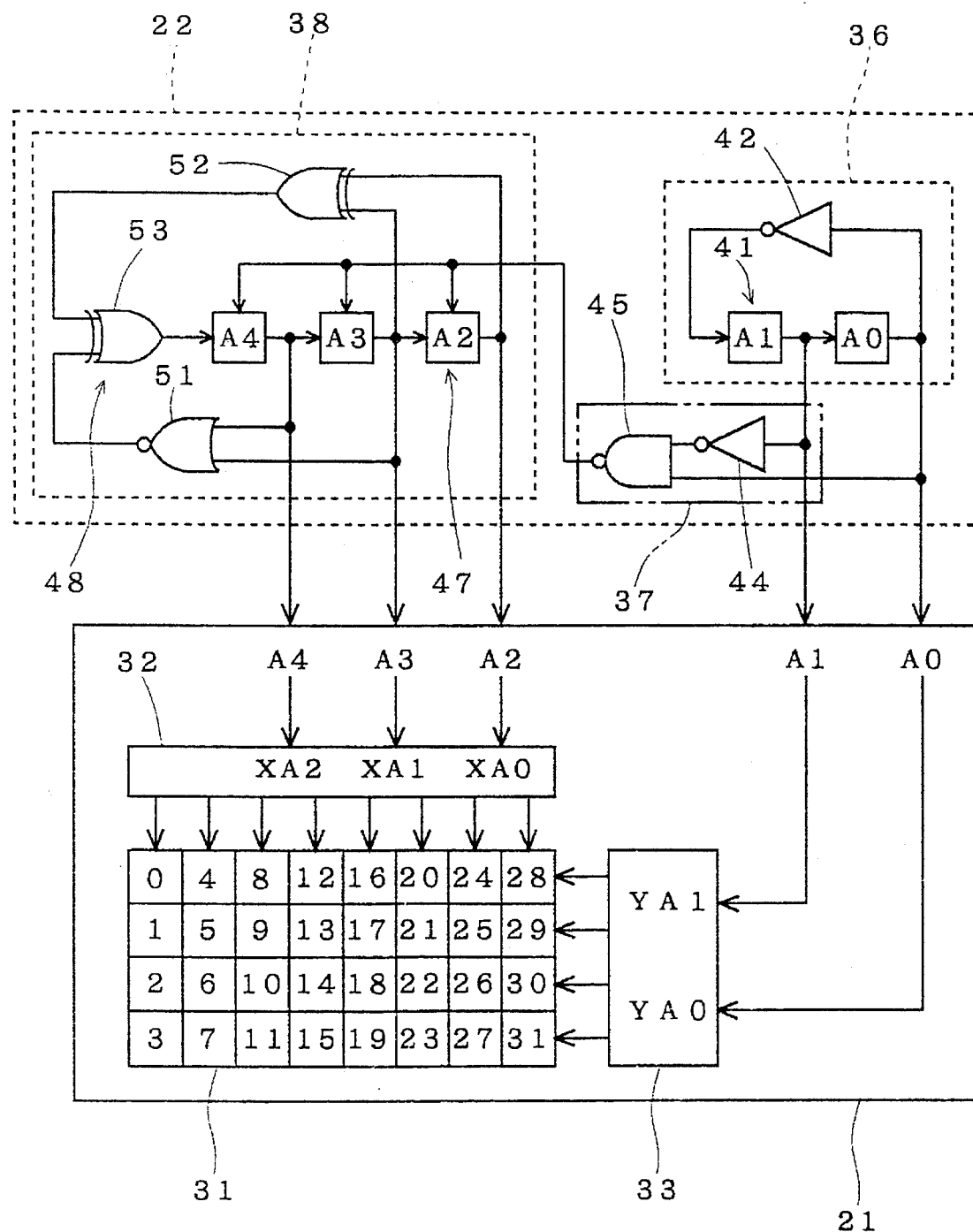
FIG. 1 is a view of a memory test circuit according to a first preferred embodiment of the present invention.

FIG. 1 shows a memory test circuit which is formed as a semiconductor integrated circuit device according to a first preferred embodiment of the present invention. The memory test circuit according to the first preferred embodiment allows a memory circuit test which updates an X address after thoroughly changing a Y address. The memory test circuit of the first preferred embodiment is formed by connecting an address generating circuit 22 as that shown in FIG. 1 to a memory circuit 21 which is to be tested.

The memory circuit 21 is a typical memory circuit which is formed by a memory cell 31 which has a memory area of thirty-two words "0" to "31", an X decoder 32 which designates an X address of three digits (XA2, XA1, XA0) of the memory cell 31, and a Y decoder 31 of two digits (YA1, YA0) of the memory cell 31.

The address generating circuit 22 is formed by a first circuit generating full cyclic sequence 36 which generates a Y address which is to be accessed by the Y decoder 33, a specific state detection circuit 37 which detects that the first circuit generating full cyclic sequence 36 has generated a specific Y address (specifically, binary "01"), and a second circuit generating full cyclic sequence 38 which operates only when the specific state detection circuit 37 detects that the first circuit generating full cyclic sequence 36 has generated the specific Y address ("01").

The first circuit generating full cyclic sequence 36 is a 2-bit circuit generating full cyclic sequence. The structure of the first circuit generating full cyclic sequence 36 is simple, including only a shift register 41 of two bits (A1, A0) and an invertor circuit 42 which supplies data feedback to the shift register 41.

The specific state detection circuit 37 is formed by an invertor circuit 44 which is connected to a most significant digit side register (A1) of the shift register 41 of the first circuit generating full cyclic sequence 36 and an NAND circuit 45 which has an input terminal connected to the invertor circuit 44 and another input terminal connected to a least significant digit side register (A0) of the shift register 41 of the first circuit generating full cyclic sequence 36. The specific state detection circuit 37 supplies a signal "0" to the second circuit generating full cyclic sequence 38 to conduct the second circuit generating full cyclic sequence 38 only when the most significant digit side register (A1) of the shift register 41 is "0" and the least significant digit side register (A0) of the shift register 41 is "1" (that is, when the first circuit generating full cyclic sequence 36 is in a binary "01" state). The specific state detection circuit 37 otherwise supplies a signal "1" to the second circuit generating full cyclic sequence 38, rendering the second circuit generating full cyclic sequence 38 inoperable.

The second circuit generating full cyclic sequence 38 is a 3-bit circuit generating full cyclic sequence which is formed by a shift register 47 of three bits (A4, A3, A2) and a feedback circuit 48 which supplies data feedback to the shift register 47. The feedback circuit 48 is formed by one NOR circuit 51 and two XOR circuits 52 and 53. An input terminal of the NOR circuit 51 is connected to a most significant digit register (A4) of the shift register 47 and another input terminal of the NOR circuit 51 is connected to an intermediate digit register (A3) of the shift register 47. An input terminal of the XOR circuit 52 is connected to the intermediate digit register (A3) of the shift register 47 and another input terminal of the XOR circuit 52 is connected to the a least significant digit register (A2) of the shift register 47. An input terminal of the XOR circuit 53 is connected to the NOR circuit 51 and another input terminal of the XOR circuit 53 is connected to the XOR circuit 52. An output terminal of the XOR circuit 53 is connected to the most significant digit register (A4) of the shift register 47.

The registers A1 and A0 of the shift register 41 of the first circuit generating full cyclic sequence 36 correspond to YA1 and YA0 of the Y decoder 33 of the memory circuit 21. The registers A4, A3 and A2 of the shift register 47 of the second circuit generating full cyclic sequence 38 correspond to XA2, XA1 and XA0 of the X decoder 32 of the memory circuit 21.

Operation

FIG. 2 shows an operation of the circuit of FIG. 1. FIG. 2 assumes that an address signal is set as A0=A1=A2=A3=A4=0 at a time T=0. As the time T changes, addresses change as shown in the address columns of the table. Since all values of an address signal ranging from 0 to 31 (two to the fifth power minus one) are generated, it is possible to access all words of the memory cell. The X address column and Y address column of the table show that a Y address changes in an order 0, 2, 3, 1, 0, 2, 3, 1, . . . and an X address changes only when the Y address changes from 1 to 0.

A memory circuit test is performed at a high speed since an X address is updated after thoroughly changing the Y address. When an error is detected and whether the error is due to the X decoder or the Y decoder is to be determined, if the error is detected continuously while the time T=4–7 in FIG. 2, the address "4" of the X decoder is defective. If an error is found when the time T=2, 6, 10, 14, 18, 22, 26 and 30, the address "3" of the Y decoder is defective. Thus, that the X decoder is defective when an error is continuous while the Y decoder is defective when an error is discontinuous. Since which decoder is defective is found in a moment, detection of an error is extremely quick.

In addition, since the same bit line or the same word line is continuously accessed, it is possible to measure an access time test under a designated condition that only a Y address is changed. This eliminates other cause of a change in addresses and therefore allows accurate measurement under the same condition.

SECOND PREFERRED EMBODIMENT

Structure

Figure 3:
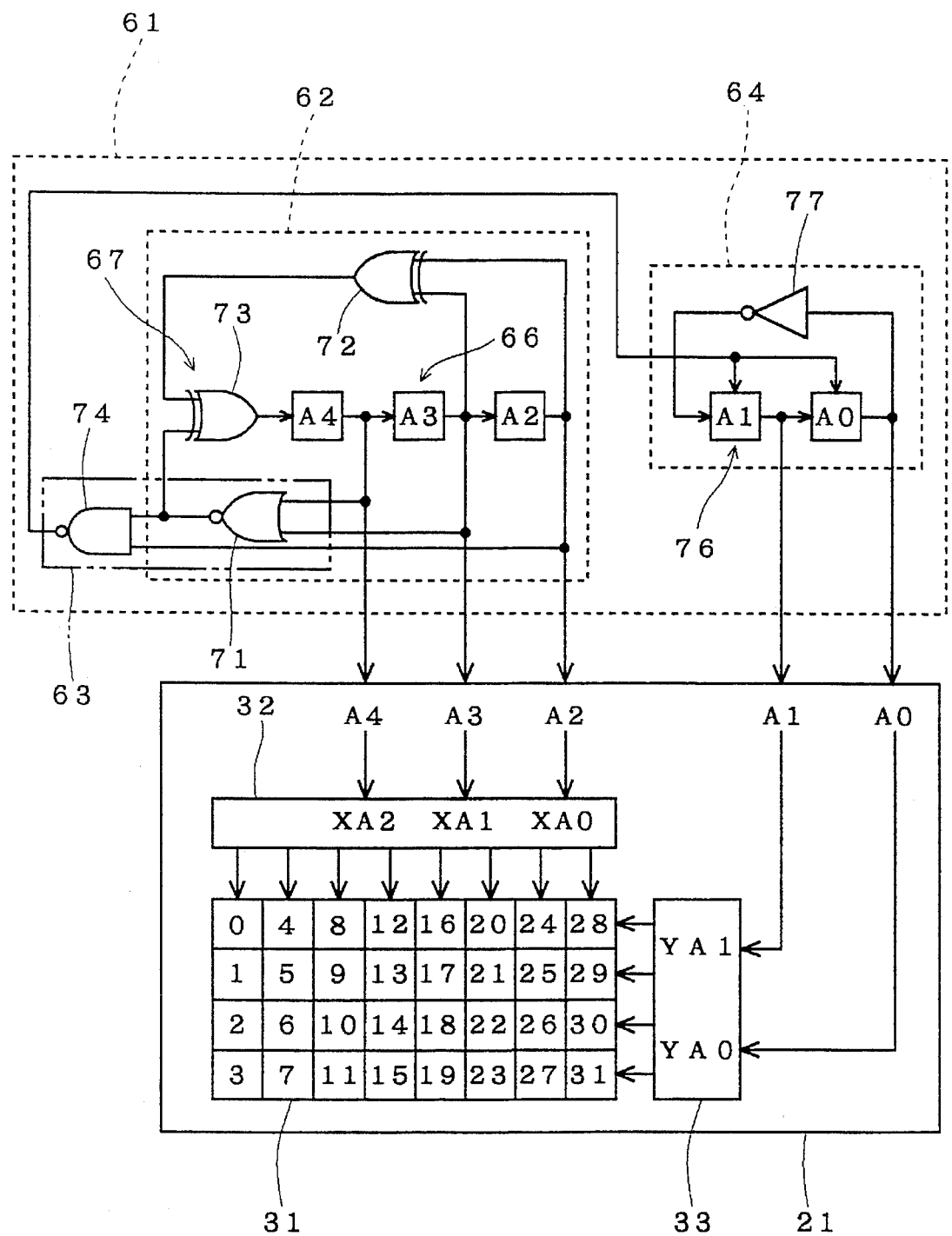
FIG. 3 is a view of a memory test circuit according to a second preferred embodiment of the present invention.

FIG. 3 is a view of a memory test circuit according to a second preferred embodiment of the present invention. In FIG. 3, elements performing similar functions to those of the first preferred embodiment are denoted by identical reference characters. The memory test circuit according to the second preferred embodiment performs a memory circuit testing operation in which a Y address is updated after thoroughly changing an X address. The memory test circuit of the second preferred embodiment is formed by connecting an address generating circuit 61 as that shown in FIG. 3 to the memory circuit 21 which is to be tested. The memory circuit 21 is the same as that previously described in relation to the first preferred embodiment and will not be described again.

The address generating circuit 61 is formed by a first circuit generating full cyclic sequence 62 for generating an X address which is to be accessed by the X decoder 32 of the memory circuit 21, a specific state detection circuit 63 for detecting that the first circuit generating full cyclic sequence 62 has generated a specific X address (specifically, binary "001"), and a second circuit generating full cyclic sequence 64 which operates only when the specific state detection circuit 63 detects that the first circuit generating full cyclic sequence 62 has generated a specific Y address ("01").

The first circuit generating full cyclic sequence 62 is a 3-bit circuit generating full cyclic sequence which is formed by a shift register 66 of three bits (A4, A3, A2) and a feedback circuit 67 which supplies data feedback to the shift register 66. The feedback circuit 67 is formed by one NOR circuit 71 and two XOR circuits 72 and 73. An input terminal of the NOR circuit 71 is connected to a most significant digit register (A4) of the shift register 66 and another input terminal of the NOR circuit 71 is connected to an intermediate digit register (A3) of the shift register 66. An input terminal of the XOR circuit 72 is connected to the intermediate digit register (A3) of the shift register 66 and another input terminal of the XOR circuit 72 is connected to the a least significant digit register (A2) of the shift register 66. An input terminal of the XOR circuit 73 is connected to the NOR circuit 71 and another input terminal of the XOR circuit 73 is connected to the XOR circuit 72. An output terminal of the XOR circuit 73 is connected to the most significant digit register (A4) of the shift register 66.

The specific state detection circuit 63 is formed by the NOR circuit 71 of the first circuit generating full cyclic sequence 62 and an NAND circuit 74 which has its one terminal connected to the NOR circuit 71 and another terminal connected to the least significant digit register (A2) of the shift register 66. The NOR circuit 71 also serves as the NOR circuit of the first circuit generating full cyclic sequence 62. In this structure, when the shift register 66 is in the state A4=0, A3=0 and A2=1, the NAND circuit 74 outputs 0, rendering the second circuit generating full cyclic sequence 64 operable. The NAND circuit 74 otherwise outputs 1, rendering the second circuit generating full cyclic sequence 64 inoperable.

The second circuit generating full cyclic sequence 64 is a 2-bit circuit generating full cyclic sequence which is formed by a shift register 76 of two bits (A1, A0) and a feedback circuit 77 which supplies data feedback to the shift register 76 as shown in FIG. 3.

The registers A4, A3 and A2 of the shift register 66 of the first circuit generating full cyclic sequence 62 correspond to XA2, XA1 and XA0 of the X decoder 32 of the memory circuit 21. The registers A1 and A0 of the shift register 76 of the second circuit generating full cyclic sequence 64 correspond to YA1 and YA0 of the Y decoder 32 of the memory circuit 21. The circuit structure is otherwise the same as that of the first preferred embodiment and will not be described here.

Operation

FIG. 4 shows an operation of the circuit of FIG. 3. FIG. 4 assumes that an address signal is set as A0=A1=A2=A3=A4=0 at a time T=0.

As the time T changes, addresses change as shown in the address columns of the table. Since all values of an address signal ranging from 0 to 31 (two to the fifth power minus one) are generated, it is possible to access all words of the memory cell.

The X address column and Y address column of the table show that an X address changes in an order 0, 4, 2, 5, 6, 7, 3, 1, 0, 4, 2, 5, 6, 7, 3, 1, . . . and a Y address changes only when the X address changes from 1 to 0.

THIRD PREFERRED EMBODIMENT

Structure

Figure 5:
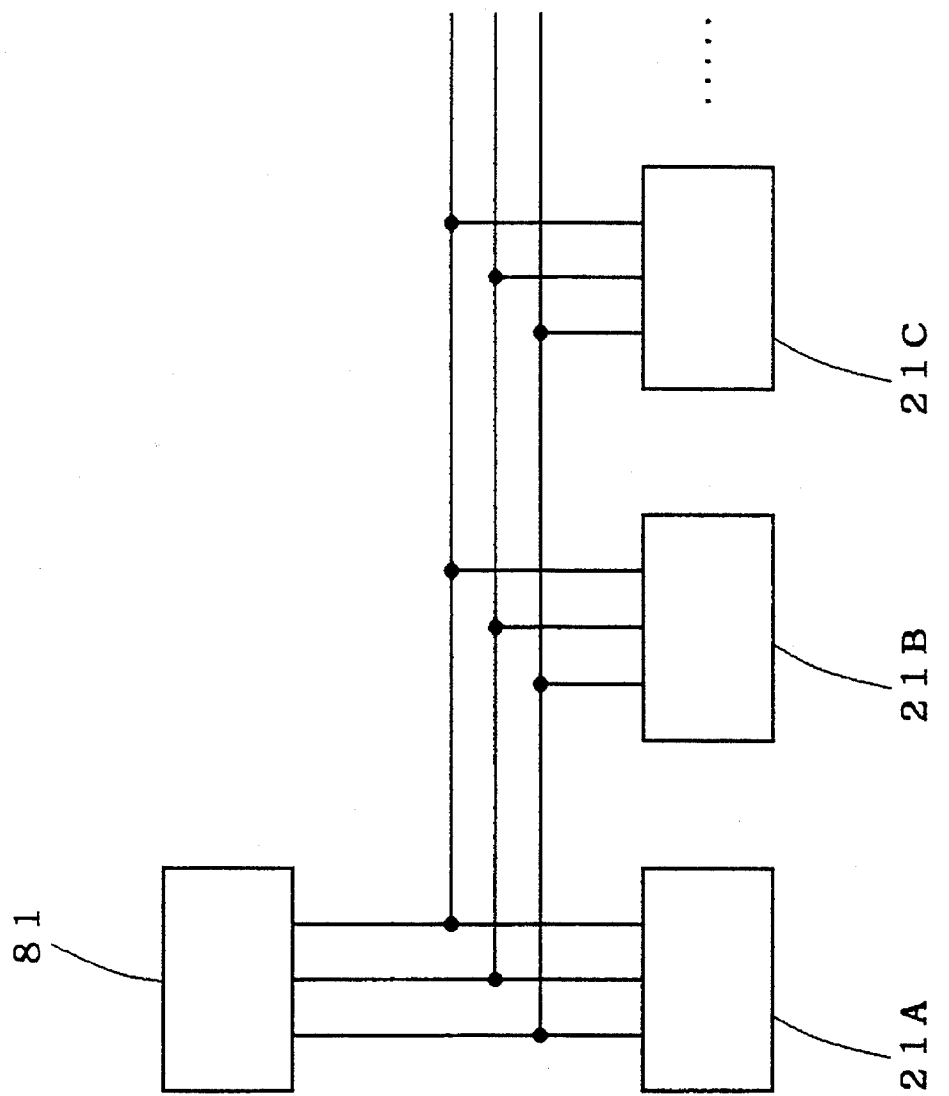
FIG. 5 is a view of an overall wiring structure of a memory test circuit according to a third preferred embodiment of the present invention.
Figure 6:
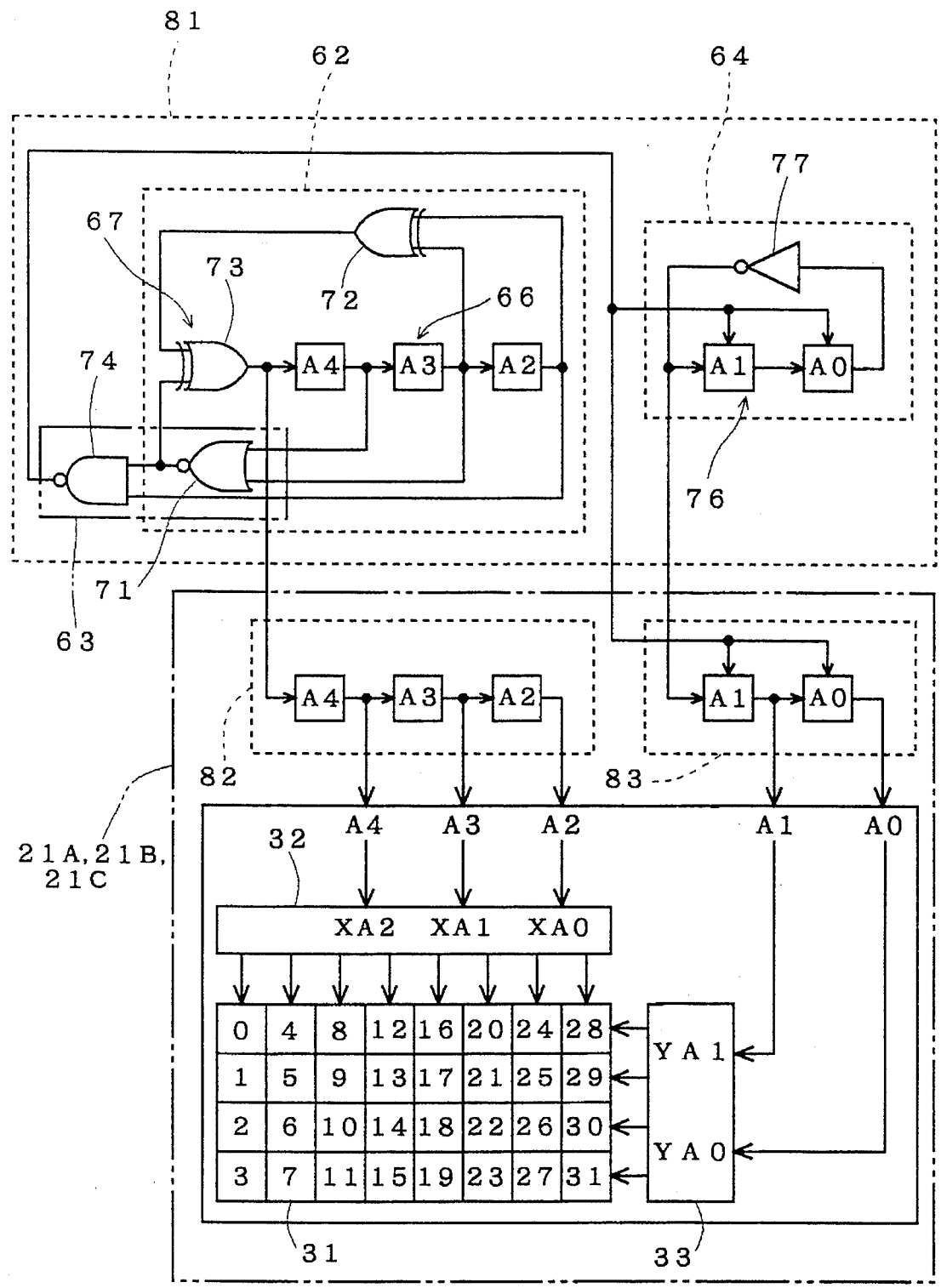
FIG. 6 is a view of the memory test circuit according to the third preferred embodiment of the present invention.

FIGS. 5 and 6 are views of a memory test circuit according to a third preferred embodiment of the present invention. In FIG. 6, elements performing similar functions to those of the second preferred embodiment are denoted by identical reference characters. As shown in FIG. 5, in the memory test circuit according to the third preferred embodiment, a plurality of memory circuits 21A, 21B and 21C are connected to one address generating circuit 81 which is similar to the address generating circuit 61 of the second preferred embodiment shown in FIG. 3.

As shown in FIG. 6, the memory circuits 21A, 21B and 21C are each similar to the memory circuit 21 of the first and the second preferred embodiments as it is modified to further include a first shift register circuit 82 and a second shift register circuit 83. The first shift register circuit 82 is connected to the X decoder 32, and a serial input terminal of the shift register 66 of the first circuit generating full cyclic sequence 82 is connected to a serial input terminal of the first shift register circuit 82. Hence, if the shift register 66 of the first circuit generating full cyclic sequence 62 and the first shift register circuit 82 have the same initial value, the shift register 66 and the first shift register circuit 82 hold the same data and behave exactly in the same manner. The second shift register circuit 83 is connected to the Y decoder 33, a serial input terminal of the shift register 76 of the second circuit generating full cyclic sequence 64 is connected to a serial input terminal of the second shift register circuit 83. Hence, if the shift register 76 of the second circuit generating full cyclic sequence 64 and the second shift register circuit 83 have the same initial value, the shift register 76 and the second shift register circuit 83 hold the same data and behave exactly in the same manner. The circuit structure is otherwise the same as that of the second preferred embodiment and will not be described here.

Operation

FIG. 7 shows an operation of the circuit of FIG. 6. FIG. 7 assumes that an address signal is set as A0=A1=A2=A3=A4=0 at a time T=0. It is also assumed that the shift registers 66 and 76 of the circuit generating full cyclic sequences 62 and 64 are both cleared to 0. FIG. 7 is exactly the same as FIG. 4 under this condition. In other words, as the time T changes, addresses change as shown in the address columns of the table. Since all values of an address signal ranging from 0 to 31 (two to the fifth power minus one) are generated, it is possible to access all words of the memory cell. The X address column and Y address column of the table show that an X address changes in an order 0, 4, 2, 5, 6, 7, 3, 1, 0, 4, 2, 5, 6, 7, 3, 1, . . . and a Y address changes only when the X address changes from 1 to 0.

In the circuit of FIG. 6, the first and the second shift registers are disposed adjacent each other in each memory circuit and the memory circuits 21A, 21B and 21C share the address generating circuit 81.

The address generating circuit 81 is connected to the first and the second shift registers 82 and 83 by only three signal lines. This does not increase the number of wire lines for each memory circuit even though the address generating circuit 81 is connected to more than one memory circuits, i.e., the memory circuits 21A, 21B and 21C, which in turn prevents a complex wire structure.

FOURTH PREFERRED EMBODIMENT

Structure

Figure 8:
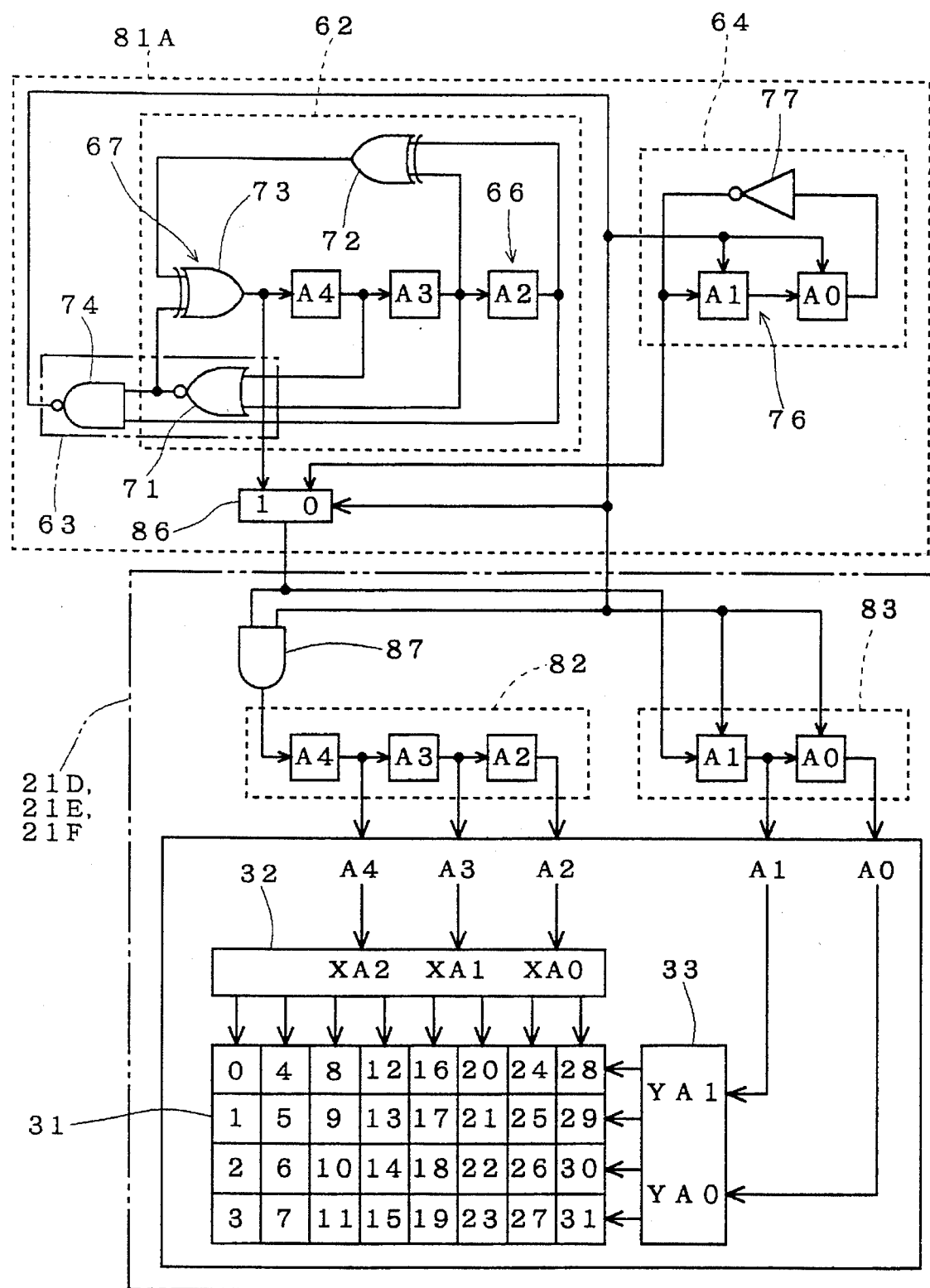
FIG. 8 is a view of a memory test circuit according to a fourth preferred embodiment of the present invention.

FIG. 8 is a view of a memory test circuit according to a fourth preferred embodiment of the present invention. In FIG. 8, elements performing similar functions to those of the third preferred embodiment are denoted by identical reference characters. The memory test circuit according to the fourth preferred embodiment is formed by an address generating circuit 81A, which is the same as the address generating circuit 81 of the third preferred embodiment shown in FIG. 6 as it is modified to further comprise a selector circuit 86, and memory circuits 21D, 21E and 21F which are the same as the memory circuits 21A, 21B and 21C of the third preferred embodiment as they are modified to each further comprise an AND circuit 87 which serves as a gate circuit.

The selector circuit 86 is under the control of a signal which is the same as an operation stop signal which is supplied to the second circuit generating full cyclic sequence 64. Inputs of the selector circuit 86 are connected to outputs of the first and the second circuit generating full cyclic sequences 62 and 64. The selector circuit 86 selects an output from the second circuit generating full cyclic sequence 64 when the second circuit generating full cyclic sequence 64 is operable.

The AND circuit 87 forcibly supplies "0" to the first shift register circuit 82 when the second circuit generating full cyclic sequence 64 is operable. Conversely, when the second circuit generating full cyclic sequence 64 is inoperable, an output from the selector circuit 86 is allowed into the first shift register circuit 82. An output from the selector circuit 86 is also coupled to the second shift register circuit 83 so that transmitted data is supplied to the second shift register circuit 83 when the second circuit generating full cyclic sequence 64 is operable. In FIG. 8, denoted at 21D, 21E and 21F are the memory circuits which are connected parallel to one address generating circuit 81A just like the memory circuits 21A, 21B and 21C of FIG. 5. The circuit structure is otherwise the same as that of the third preferred embodiment and will not be described here.

Operation

FIG. 9 shows an operation of the circuit of FIG. 8. FIG. 9 assumes that an address signal is set as A0=A1=A2=A3=A4=0 at a time T=0. It is also assumed that the shift registers 66 and 76 of the circuit generating full cyclic sequences 62 and 64 are both cleared to 0. FIG. 9 is exactly the same as FIG. 7 under this condition. In other words, as the time T changes, addresses change as shown in the address columns of the table.

Since all values of an address signal ranging from 0 to 31 (two to the fifth power minus one) are generated, it is possible to access all words of the memory cell.

The X address column and Y address column of the table show that an X address changes in an order 0, 4, 2, 5, 6, 7, 3, 1, 0, 4, 2, 5, 6, 7, 3, 1, . . . and a Y address changes only when the X address changes from 1 to 0.

In the circuit of FIG. 8, the first and the second shift registers and the gate circuit (AND circuit) are disposed adjacent each other in each memory circuit and the memory circuits 21D, 21E and 21F share the address generating circuit 81A.

The address generating circuit 81A is connected to the first and the second shift registers 82 and 83 by only two signal lines. This makes the wire structure less complex than in the circuit of the third preferred embodiment shown in FIG. 6.

FIFTH PREFERRED EMBODIMENT

Structure

Figure 10:
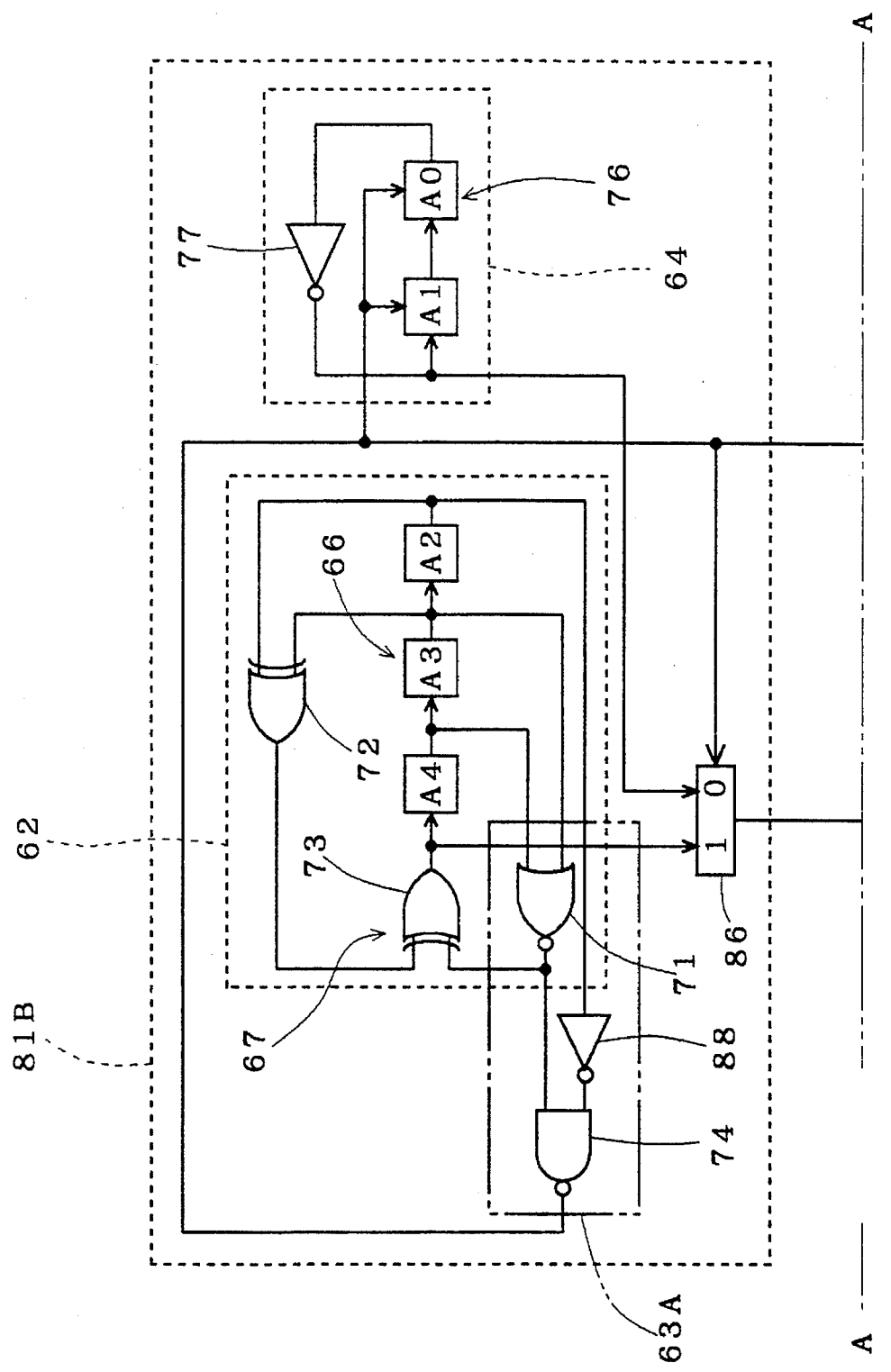
FIGS. 10 and 11 are views of a memory test circuit according to a fifth preferred embodiment of the present invention.
Figure 11:
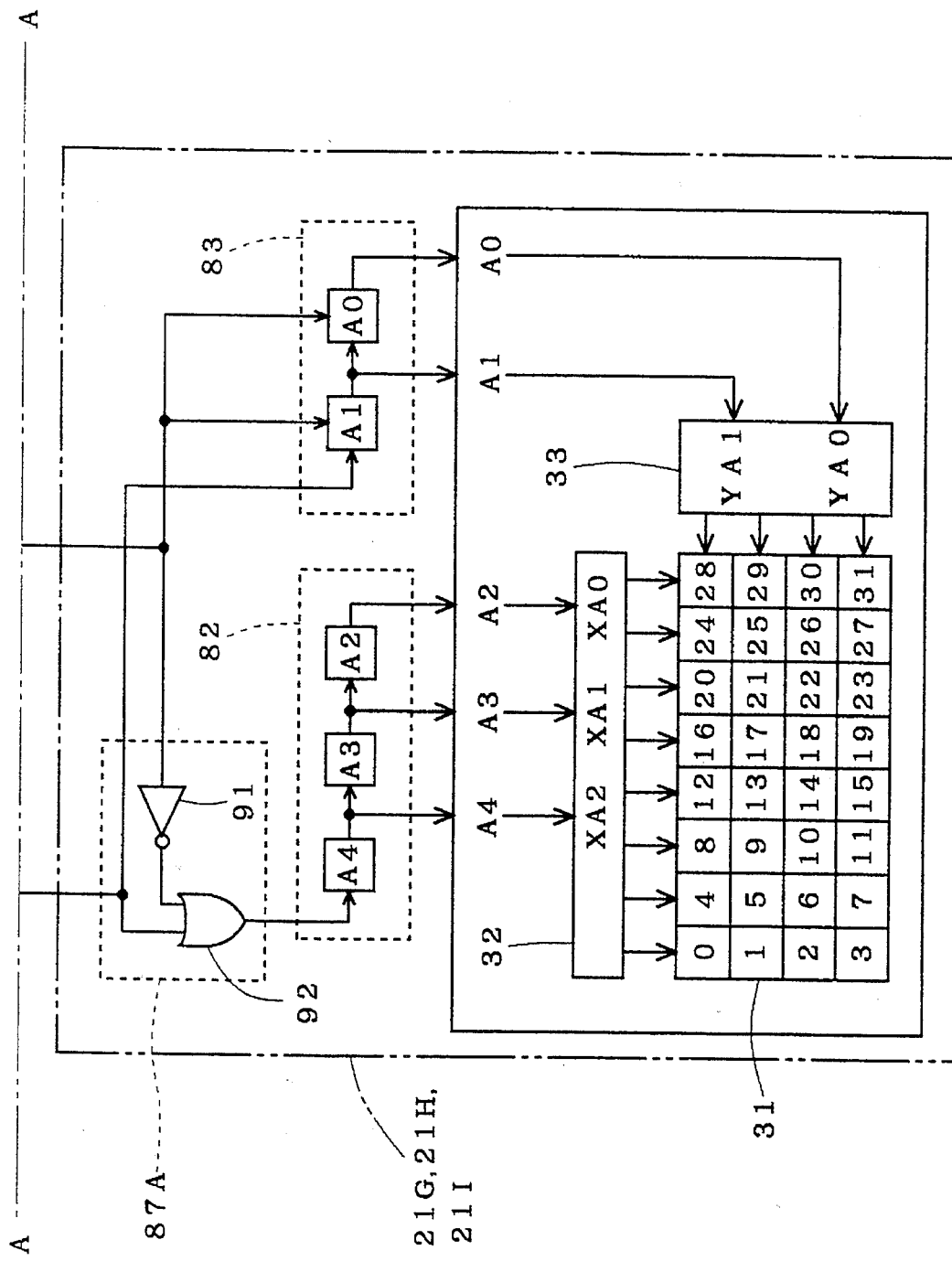

FIGS. 10 and 11 are views of a memory test circuit according to a fifth preferred embodiment of the present invention. When combined with each other at the dotted line A—A, FIGS. 10 and 11 form one complete drawing. In FIGS. 10 and 11, elements performing similar functions to those of the fourth preferred embodiment are denoted by identical reference characters. A specific state detection circuit 63A of the memory test circuit according to the fifth preferred embodiment is similar to the specific state detection circuit 63 of the address generating circuit 81A of the fourth preferred embodiment, but comprises an invertor circuit 88 as shown in FIGS. 10 and 11. That is, the invertor circuit 88, the NOR circuit 71 and the NAND circuit 74 form the specific state detection circuit 63A. When the specific state detection circuit 63A detects a state wherein all digits of the shift register 66 of the first circuit generating full cyclic sequence 62 become 0, the second circuit generating full cyclic sequence 64 and the second shift register circuit 83 become operable. While the gate circuit is formed by one AND circuit 87 in the fourth preferred embodiment shown in FIG. 8, a gate circuit 87A of the fifth preferred embodiment is formed by an invertor circuit 91 and an OR circuit 92. The gate circuit 87A forcibly supplies "0" to the first shift register circuit 82 only when the second circuit generating full cyclic sequence 64 is operable. Conversely, when the second circuit generating full cyclic sequence 64 is inoperable, an output from the selector circuit 86 is allowed into the first shift register circuit 82. An output from the selector circuit 86 is also coupled to the second shift register circuit 83 so that transmitted data is supplied to the second shift register circuit 83 when the second circuit generating full cyclic sequence 64 is operable. In FIGS. 10 and 11, denoted at 21G, 21H and 21I are memory circuits which are connected parallel to one address generating circuit 81B as the memory circuits 21A, 21B and 21C of FIG. 5. The circuit structure is otherwise the same as that of the fourth preferred embodiment and will not be described here.

Operation

FIG. 12 shows an operation of the circuit of FIGS. 10 and 11. FIG. 12 assumes that an address signal is set as A4=1, A0=A1=A2=A3=0 at a time T=0. It is also assumed that the shift register 66 of the first circuit generating full cyclic sequence 62 is set as "100" while the shift register 76 of the second circuit generating full cyclic sequence 64 is set as "00".

As the time T changes, addresses change as shown in the address columns of the table. Since all values of an address signal ranging from 0 to 31 (two to the fifth power minus one) are generated, it is possible to access all words of the memory cell.

The X address column and Y address column of the table show that an X address changes in an order 4, 2, 5, 6, 7, 3, 1, 0, 4, 2, 5, 6, 7, 3, 1, 0, . . . and a Y address changes only when the X address changes from 0 to 4.

In the circuit of FIGS. 10 and 11, the first and the second shift registers 82 and 83 and the gate circuit 87A are disposed adjacent each other in each one of the memory circuits 21G, 21H and 21I, and the memory circuits 21G, 21H and 21I share the address generating circuit 81B.

The address generating circuit 81B is connected to the first and the second shift registers 82 and 83 by only two signal lines. This makes the wire structure less complex than in the circuit of the third preferred embodiment shown in FIG. 6. This effect is the same as that created by the memory test circuit of the fourth preferred embodiment shown in FIG. 8.

SIXTH PREFERRED EMBODIMENT

Structure

Figure 13:
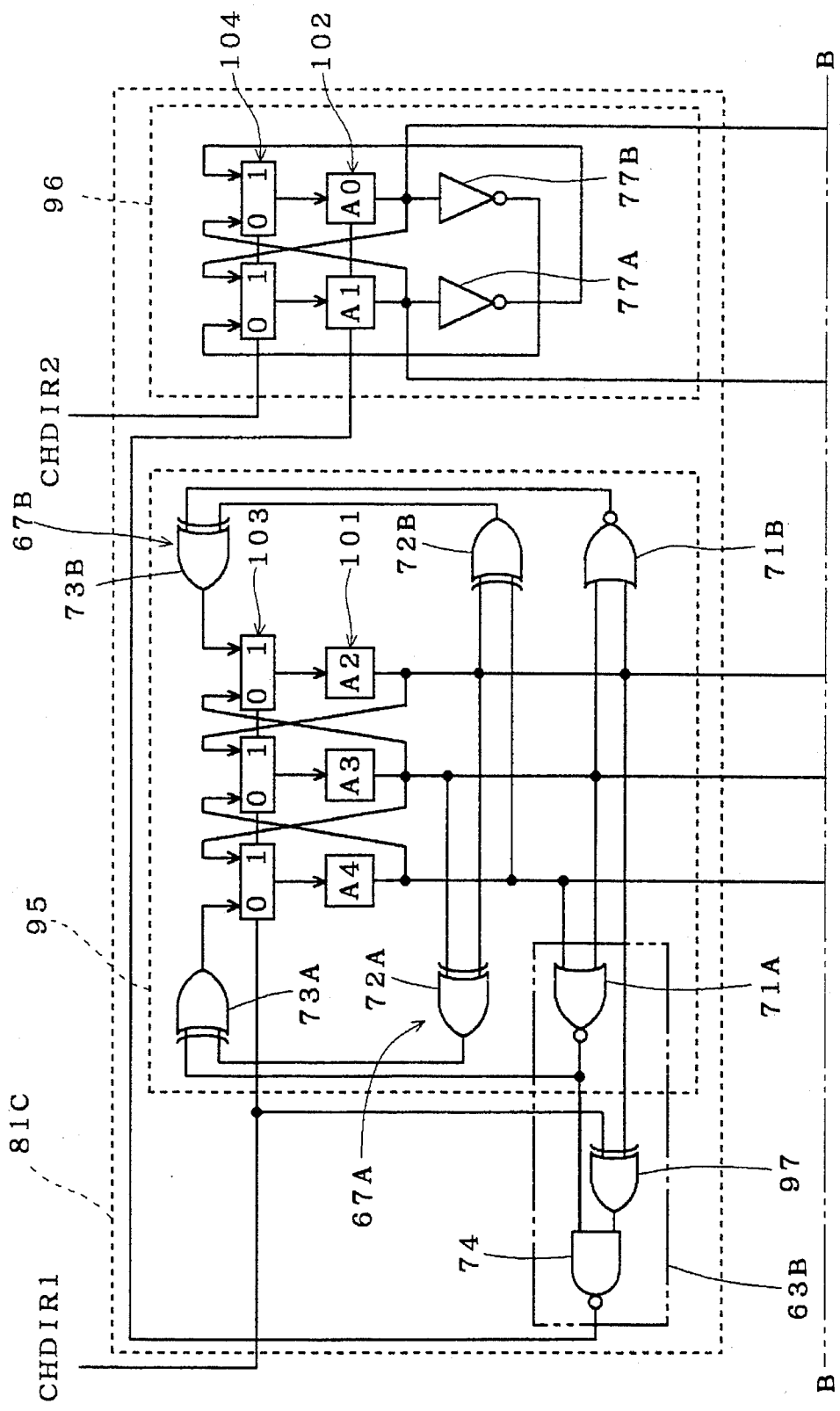
FIGS. 13 and 14 are views of a memory test circuit according to a sixth preferred embodiment of the present invention.
Figure 14:
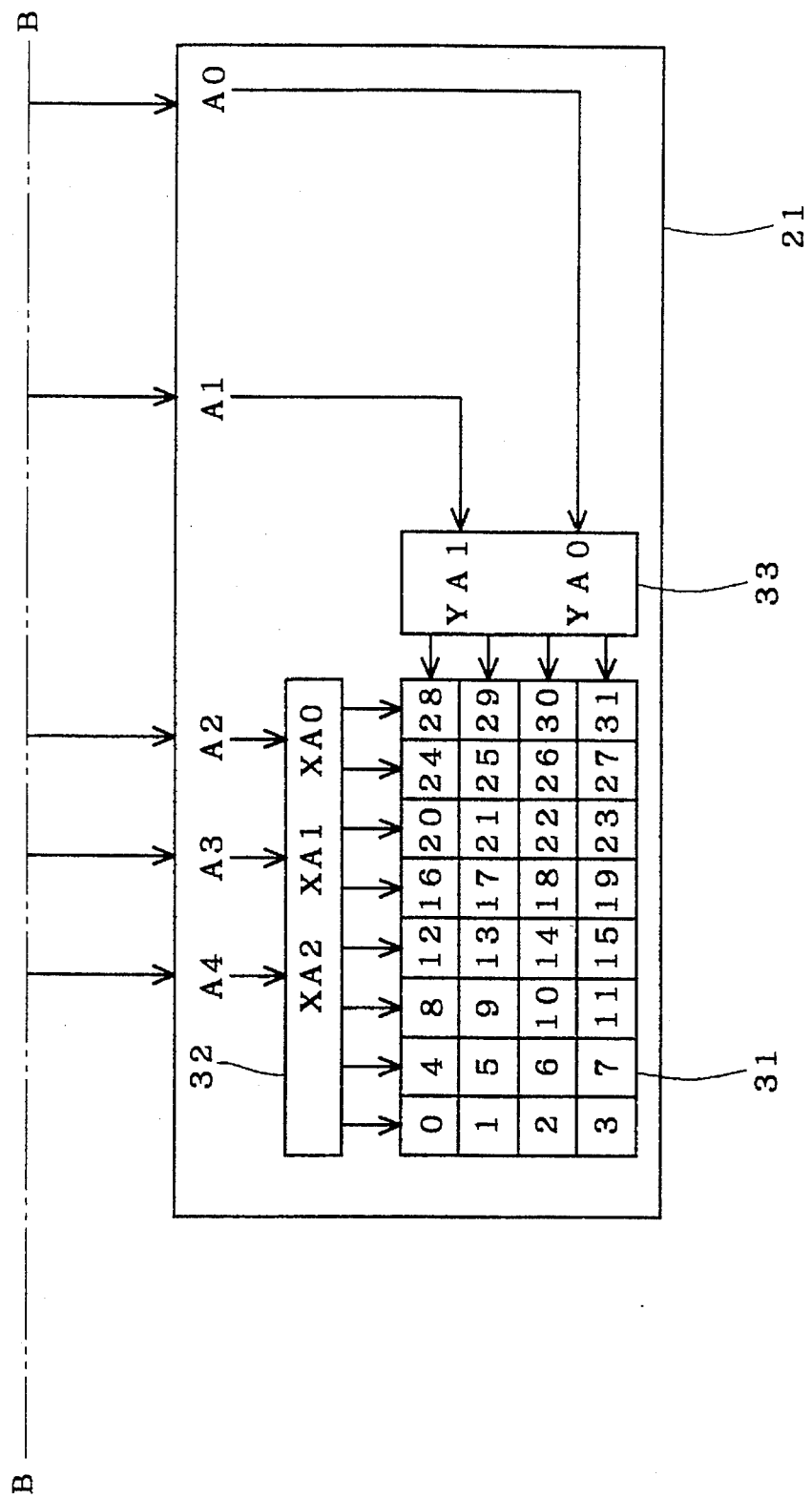

FIGS. 13 and 14 are views of a memory test circuit according to a sixth preferred embodiment of the present invention. When combined with each other at the dotted line B—B, FIGS. 13 and 14 form one complete drawing. The memory test circuit according to the sixth preferred embodiment comprises an address generating circuit 81C which is the same as the address generating circuit 81 of the second preferred embodiment shown in FIG. 3 except for that it is connected to two bi-directional circuit generating full cyclic sequences 95 and 96 rather than to the circuit generating full cyclic sequences 62 and 64. Unlike in the second preferred embodiment, a specific state detection circuit 63B for detecting a specific state of the first bi-directional circuit generating full cyclic sequence 95 is formed by an NOR circuit 71A, an XOR circuit 97 and an NAND circuit 74. In FIGS. 13 and 14, denoted at 101 and 102 are shift registers which are disposed within the bi-directional circuit generating full cyclic sequences 95 and 96, and denoted at 103 and 104 are selector groups for switching a direction of operation of the shift registers 101 and 102. Feedback circuits 67A and 67B supply feedback to the shift register 101 in two directions within the first bi-directional circuit generating full cyclic sequence 95 (first bi-directional feedback circuits). Denoted at 71A and 71B are NOR circuits of the feedback circuits 67A and 67B. Denoted at 72A, 72B, 73A and 73B are exclusive OR circuits (XOR circuits) of the feedback circuits 67A and 67B. Invertor circuits 77A and 77B function as feedback circuits which supply feedback to the shift register 102 in the two directions within the second bi-directional circuit generating full cyclic sequence 96 (second bi-directional feedback circuits). The feedback circuits 67A, 67B, 77A and 77B each have the same structure as that used in the second preferred embodiment except for that they are connected to the shift registers 101 and 102 in two directions (that is, they are disposed symmetrically as pairs of feedback circuits). The NOR circuit 71A of the feedback circuit 67A serves as the NOR circuit of the specific state detection circuit 63B as described earlier.

The direction of operation of the first bi-directional circuit generating full cyclic sequence 95 is controlled by a signal CHDIR1. The first bi-directional circuit generating full cyclic sequence 95 generates a total cycle system of a forward direction by shifting data in the right-hand direction when the signal CHDIR1 is "0". When the signal CHDIR1 is "1", the first bi-directional circuit generating full cyclic sequence 95 generates a total cycle system of a reverse direction by shifting data in the left-hand direction. The direction of operation of the second bi-directional circuit generating full cyclic sequence 96 is controlled by a signal CHDIR2. The second bi-directional circuit generating full cyclic sequence 96 generates a total cycle system of a forward direction by shifting data in the right-hand direction when the signal CHDIR2 is "0". When signal CHDIR2 is "1", the second bi-directional circuit generating full cyclic sequence 96 generates a total cycle system of a reverse direction by shifting data in the left-hand direction.

The XOR circuit 97 of the specific state detection circuit 63B as well receives the signal CHDIR1. Hence, the specific state detection circuit 63B detects "001" when the signal CHDIR1 is "0" and detects "000" when the signal CHDIR1 is "1".

Operation

FIGS. 15 and 16 show an operation of the circuit of FIGS. 13 and 14. FIG. 15 shows an operation of when CHDIR1=0 and CHDIR2=0 while FIG. 16 shows an operation of when CHDIR1=1 and CHDIR2=1. Although it is possible to set CHDIR1=0 and CHDIR2=1 or CHDIR1=1 and CHDIR2=0, no description will be given here since the effect is the same.

FIG. 15 assumes that an address signal is set as A0=A1=A2=A3=A4=0 at a time T=0. As the time T changes, addresses change as shown in the address columns of the table.

Since all values of an address signal ranging from 0 to 31 (two to the fifth power minus one) are generated, it is possible to access all words of the memory cell.

The X address column and Y address column of the table in FIG. 15 show that an X address changes in an order 0, 4, 2, 5, 6, 7, 3, 1, 0, 4, 2, 5, 6, 7, 3, 1, . . . and a Y address changes only when the X address changes from 1 to 0.

FIG. 16 assumes that an address signal is set as A2=A0=1 and A1=A3=A4=0 at a time T=0. As the time T changes, addresses change as shown in the address columns of the table.

Since all values of an address signal ranging from 0 to 31 (two to the fifth power minus one) are generated, it is possible to access all words of the memory cell.

The X address column and Y address column of the table in FIG. 16 show that an X address changes in an order 1, 3, 7, 6, 5, 2, 4, 0, 1, 3, 7, 6, 5, 2, 4, 0, . . . and a Y address changes only when the X address changes from 0 to 1.

Comparing the address columns of FIGS. 15 and 16, it is understood that addresses are generated exactly in reverse orders.

SEVENTH PREFERRED EMBODIMENT

Structure

Figure 17:
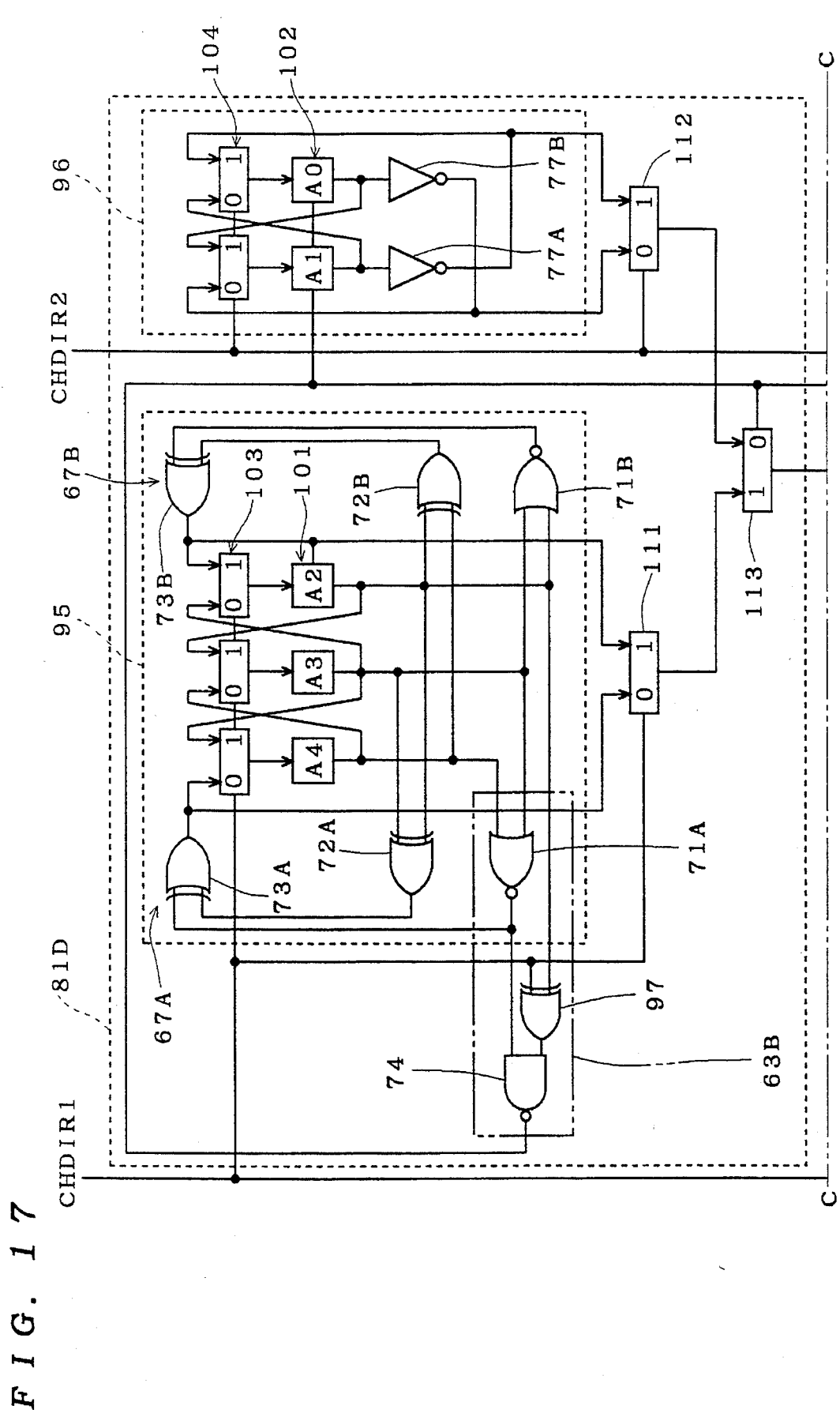
FIGS. 17 and 18 are views of a memory test circuit according to a seventh preferred embodiment of the present invention.
Figure 18:
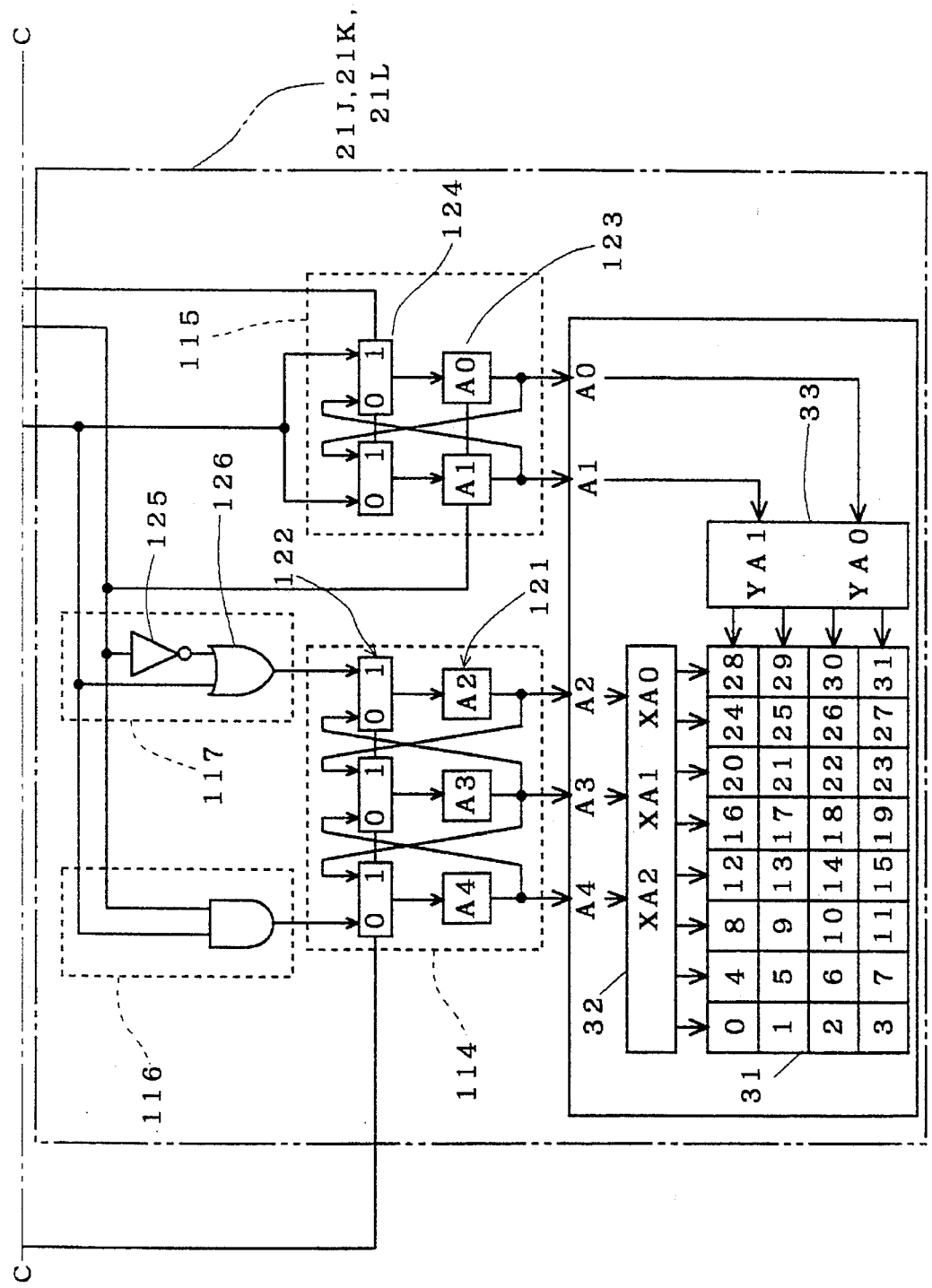

FIGS. 17 and 18 are views of a memory test circuit according to a seventh preferred embodiment of the present invention. When combined with each other at the dotted line C—C, FIGS. 17 and 18 form one complete drawing. The memory test circuit according to the seventh preferred embodiment is similar to the memory test circuit of the sixth preferred embodiment shown in FIGS. 13 and 14 comprising the bi-directional circuit generating full cyclic sequences, except for that each memory circuit comprises a gate circuit and a shift register circuit as in the fourth preferred embodiment shown in FIG. 8 and the fifth preferred embodiment shown in FIGS. 10 and 11. In FIGS. 17 and 18, elements performing similar functions to those of the fourth to the sixth preferred embodiments are denoted by identical reference characters.

An address generating circuit 81D of the memory test circuit according to the seventh preferred embodiment further comprises a first selector circuit 111 which selects where to retrieve an output in correspondence to the direction of operation of the first bi-directional circuit generating full cyclic sequence 95. The address generating circuit 81D also comprises a first selector circuit 112 which selects where to retrieve an output in correspondence to the direction of operation of the second bi-directional circuit generating full cyclic sequence 96. As an element which corresponds to the selector circuit 86 which is shown in FIG. 8 or FIGS. 10 and 11, a third selector circuit 113 is connected to the selector circuits 111 and 112.

Since the circuit generating full cyclic sequences 95 and 96 are bi-directional, shift register circuits connected to the X decoders 32 and the Y decoders 33 of memory circuits 21J, 21K and 21L are bi-directional circuits (i.e., a first bi-directional shift register circuit 114 and a second bi-directional shift register circuit 115). A pair of gate circuits (a first gate circuit 116 and a second gate circuit 117) is disposed to supply data to the first bi-directional shift register circuit 114 from two directions.

The first bi-directional shift register circuit 114 is formed by a 3-digit bi-directional shift register 121 having a similar structure to the shift register 101 of the first bi-directional circuit generating full cyclic sequence 95 and a selector group 122 having a similar structure to the selector group 103 of the first bi-directional circuit generating full cyclic sequence 95 to switch the direction of operation of the first bi-directional circuit generating full cyclic sequence 95.

The second bi-directional shift register circuit 115 is formed by a 2-digit bi-directional shift register 123 having a similar structure to the shift register 102 of the second bi-directional circuit generating full cyclic sequence 96 and a selector group 124 having a similar structure to the selector group 104 of the second bi-directional circuit generating full cyclic sequence 96 to switch the direction of operation of the bi-directional shift register 123.

The first gate circuit 116 is formed by one AND circuit. An input terminal of the first gate circuit 116 is connected to the third selector circuit 113 while another input terminal of the first gate circuit 116 is connected to the NAND circuit 74 of the specific state detection circuit 63B.

The second gate circuit 117 is formed by one invertor circuit 125 and one OR circuit 126. An input terminal of the, invertor circuit 125 is connected to the NAND circuit 74 of the specific state detection circuit 63B. An input terminal of the OR circuit 126 is connected to the invertor circuit 125 while another input terminal of the OR circuit 126 is connected to the third selector circuit 113.

In the memory test circuit having such a structure as above, when initial values of the shift registers are appropriately set, the circuit of FIGS. 17 and 18 behaves similar to the circuit of FIGS. 15 and 16.

EIGHTH PREFERRED EMBODIMENT

Structure

Figure 19:
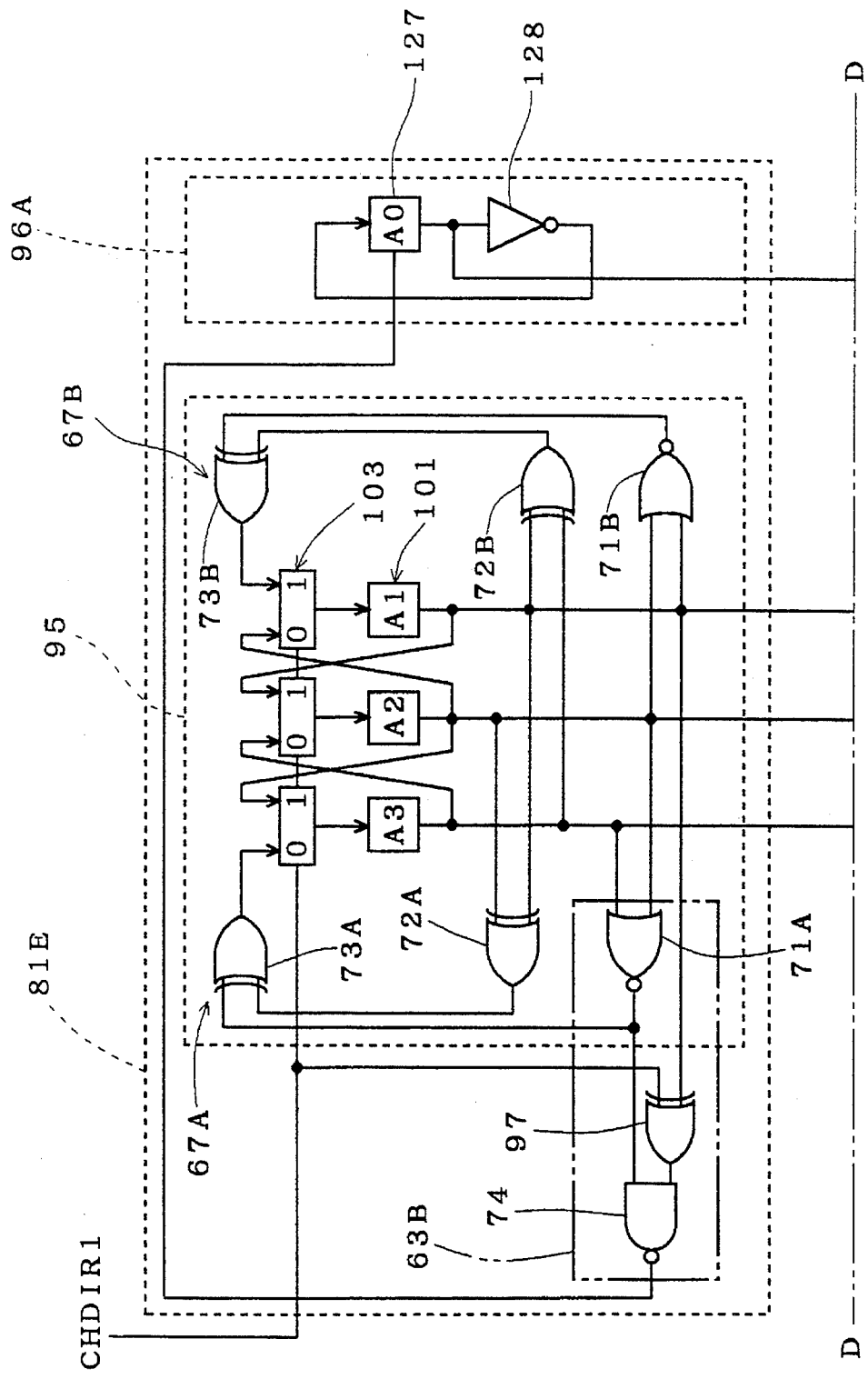
FIGS. 19 and 20 are views of a memory test circuit according to an eighth preferred embodiment of the present invention.
Figure 20:
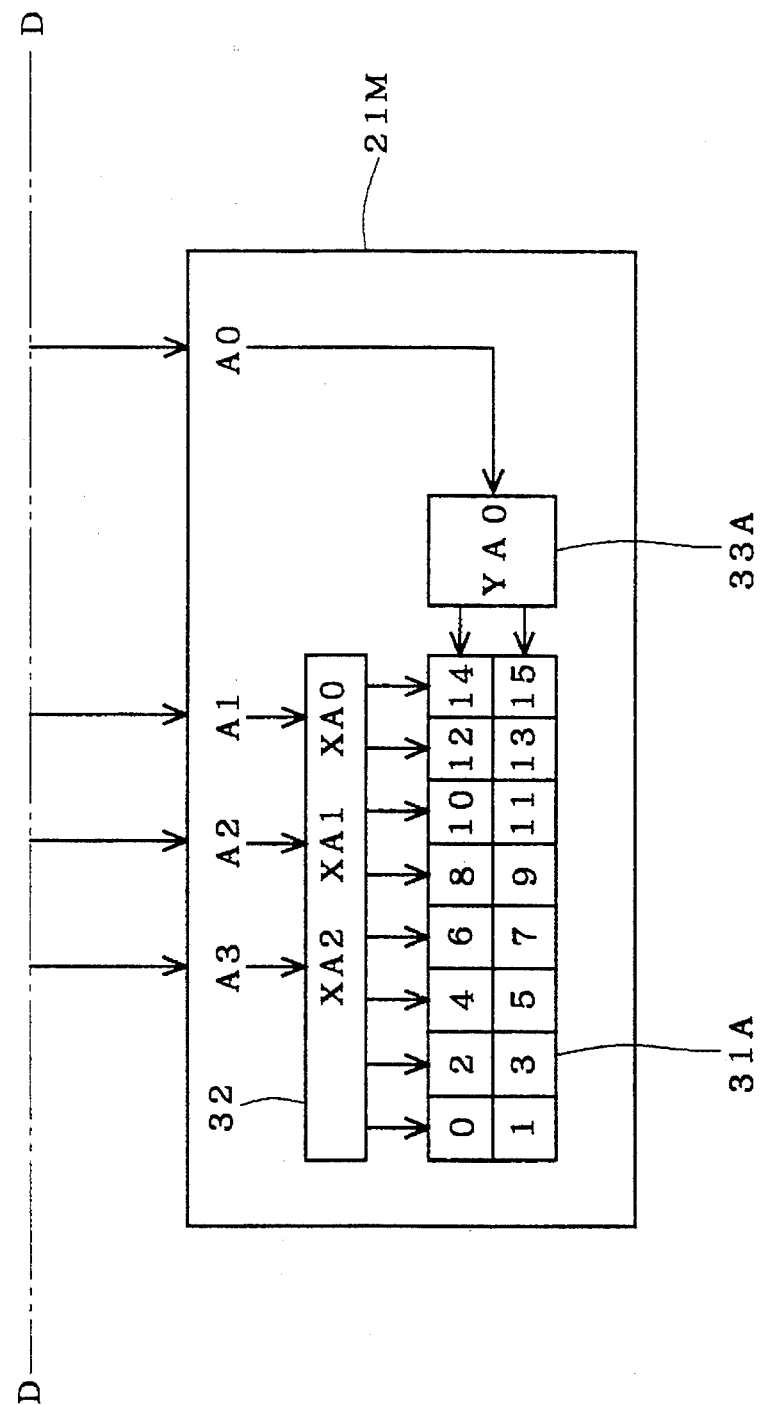

FIGS. 19 and 20 are views of a memory test circuit according to an eighth preferred embodiment of the present invention. In FIGS. 19 and 20, elements performing similar functions to those of the sixth preferred embodiment shown in FIGS. 13 and 14 are denoted by identical reference characters. The memory test circuit according to the eighth preferred embodiment is similar to the circuit of FIGS. 13 and 14 except for that a Y decoder 33A of a memory circuit 21M is a 1-digit (binary) decoder and a memory cell 31A has a memory region consisting of 16 words ranging from 0 to 15. Hence, a second circuit generating full cyclic sequence 96A of an address generating circuit 81E is a 1-bit circuit generating full cyclic sequence (which is equivalent to a 1-bit counter).

The second circuit generating full cyclic sequence 96A is formed by one register 127 (1-bit shift register) and one invertor 128 which serves as a feedback circuit. A data input terminal of the register 127 is connected to an output terminal of the invertor 128, an operation control input terminal of the register 127 is connected to the NAND circuit 74 of the specific state detection circuit 63B, and a data output terminal of the register 127 is connected to an address input terminal (A0) for the Y decoder 33A of the memory circuit 21M. An input terminal of the invertor 128 is connected to the register 127. The circuit structure is otherwise the same as that of the sixth preferred embodiment and will not be described here.

Operation

FIGS. 21 and 22 show an operation of the circuit of FIGS. 19 and 20. FIG. 21 shows an operation of when CHDIR1=0 while FIG. 22 shows an operation of when CHDIR1=1. FIG. 21 assumes that an address signal is set as A0=A1=A2=A3=0 at a time T=0. As the time T changes, addresses change as shown in the address columns of the table. Since all values of an address signal ranging from 0 to 15 (two to the fourth power minus one) are generated, it is possible to access all words of the memory cell.

The X address column and Y address column of the table in FIG. 21 show that an X address changes in an order 0, 4, 2, 5, 6, 7, 3, 1, 0, 4, 2, 5, 6, 7, 3, 1, ... and a Y address changes only when the X address changes from 1 to 0.

FIG. 22 assumes that an address signal is set as A1=A0=1 and A2=A3=0 at a time T=0. As the time T changes, addresses change as shown in the address columns of the table.

Since all values of an address signal ranging from 0 to 15 (two to the fourth power minus one) are generated, it is possible to access all words of the memory cell. The X address column and Y address column of the table in FIG. 22 show that an X address changes in an order 1, 3, 7, 6, 5, 2, 4, 0, 1, 3, 7, 6, 5, 2, 4, 0, ... and a Y address changes only when the X address changes from 0 to 1.

Comparing the address columns of FIGS. 21 and 22, it is understood that addresses are generated exactly in reverse orders.

NINTH PREFERRED EMBODIMENT

Figure 23:
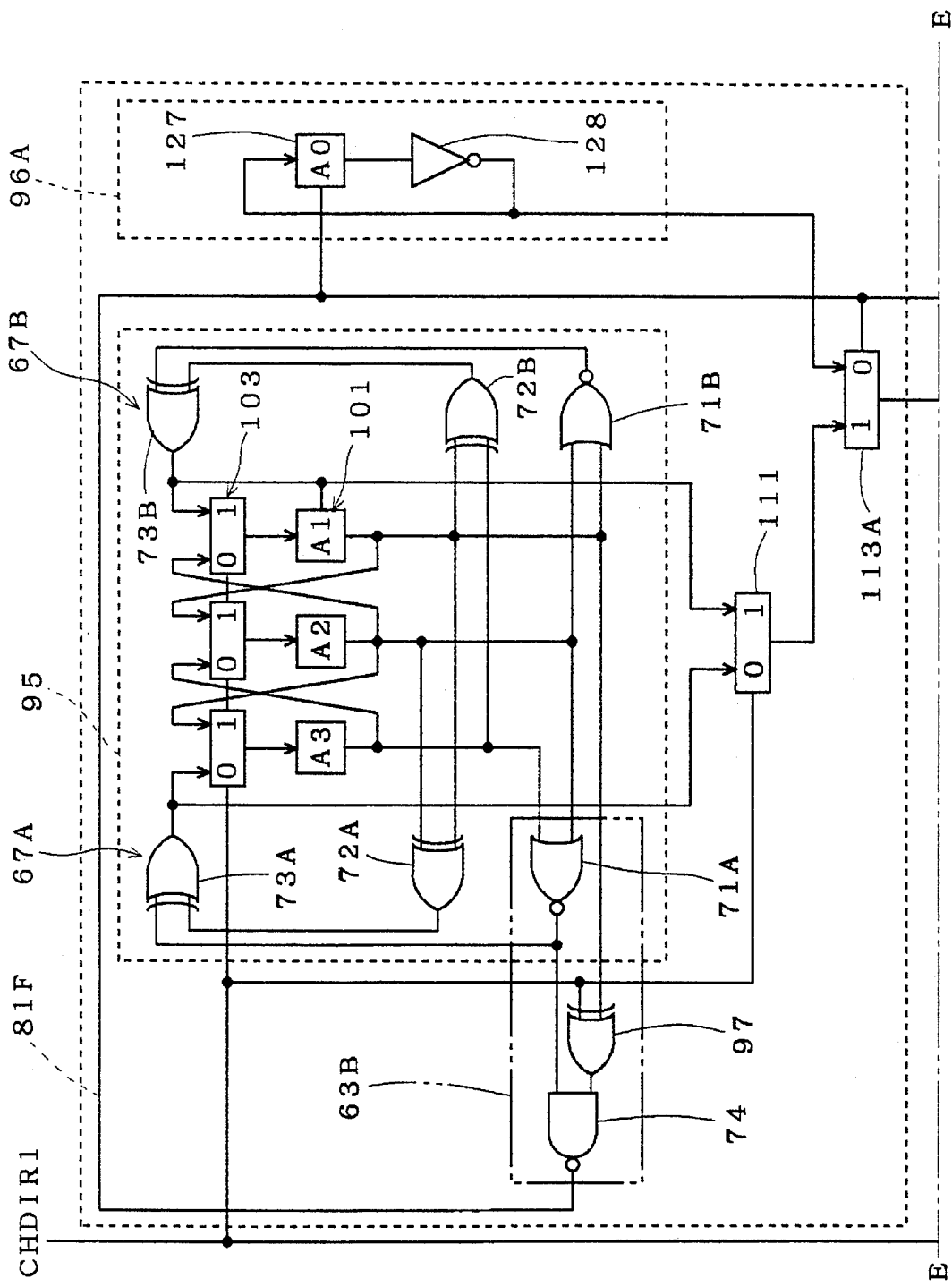
FIGS. 23 and 24 are views of a memory test circuit according to a ninth preferred embodiment of the present invention.
Figure 24:
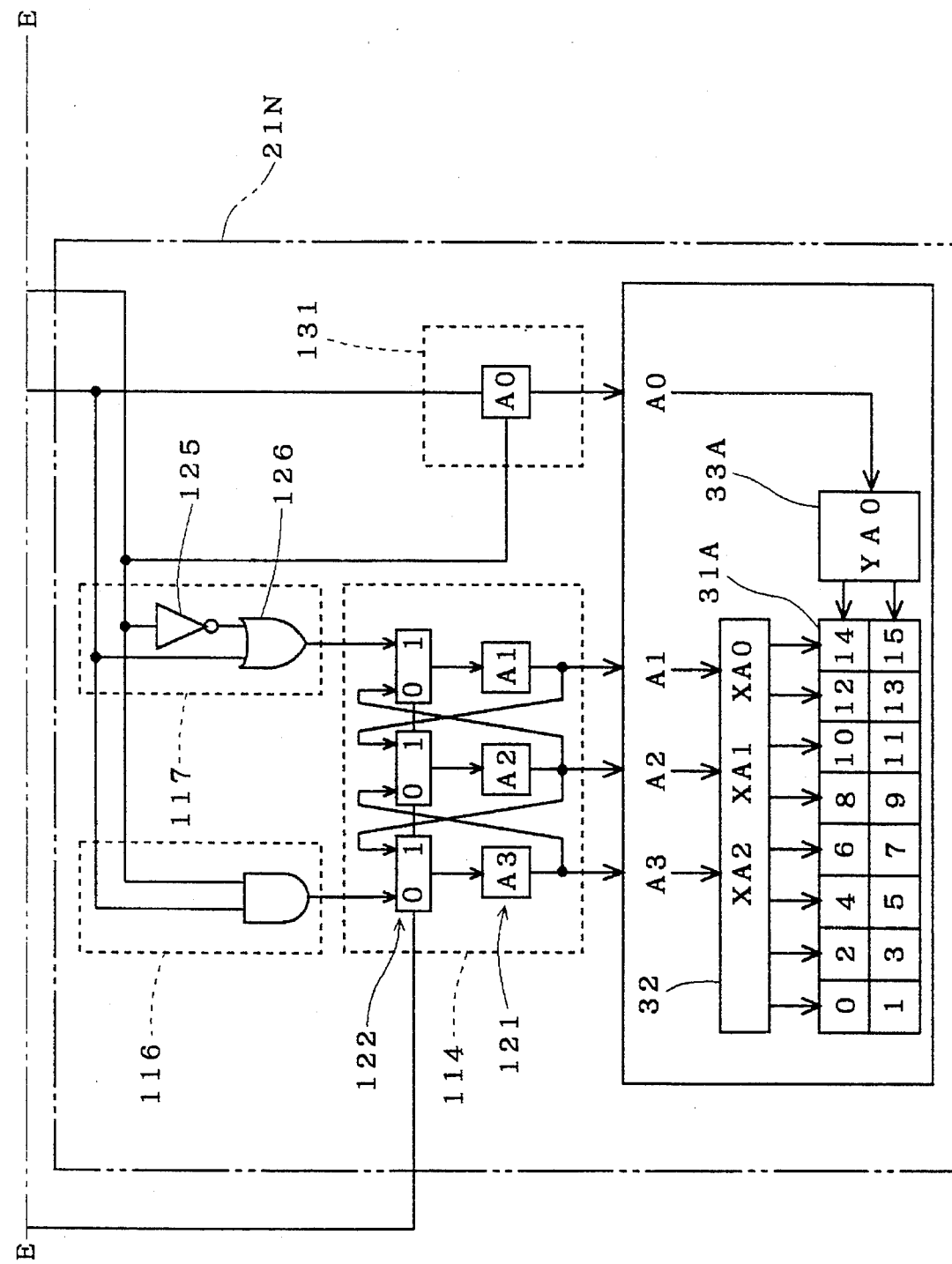

FIGS. 23 and 24 are views of a memory test, circuit according to a ninth preferred embodiment of the present invention. In FIGS. 23 and 24, elements performing similar functions to those of the seventh preferred embodiment shown in FIGS. 17 and 18 and the eighth preferred embodiment shown in FIGS. 19 and 20 are denoted by identical reference characters. When combined with each other at the dotted line E—E, FIGS. 23 and 24 form one complete drawing. The memory test circuit according to the ninth preferred embodiment comprises a memory circuit 21N which is the same as the memory circuit 21M of the eighth preferred embodiment shown in FIGS. 19 and 20 as it is modified to comprise gate circuits 116 and 117 and shift registers 114 and 131 as in the seventh preferred embodiment. An address generating circuit 81F of the ninth preferred embodiment is the same as the address generating circuit 81E of the eighth preferred embodiment as it is modified to comprise selector circuits 111 and 113A which are similar to the selector circuits used in the seventh preferred embodiment. The shift register circuit 131 (hereinafter "1-bit shift register circuit 131"), however, is formed only by a 1-bit register since the second circuit generating full cyclic sequence 96A has a 1-bit structure. Since the direction in which data is transmitted does not matter, there is no selector circuit which corresponds to the second selector circuit 112 which is used in the seventh preferred embodiment. This allows an input terminal "0" of the selector circuit 113A to be directly connected to the invertor 128 of the second circuit generating full cyclic sequence 96A. The structure of the circuit of the ninth preferred embodiment is otherwise the same as that of the circuit of the eighth preferred embodiment. In the memory test circuit having such a structure as above, when initial values of the shift registers are appropriately set, the circuit of FIGS. 23 and 24 behaves similar to the circuit of FIGS. 21 and 22.

TENTH PREFERRED EMBODIMENT

Structure

Figure 25:
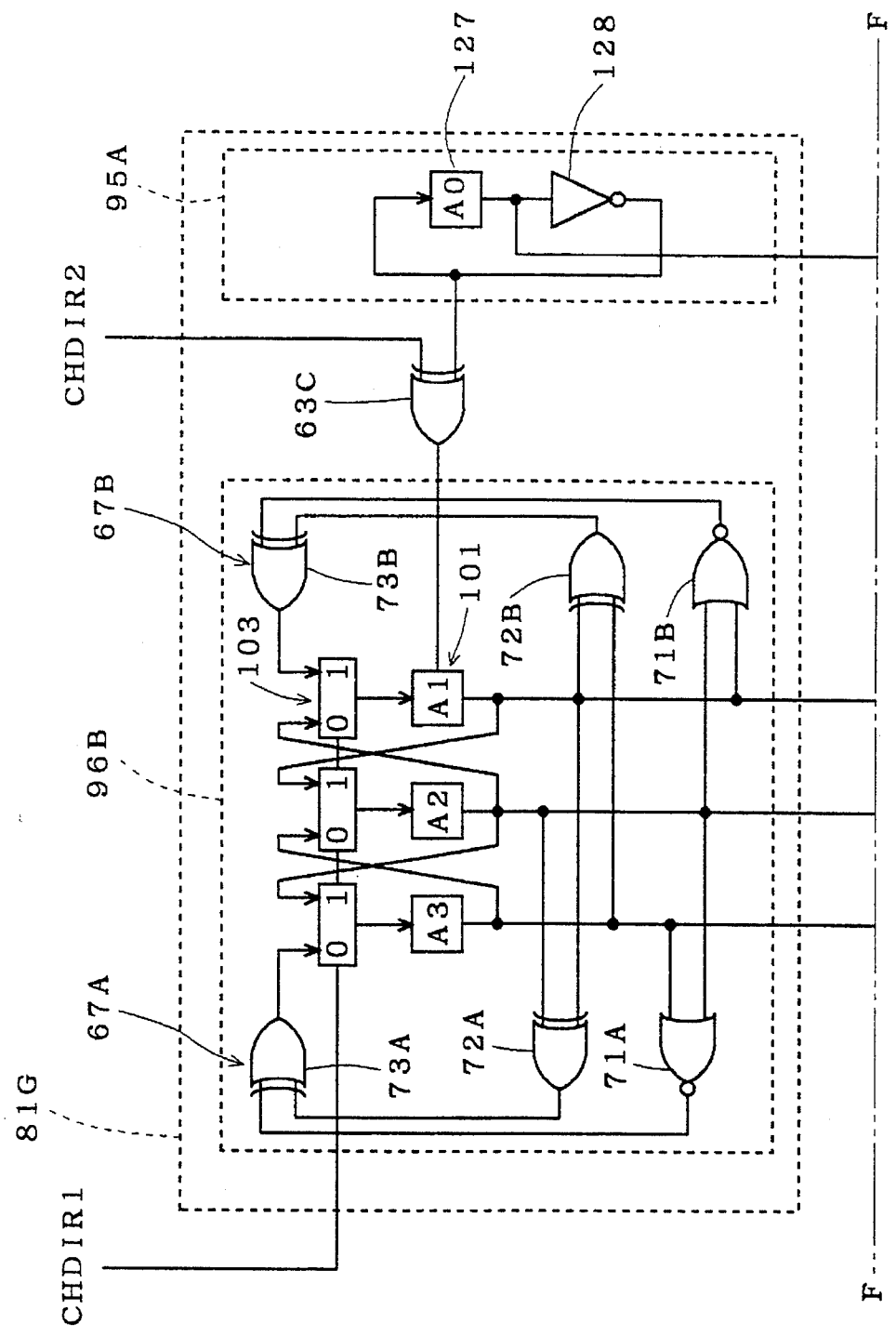
FIGS. 25 and 26 are views of a memory test circuit according to a tenth preferred embodiment of the present invention.
Figure 26:
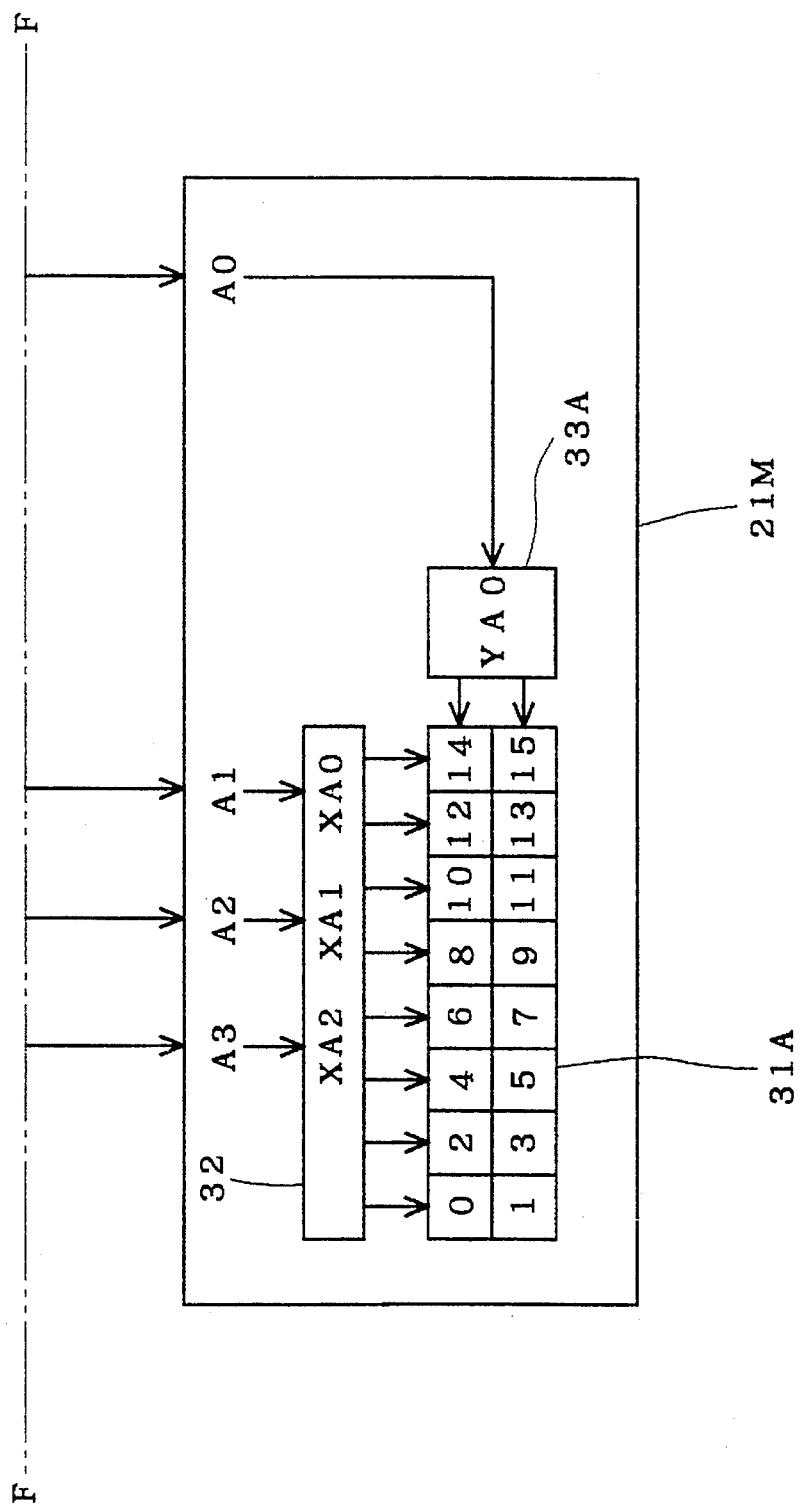

FIGS. 25 and 26 are views of a memory test circuit according to a tenth preferred embodiment of the present invention. In FIGS. 25 and 26, elements performing similar functions to those of the eighth preferred embodiment shown in FIGS. 19 and 20 are denoted by identical reference characters. When combined with each other at the dotted line F—F, FIGS. 25 and 26 form one complete drawing. In an address generating circuit 81G of the memory test circuit according to the tenth preferred embodiment, a 1-bit circuit generating full cyclic sequence similar to the second circuit generating full cyclic sequence 96A of the eighth preferred embodiment is used as a first circuit generating full cyclic sequence 95A for generating a Y address. As a second circuit generating full cyclic sequence 96B for generating an X address, a bi-directional circuit generating full cyclic sequence similar to the first bi-directional circuit generating full cyclic sequence 95 of the eighth preferred embodiment is used. One XOR circuit (exclusive OR circuit) is used as a specific state detection circuit 63C for detecting a specific state of an output (Y address value) from the first circuit generating full cyclic sequence 95A and rendering the second circuit generating full cyclic sequence 96B inoperable. At one input terminal, the XOR circuit 63C receives the signal CHDIR2 from outside. Another input terminal of the XOR circuit 63C is connected to the output terminal of the invertor 128 of the second circuit generating full cyclic sequence 95A. Thus, the signal CHDIR2 specifies a detection condition for the XOR circuit 63C. The circuit structure is otherwise the same as that of the eighth preferred embodiment and will not be described here.

Operation

FIGS. 27 and 28 show an operation of the circuit of FIGS. 25 and 26. FIG. 27 shows an operation of when CHDIR1=0 and CHDIR2=0 while FIG. 28 shows an operation of when CHDIR1=1 and CHDIR2=1. FIG. 27 assumes that an address signal is set as A0=A1=A2=A3=0 at a time T=0. In this case, the second circuit generating full cyclic sequence 96B is rendered inoperable only when a second operation mode switch signal (CHDIR2) coincides with an address state of the 1-bit first circuit generating full cyclic sequence 95A. More specifically, as shown in FIGS. 27 and 28, as the time T changes, addresses change as shown in the address columns of the tables. Since all values of an address signal ranging from 0 to 15 (two to the fourth power minus one) are generated, it is possible to access all words of the memory cell.

The X address column and Y address column of the table in FIG. 27 show that a Y address changes in an order 0, 1, 0, 1, . . . and an X address changes only when the Y address changes from 1 to 0.

FIG. 28 assumes that an address signal is set as A1=A0=1, A2=A3=0 at a time T=0. As the time T changes, addresses change as shown in the address columns of the tables. Since all values of an address signal ranging from 0 to 15 (two to the fourth power minus one) are generated, it is possible to access all words of the memory cell.

The X address column and Y address column of the table in FIG. 28 show that a Y address changes in an order 1, 0, 1, 0, . . . and an X address changes only when the Y address changes from 0 to 1.

Comparing the address columns of FIGS. 27 and 28, it is understood that addresses are generated exactly in reverse orders.

ELEVENTH PREFERRED EMBODIMENT

Figure 29:
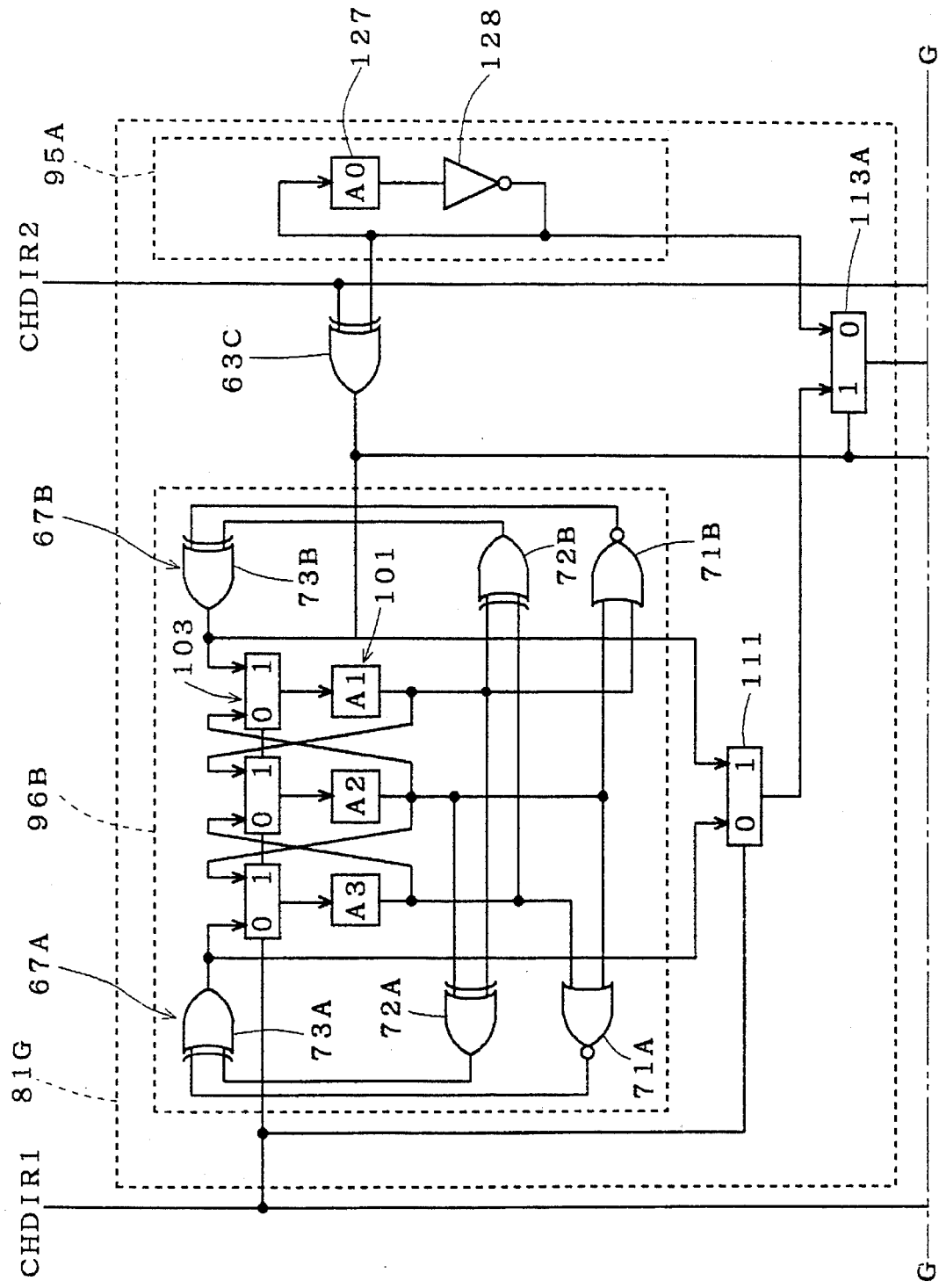
FIGS. 29 and 30 are views of a memory test circuit according to an eleventh preferred embodiment of the present invention.
Figure 30:
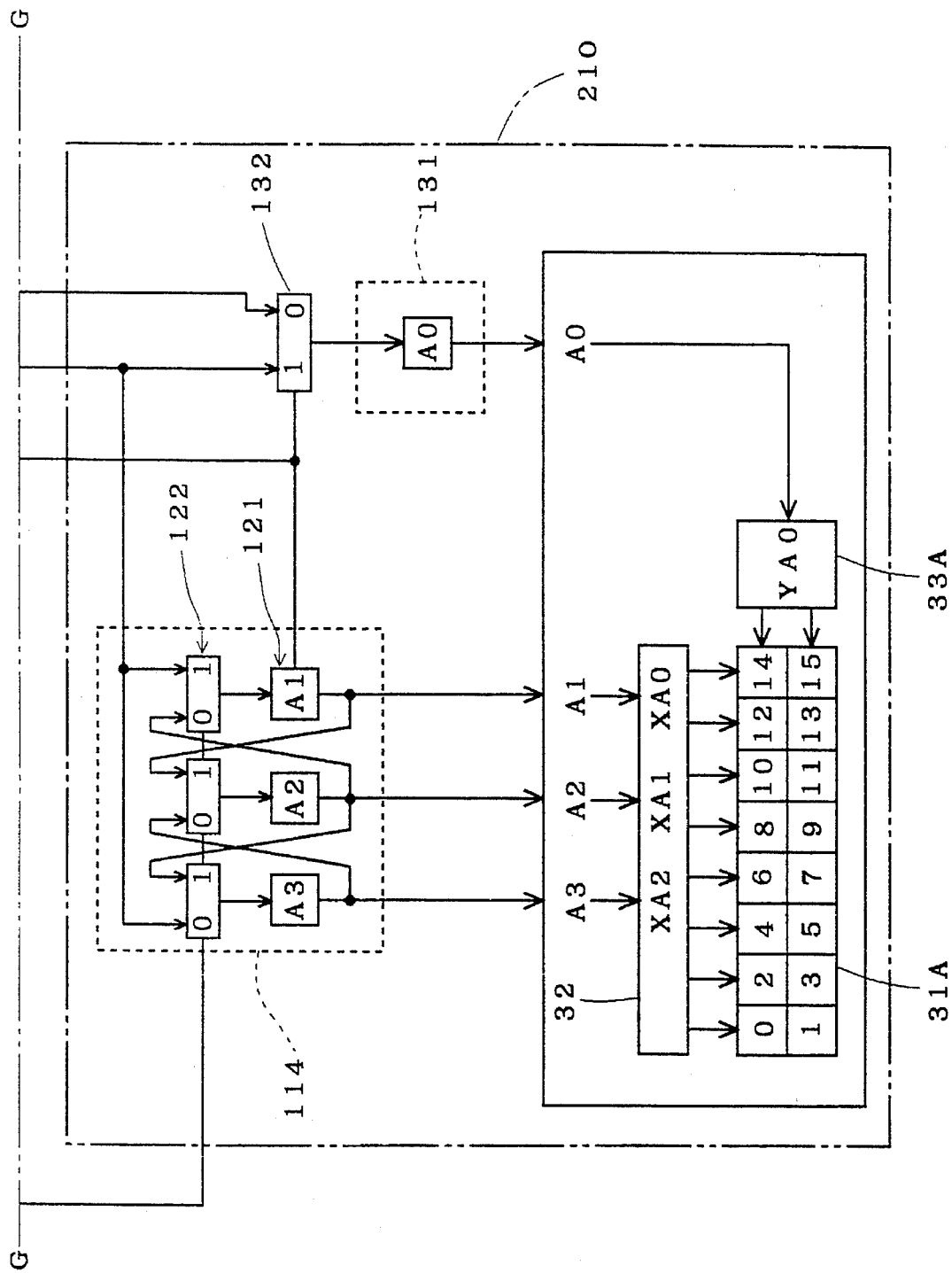

FIGS. 29 and 30 are views of a memory test circuit according to an eleventh preferred embodiment of the present invention. In FIGS. 29 and 30, elements performing similar functions to those of the ninth and the tenth preferred embodiments are denoted by identical reference characters. When combined with each other at the dotted line G—G, FIGS. 29 and 30 form one complete drawing. The memory test circuit according to the eleventh preferred embodiment comprises a memory circuit 21O as that shown in FIGS. 29 and 30 which is the same as the memory circuit 21N of the tenth preferred embodiment shown in FIG. 26 as it is modified to further comprise a 1-bit shift register circuit 131 which corresponds to the 1-bit first circuit generating full cyclic sequence 95A, a 3-bit bi-directional shift register circuit 114 which corresponds to the second circuit generating full cyclic sequence 96B and a selector circuit 132 which selects data to be supplied to the 1-bit shift register circuit 131. An address generating circuit 81G of the eleventh preferred embodiment is the same as the address generating circuit 81F of the tenth preferred embodiment shown in FIGS. 25 and 26 as it is modified to comprise two selector circuits 111 and 113A.

The selector circuit 111 selects where to retrieve an output in correspondence to the direction of operation of the second circuit generating full cyclic sequence 96B. Both input terminals of the selector circuit 111 are connected to output terminals of the XOR circuits 73A and 73B of the feedback circuits 67A and 67B of the second circuit generating full cyclic sequence 96B. The signal CHDIR1 is supplied to a switching control terminal of the selector circuit 111.

In accordance with a signal supplied from the specific state detection circuit 63C, the selector circuit 113A selects either one of an output signal from the invertor 128 of the second circuit generating full cyclic sequence 95A and an output signal from the selector circuit 111.

In accordance with a signal supplied from the specific state detection circuit 63C, the selector circuit 132 which corresponds to the gate circuit used in the structure of FIG. 8 or 10 selects either one of the signal CHDIR2 which is supplied from outside and a signal supplied from the selector circuit 113A. When the second bi-directional circuit generating full cyclic sequence 96B and the first bi-directional shift register circuit 114 are inoperable, the selector circuit 132 allows an output from the selector circuit 113A into the 1-bit shift register circuit 131. Conversely, when the second bi-directional circuit generating full cyclic sequence 96B and the first bi-directional shift register circuit 114 are operable, the selector circuit 132 allows the signal CHDIR2 into the 1-bit shift register circuit 131. The circuit structure is otherwise the same as that of the tenth preferred embodiment and will not be described here.

In the memory test circuit having such a structure as above, when initial values of the shift registers are appropriately set, the circuit of FIGS. 29 and 30 behaves similar to the circuit of FIGS. 27 and 28.

TWELFTH PREFERRED EMBODIMENT

Figure 31:
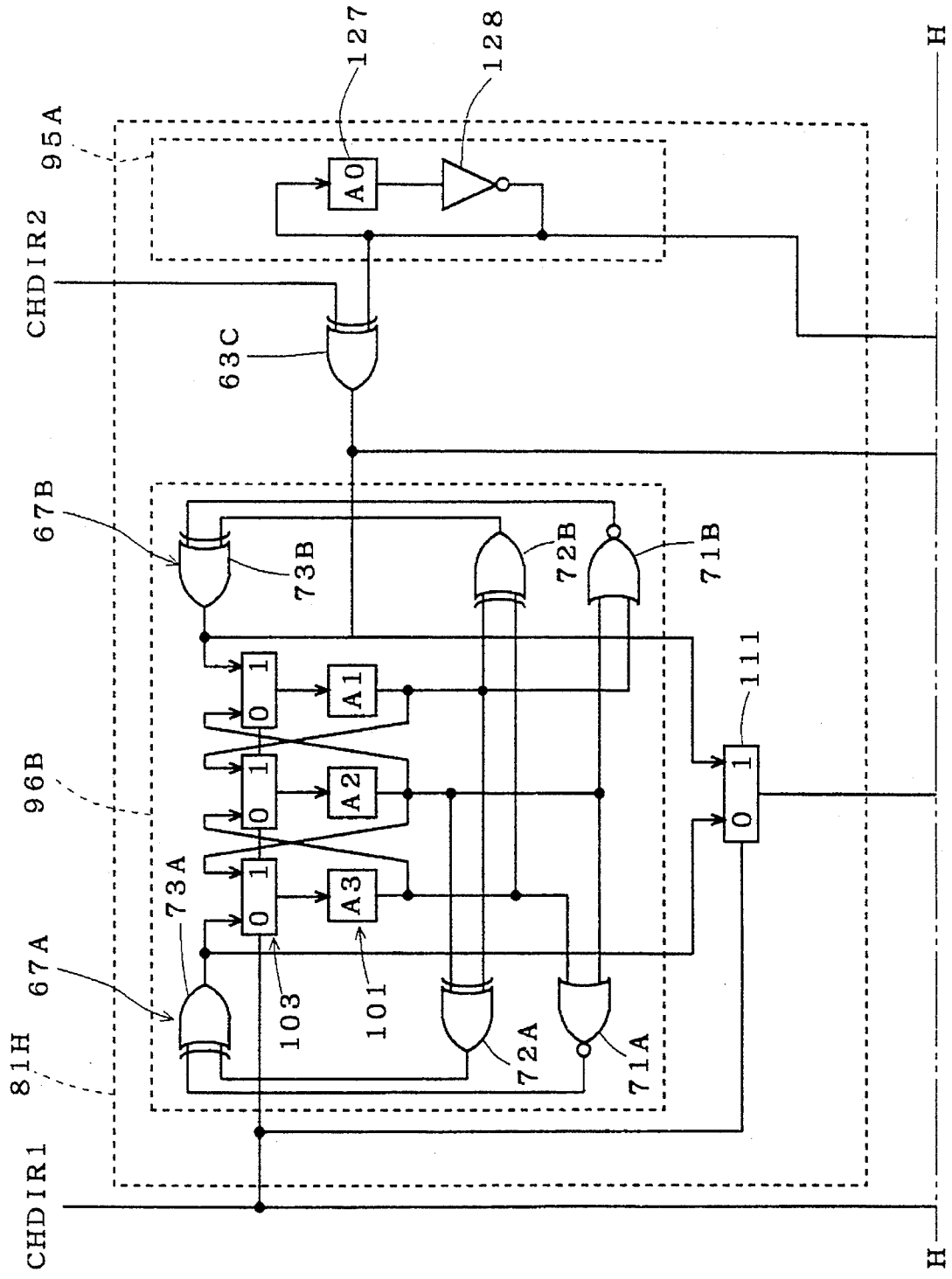
FIGS. 31 and 32 are views of a memory test circuit according to a twelfth preferred embodiment of the present invention.
Figure 32:
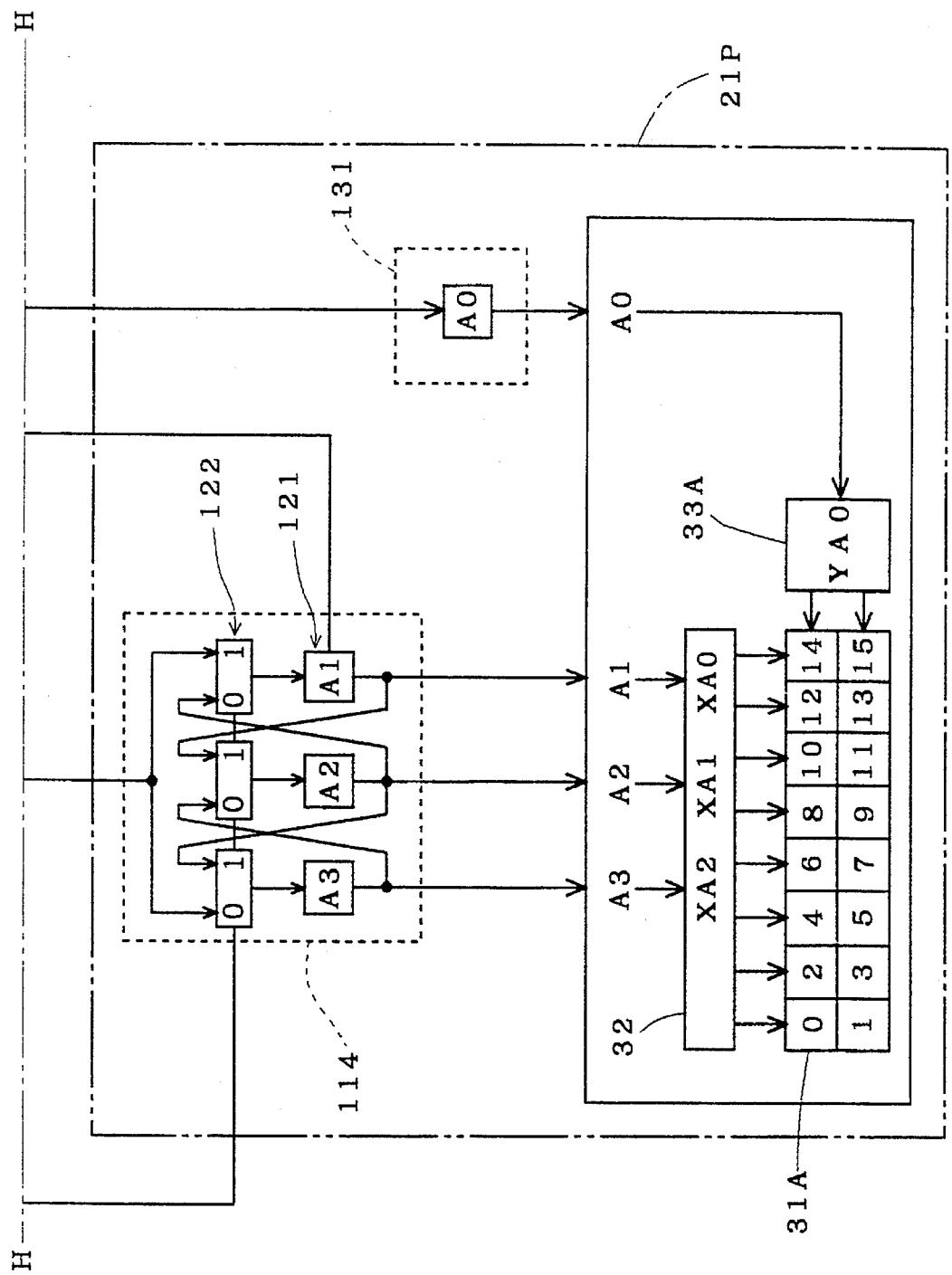

FIGS. 31 and 32 are views of a memory test circuit according to a twelfth preferred embodiment of the present invention. In FIGS. 31 and 32, elements performing similar functions to those of the eleventh preferred embodiment shown in FIGS. 29 and 30 are denoted by identical reference characters. When combined with each other at the dotted line H—H, FIGS. 31 and 32 form one complete drawing. The memory test circuit according to the twelfth preferred embodiment operates similar to the circuit of the eleventh preferred embodiment shown in FIGS. 29 and 30. As shown in FIGS. 31 and 32, an output from the 1-bit circuit generating full cyclic sequence 95A is supplied directly to the 1-bit shift register circuit 131. An output from the selector circuit 111 is commonly coupled to the forward direction input and the reverse direction input of the first bi-directional shift register circuit 114. In FIG. 31, denoted at 81H is an address generating circuit. Denoted at 21P in FIG. 32 is a memory circuit. The circuit structure is otherwise the same as that of the eleventh preferred embodiment shown in FIGS. 29 and 30 and will not be described here.

In the memory test circuit having such a structure as above, when initial values of the shift registers are appropriately set, the circuit of FIGS. 31 and 32 behaves similar to the circuit of FIGS. 29 and 30.

THIRTEENTH PREFERRED EMBODIMENT

Structure

Figure 33:
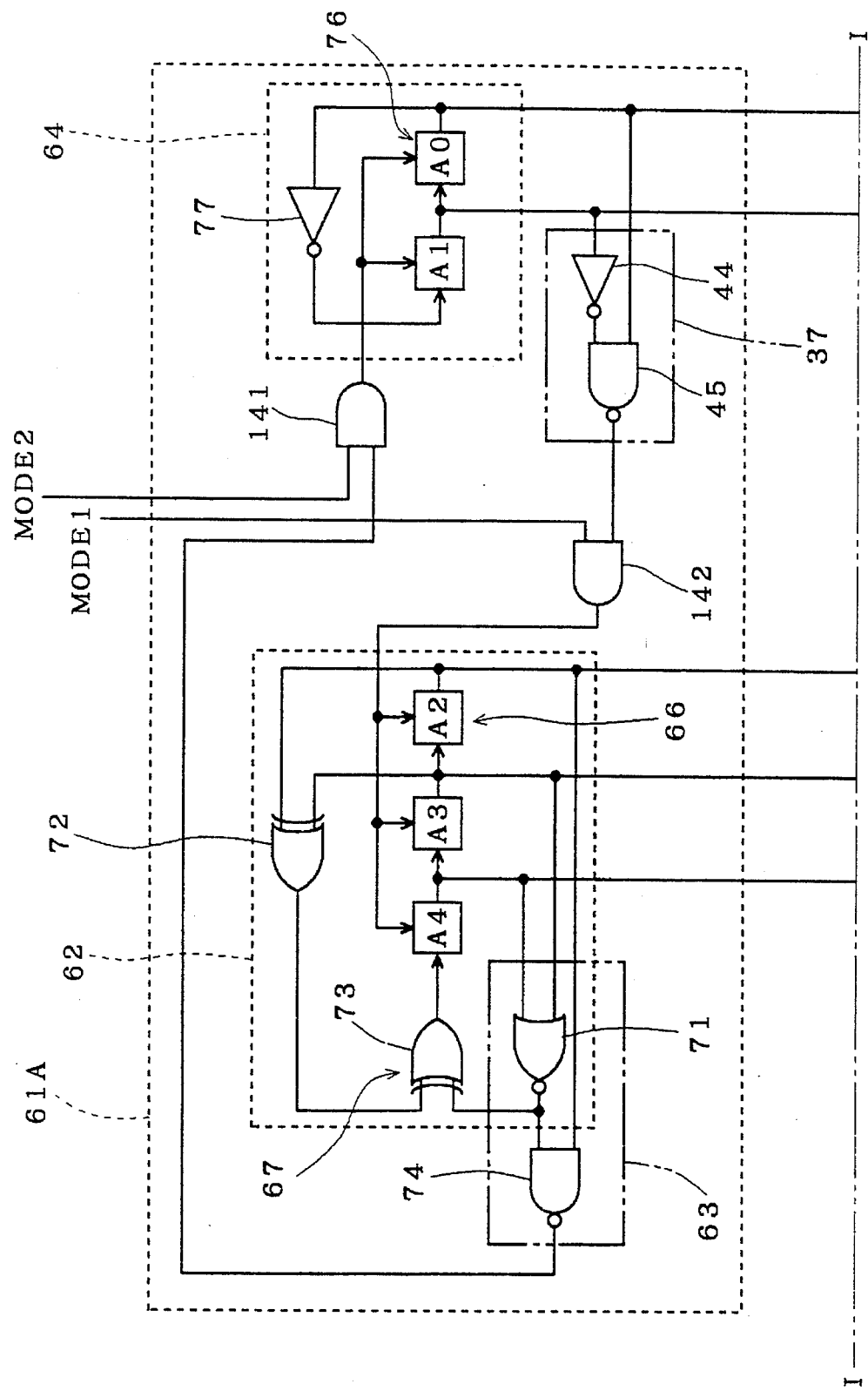
FIGS. 33 and 34 are views of a memory test circuit according to a thirteenth preferred embodiment of the present invention.
Figure 34:
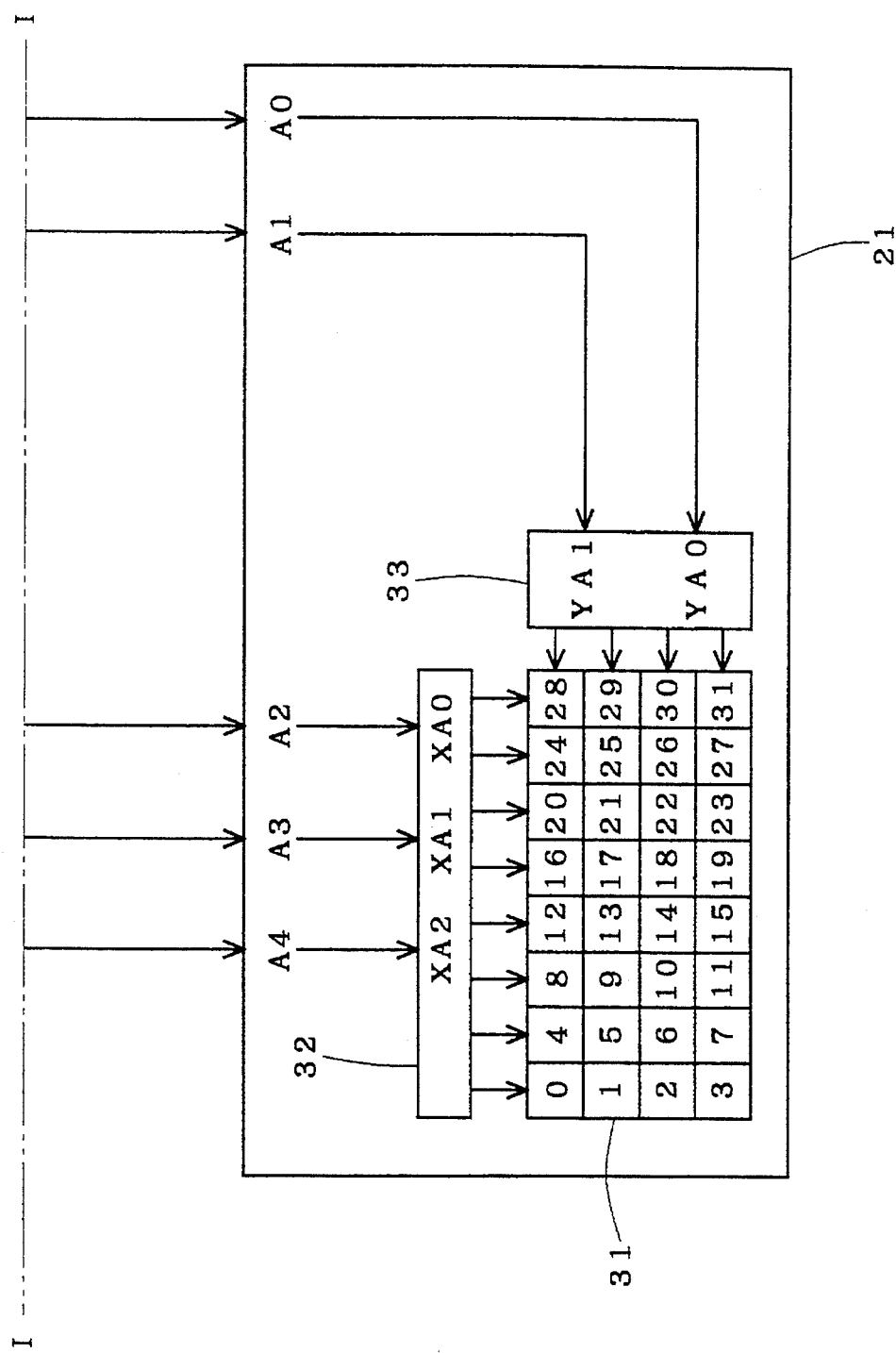

FIGS. 33 and 34 are views of a memory test circuit according to a thirteenth preferred embodiment of the present invention. In FIGS. 33 and 34, elements performing similar functions to those of the first preferred embodiment shown in FIG. 1 and the second preferred embodiment shown in FIG. 3 are denoted by identical reference characters. The memory test circuit according to the thirteenth preferred embodiment is structured to be able to perform in a mode which is associated with the function realized in the first preferred embodiment and in a mode which is associated with the function realized in the second preferred embodiment. That is, the thirteenth preferred embodiment is similar to the second preferred embodiment in that the first circuit generating full cyclic sequence 62 comprises the 3-bit shift register 66 and the feedback circuit 67 which is formed by one NOR circuit 71 and two XOR circuits 72 and 83 while the second circuit generating full cyclic sequence 64 comprises the 2-bit shift register 76 and the invertor circuit 77 which serves as a feedback circuit. A difference from the second preferred embodiment is to use the pair of the specific state detection circuits, i.e., the specific state detection circuit 63 for detecting a specific state of an output (X address value) from the first circuit generating full cyclic sequence 62 and rendering the second circuit generating full cyclic sequence 64 inoperable and the specific state detection circuit 37 (auxiliary specific state detection circuit) for detecting a specific state of an output (Y address value) from the second circuit generating full cyclic sequence 64 and rendering the first circuit generating full cyclic sequence 62 inoperable. One of the specific state detection circuits 37 and 63 is made operable selectively by supplying control signals MODE1 and MODE2 to associated AND circuits 141 and 142 from outside. In FIG. 33, denoted at 61A is an address generating circuit. The circuit structure is otherwise the same as that of the second preferred embodiment and will not be described here.

Operation

In such a circuit structure as above, the second circuit generating full cyclic sequence 64 is always operable when MODE1=1 and MODE2=0, whereby the first circuit generating full cyclic sequence 62, restricted by the state of the second circuit generating full cyclic sequence 64, operates in the manner as that shown in FIG. 2.

On the other hand, when MODE1=0 and MODE2=1, the first circuit generating full cyclic sequence 62 is always operable, whereby the second circuit generating full cyclic sequence 64, restricted by the state of the first circuit generating full cyclic sequence 62, operates in the manner as that shown in FIG. 4.

As described above, in the thirteenth preferred embodiment, it is possible to selectively perform a test in which an X address is updated after thoroughly changing a Y address and a test in which a Y address is updated after thoroughly changing an X address depending on the need.

FOURTEENTH PREFERRED EMBODIMENT

Structure

Figure 35:
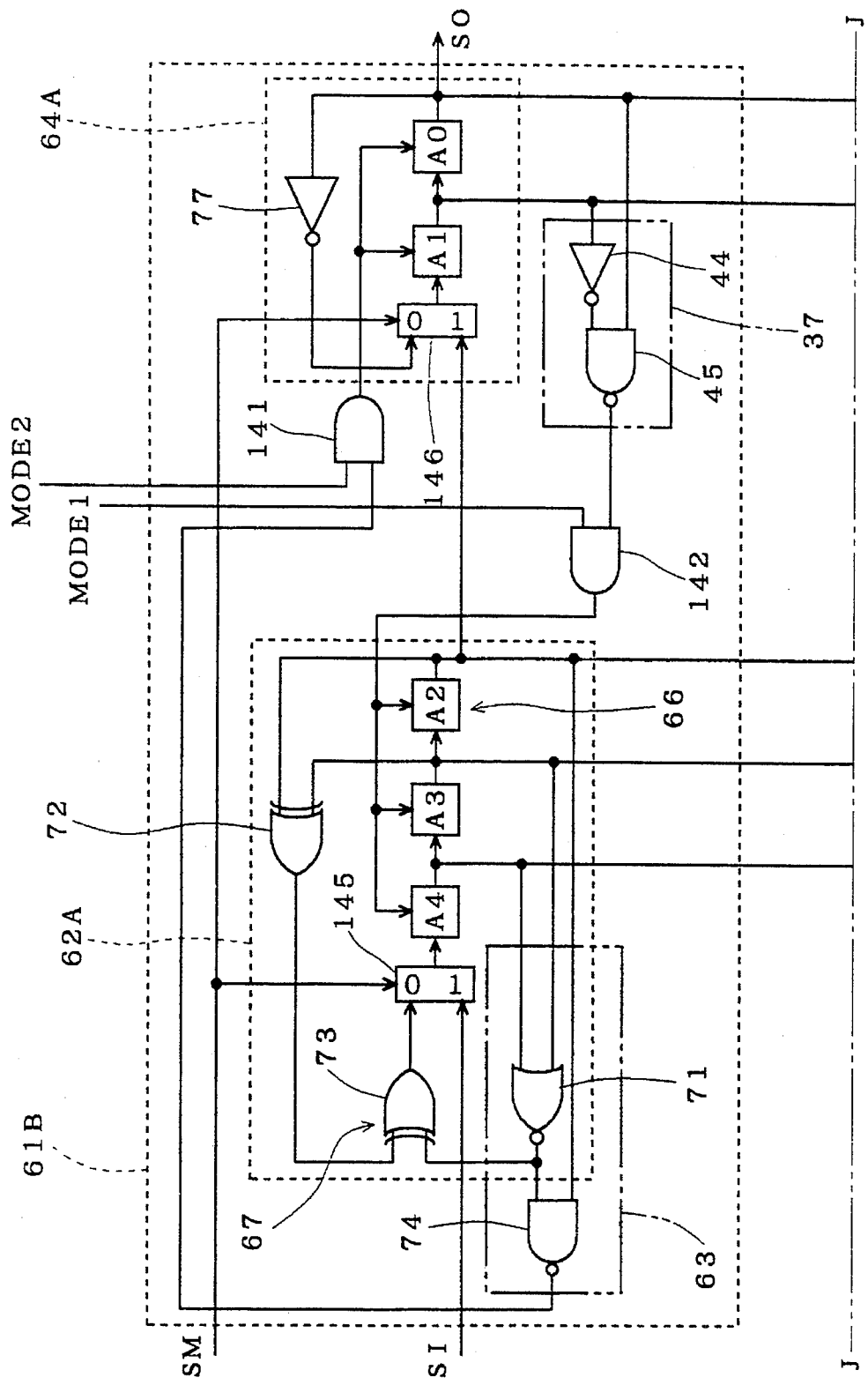
FIGS. 35 and 36 are views of a memory test circuit according to a fourteenth preferred embodiment of the present invention.
Figure 36:
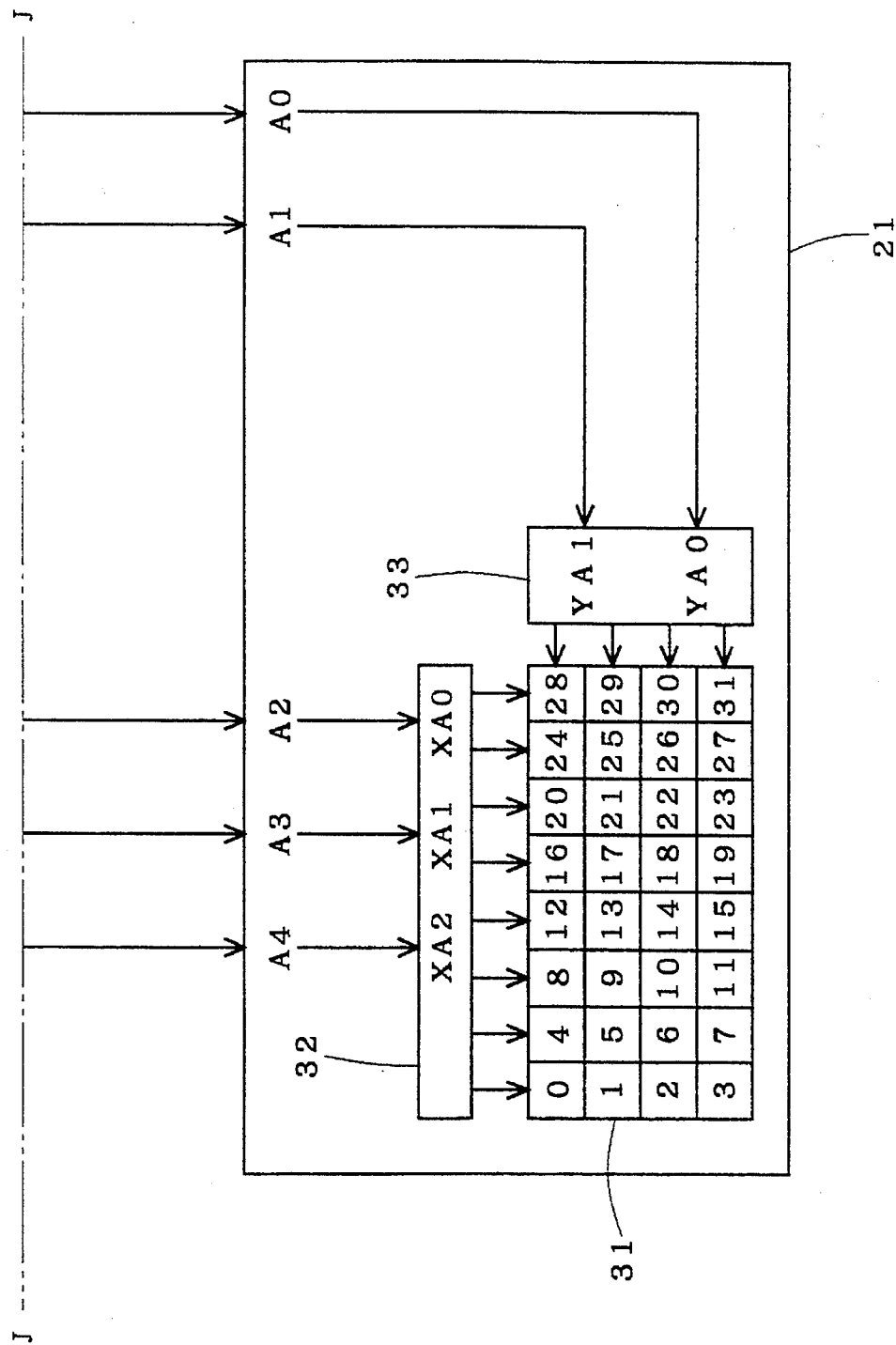
Figure 37:
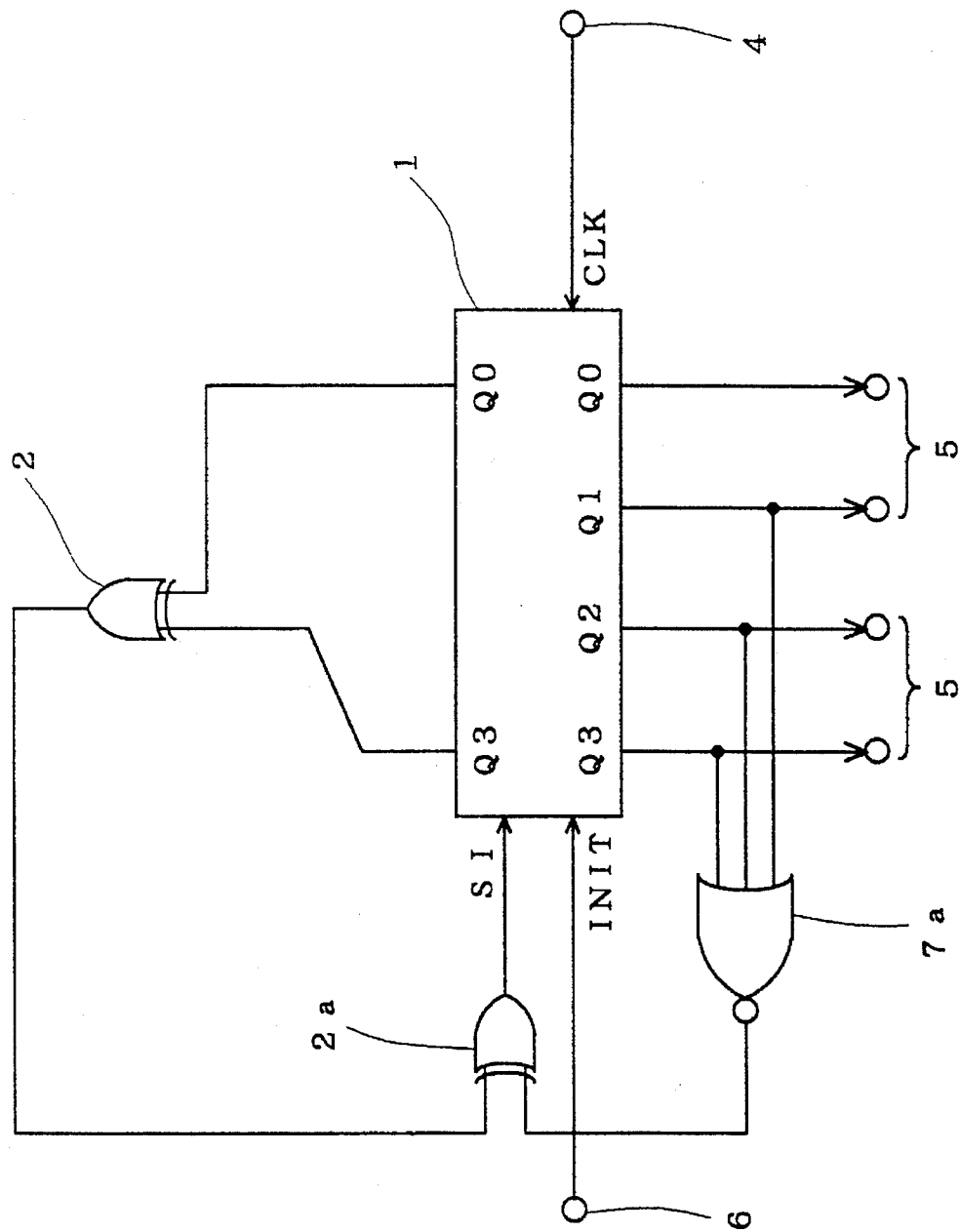
FIG. 37 is a view of a memory test circuit according to a first conventional technique.
Figure 38:
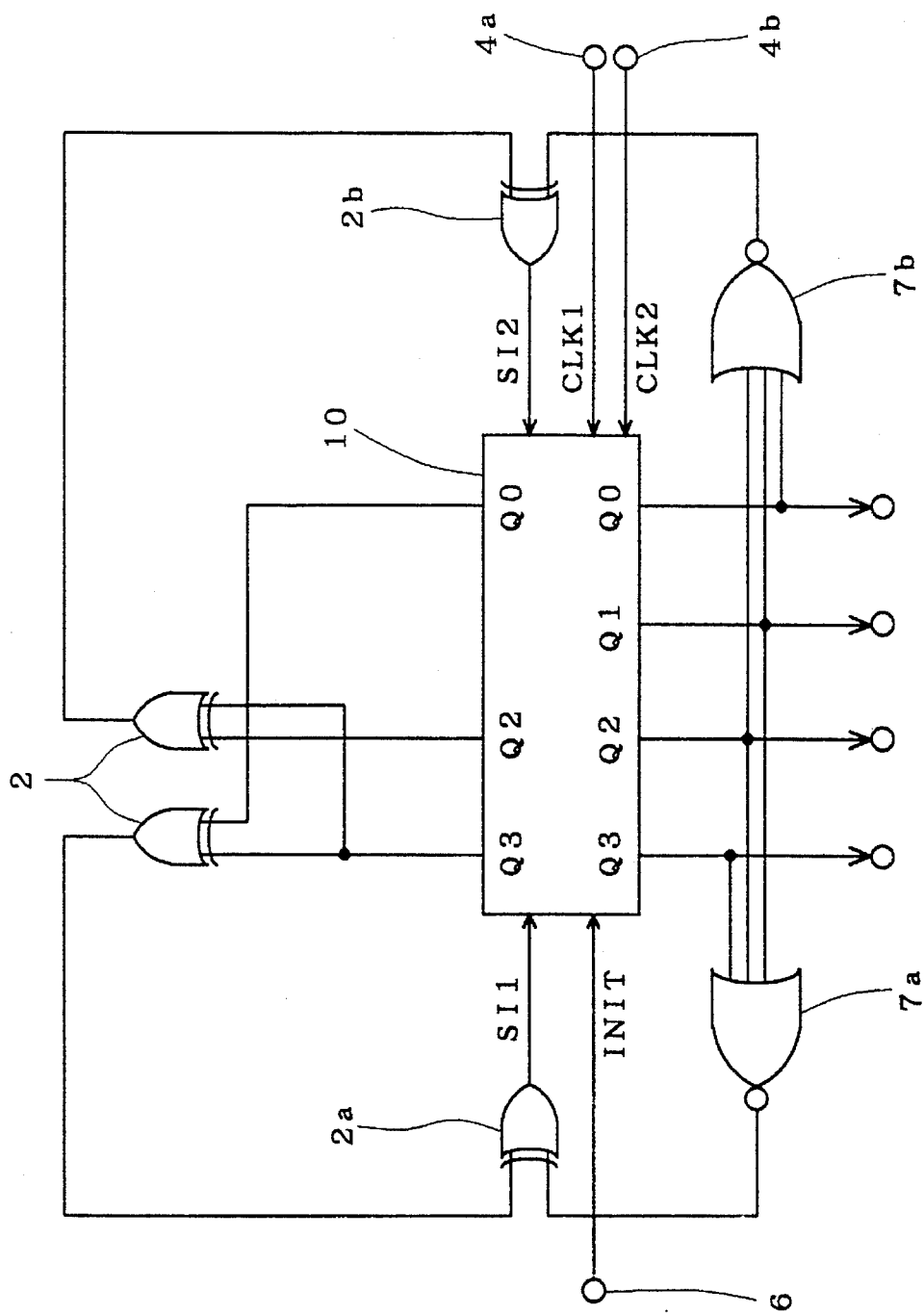
FIG. 38 is a view of a memory test circuit according to a second conventional technique.
Figure 39:
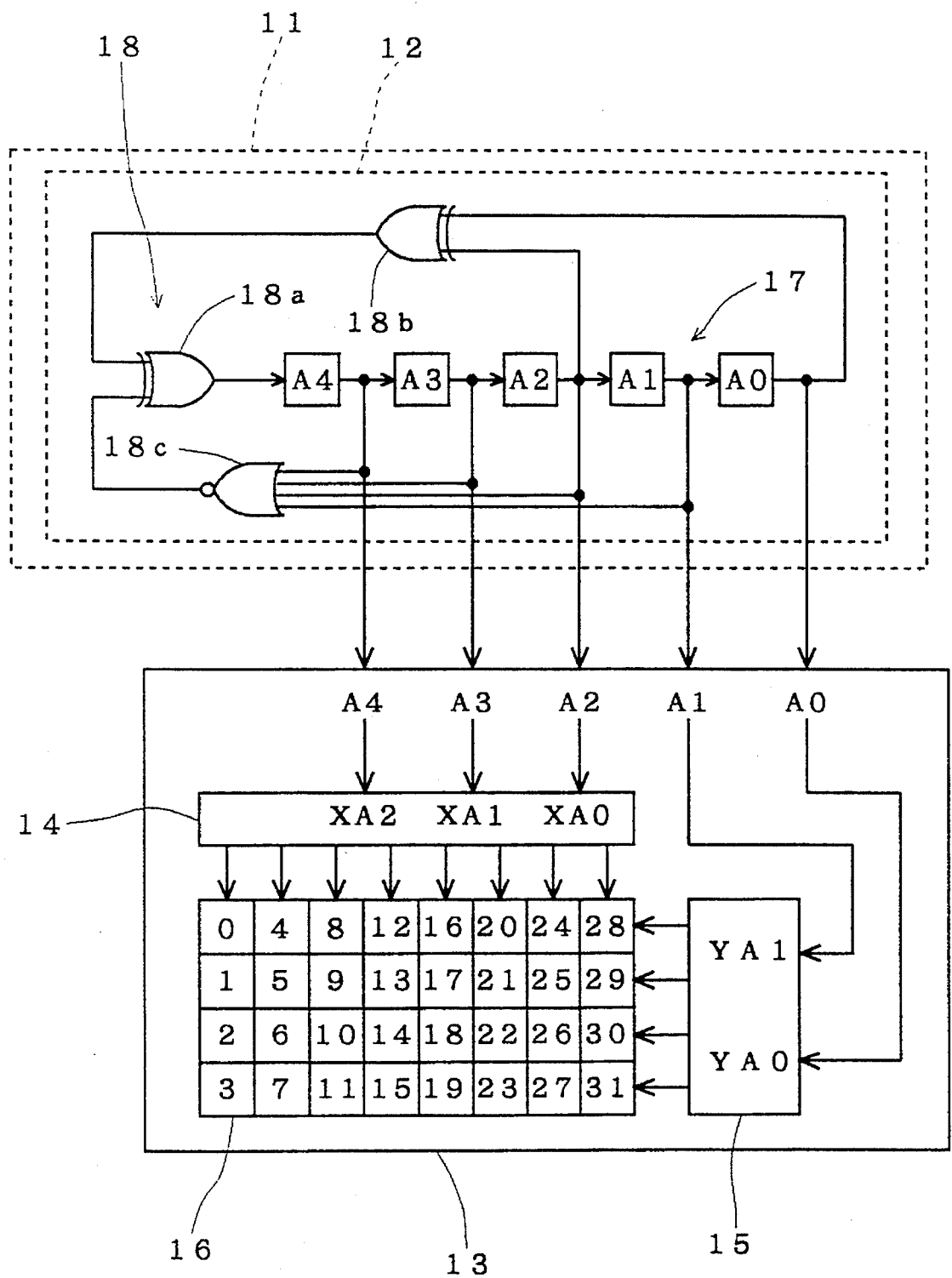
FIG. 39 is a view of a memory test circuit according to a third conventional technique.

FIGS. 35 and 36 are views of a memory test circuit according to a fourteenth preferred embodiment of the present invention. In FIGS. 35 and 36, elements performing similar functions to those of the thirteenth preferred embodiment shown in FIGS. 33 and 34 are denoted by identical reference characters. The memory test circuit according to the fourteenth preferred embodiment comprises circuit generating full cyclic sequences 62A and 64A which are the same as the circuit generating full cyclic sequences 62 and 64 of the thirteenth preferred embodiment as they are modified to comprise selector circuits 145 and 146 which are disposed between the data input terminals of the shift registers 66 and 76 and the feedback circuits 67 and 77. The circuit generating full cyclic sequences 62A and 64A therefore perform scanning. In FIG. 35, denoted at SI is a serial input pin, denoted at SO is a serial output pin and denoted at SM is a shift mode control pin. The circuit structure is otherwise the same as that of the thirteenth preferred embodiment and will not be described here.

Operation

When "0" is supplied to the shift mode control pin SM, the circuit of the fourteenth preferred embodiment performs like the circuit of the thirteenth preferred embodiment. When "1" is supplied to the shift mode control pin SM, a series path is established from the serial input pin SI to the serial output pin SO. If MODE1=MODE2=0 when "1" is supplied to the shift mode control pin SM, the shift registers disposed within the two circuit generating full cyclic sequences 62A and 64A are operable, which makes it possible to perform a series shifting operation.

Since the circuit generating full cyclic sequences 62A and 64A have a scanning function, it is possible to set optional initial values to the circuit generating full cyclic sequences 62A and 64A by a series shifting operation.

The initial values may be set by means of setting or resetting means which is disposed for each shift register of the circuit generating full cyclic sequences.

Modifications (1) Although the foregoing has described the present invention limiting to memory test circuits, the present invention is applicable to any semiconductor integrated circuit device which sequentially changes an address.

(2) Complete circuit generating full cyclic sequences such as the circuit generating full cyclic sequences used in the preferred embodiments above which periodically and systematically generate all values of an address while sequentially changing the values of the address may be replaced with incomplete circuit generating full cyclic sequences, i.e., circuits such as an LFSR which periodically and systematically generates some values of an address while sequentially changing the values of the address. In such a case, an LFSR generates all addresses except for an all-zero value (ALL"0") of each internal shift register. Alternatively, a circuit generating full cyclic sequence may be used for an X address and an LFSR may be used for a Y address or vice versa.

(3) The fourteenth preferred embodiment modifies the circuit generating full cyclic sequences 62 and 64 of the thirteenth preferred embodiment so that the circuit generating full cyclic sequences have a scanning function. The circuit generating full cyclic sequences used in the first to the twelfth preferred embodiments may be modified as well to have a scanning function.

(4) Although an exclusive OR circuit is used as the specific state detection circuit 63C in the tenth preferred embodiment, a circuit having an opposite function (i.e., an exclusive NOR circuit such as an NOR circuit) may be used instead. In such a case, the second bi-directional circuit generating full cyclic sequence 96B is made inoperable only when the second operation mode switch signal (CHDIR2) coincides with an address state of the 1-bit first circuit generating full cyclic sequence 95A.

While the invention has been described in detail, the foregoing description is in all aspects illustrative and not restrictive. It is understood that numerous other modifications and variations can be devised without departing from the scope of the invention.

I claim:

1. A semiconductor integrated circuit device comprising:
    a memory circuit which comprises a plurality of memory cells, an X decoder for designating an X address of said memory cells and a Y decoder for designating a Y address of said memory cells; and
    an address generating circuit for generating addresses of both said X decoder and said Y decoder, wherein
    said address generating circuit comprises:

a first circuit generating full cyclic sequence for generating all values of an address of one of said X decoder and said Y decoder while sequentially, periodically and systematically changing the values of said address;

a second circuit generating full cyclic sequence for generating all values of an address of the other one of said X decoder and said Y decoder while sequentially, periodically and systematically changing the values of said address; and a specific state detection circuit for detecting a specific address state in said first circuit generating full cyclic sequence and for rendering said second circuit generating full cyclic sequence inoperable when said first circuit generating full cyclic sequence is in a state other than said specific address state.

2. The semiconductor integrated circuit device of claim 1, wherein said first circuit generating full cyclic sequence comprises:

a first shift register portion which corresponds to a bit number of an address to be generated; and a first feedback circuit for returning address data which is held in said first circuit generating full cyclic sequence as feedback so that said address data which is held in said first circuit generating full cyclic sequence is systematically changed, said second circuit generating full cyclic sequence comprises:

a second shift register portion which corresponds to a bit number of an address to be generated; and a second feedback circuit for returning address data which is held in said second circuit generating full cyclic sequence as feedback so that said address data which is held in said second circuit generating full cyclic sequence is systematically changed, said memory circuit comprises:

a first shift register circuit which is structured similar to said first shift register portion of said first circuit generating full cyclic sequence and connected to one of said X decoder and said Y decoder, said first shift register circuit operating similar to said first shift register portion in response to an output signal supplied from said first feedback circuit of said first circuit generating full cyclic sequence; and a second shift register circuit which is structured similar to said second shift register portion of said second circuit generating full cyclic sequence and connected to the other one of said X decoder and said Y decoder, said second shift register circuit operating similar to said second shift register portion in response to an output signal supplied from said second feedback circuit of said second circuit generating full cyclic sequence.

3. The semiconductor integrated circuit device of claim 2, wherein said address generating circuit further comprises a selector circuit for detecting whether said second circuit generating full cyclic sequence is in an operable state or an inoperable state in accordance with a signal which is supplied from said specific state detection circuit, said address generating circuit selects an output which is supplied from said first circuit generating full cyclic sequence if said second circuit generating full cyclic sequence is in the inoperable state but selects an output which is supplied from said second circuit generating full cyclic sequence if said second circuit generating full cyclic sequence is in the operable state, said memory circuit further comprises a gate circuit for transmitting an output from said selector circuit to said first shift register circuit if said second circuit generating full cyclic sequence is in the inoperable state in accordance with a signal which is supplied from said specific state detection circuit, said gate circuit transmitting fixed data to said first shift register circuit if said second circuit generating full cyclic sequence is in the operable state, an input terminal of said second shift register circuit of said memory circuit is connected to said selector circuit, and said second shift register circuit performs a shifting operation under the control of said specific state detection circuit.

4. The semiconductor integrated circuit device of claim 1, wherein said first and said second circuit generating full cyclic sequences each comprise a bi-directional circuit generating full cyclic sequence for shifting data in two directions, said first circuit generating full cyclic sequence comprises:

a first bi-directional shift register portion which corresponds to a bit number of an address to be generated; and a first bi-directional feedback circuit for returning address data which is held in said first bi-directional shift register portion as feedback so that said address data which is held in said first bi-directional shift register portion is systematically changed, said second circuit generating full cyclic sequence comprises:

a second bi-directional shift register portion which corresponds to a bit number of an address to be generated; and a second bi-directional feedback circuit for returning address data which is held in said second bi-directional shift register portion as feedback so that said address data which is held in said second bi-directional shift register portion is systematically changed, and said specific state detection circuit renders said second circuit generating full cyclic sequence inoperable if said first circuit generating full cyclic sequence is in a state other than a predetermined first state during a forward direction operation mode of said first circuit generating full cyclic sequence, said specific state detection circuit renders said second circuit generating full cyclic sequence inoperable if said first circuit generating full cyclic sequence is a state other than a predetermined second state during a reverse direction operation mode of said first circuit generating full cyclic sequence.

5. The semiconductor integrated circuit device of claim 4, wherein said address generating circuit further comprises:

a first selector circuit which selects one of output signals of two directions which are supplied from said first circuit generating full cyclic sequence in accordance with a first operation mode switching signal which is supplied from outside;

a second selector circuit which selects one of output signals of two directions which are supplied from said second circuit generating full cyclic sequence in accordance with a second operation mode switching signal which is supplied from outside; and a third selector circuit which detects whether said second circuit generating full cyclic sequence is in an operable state or an inoperable state in accordance with a signal which is supplied from said specific state detection circuit, said third selector circuit selects an output which is supplied from said first selector circuit when said second circuit generating full cyclic sequence is in the inoperable state but selects an output which is supplied from said second selector circuit when said second circuit generating full cyclic sequence is in the operable state, said memory circuit further comprises:

a first bi-directional shift register circuit which is structured similar to said first shift bi-directional register portion of said first circuit generating full cyclic sequence and connected to one of said X decoder and said Y decoder, the direction of operation of said first bi-directional shift register circuit being switched in response to said first operation mode switching signal like said first shift bi-directional register portion;

a second bi-directional shift register circuit which is structured similar to said second bi-directional shift register portion of said second circuit generating full cyclic sequence and connected to the other one of said X decoder and said Y decoder, the direction of operation of said second shift bi-directional register circuit being switched in response to said second operation mode switching signal like said second bi-directional shift register portion;

a first gate circuit for detecting whether said second circuit generating full cyclic sequence is in an operable state or an inoperable state in accordance with a signal which is supplied from said specific state detection circuit, said first gate circuit transmitting an output from said third selector circuit to a forward direction input of said first bi-directional shift register circuit if said second circuit generating full cyclic sequence is in the inoperable state but transmitting predetermined fixed data to said forward direction input of said first bi-directional shift register circuit if said second circuit generating full cyclic sequence is in the operable state; and a second for detecting whether said second circuit generating full cyclic sequence is in an operable state or an inoperable state in accordance with a signal which is supplied from said specific state detection circuit, said second gate circuit transmitting an output from said third selector circuit to a reverse direction input of said first bi-directional shift register circuit if said second circuit generating full cyclic sequence is in the inoperable state but transmitting predetermined fixed data to said reverse direction input of said first bi-directional shift register circuit if said second circuit generating full cyclic sequence is in the operable state, and said output signal from said third selector circuit is supplied to input terminals corresponding to two directions of said second circuit generating full cyclic sequence.

6. The semiconductor integrated circuit device of claim 1, wherein said first circuit generating full cyclic sequence is a bi-directional circuit generating full cyclic sequence which shifts data in two directions, said second circuit generating full cyclic sequence is a 1-bit circuit generating full cyclic sequence, said first circuit generating full cyclic sequence comprises:

a bi-directional shift register portion which corresponds to a bit number of an address to be generated; and a bi-directional feedback circuit for returning address data which is held in said bi-directional shift register portion as feedback so that said address data which is held in said bi-directional shift register portion is changed, and said specific state detection circuit renders said second circuit generating full cyclic sequence inoperable if said first circuit generating full cyclic sequence is in a state other than a predetermined first state during a forward direction operation mode of said first circuit generating full cyclic sequence, said specific state detection circuit renders said second circuit generating full cyclic sequence inoperable if said first circuit generating full cyclic sequence is a state other than a predetermined second state during a reverse direction operation mode of said first circuit generating full cyclic sequence.

7. The semiconductor integrated circuit device of claim 6, wherein said address generating circuit comprises:

a first selector circuit which selects one of output signals of two directions which are supplied from said first circuit generating full cyclic sequence in accordance with a first operation mode switching signal which is supplied from outside;

a second selector circuit which detects whether said second circuit generating full cyclic sequence is in an operable state or an inoperable state in accordance with a signal which is supplied from said specific state detection circuit, said second selector circuit selecting an output from said first selector circuit if said second circuit generating full cyclic sequence is in the inoperable state but selecting an output from said second circuit generating full cyclic sequence if said second circuit generating full cyclic sequence is in the operable state, said memory circuit further comprises:

a bi-directional shift register circuit which is structured similar to said bi-directional shift register portion of said first circuit generating full cyclic sequence and connected to one of said X decoder and said Y decoder, the direction of operation of said bi-directional shift register circuit being switched in response to said first operation mode switching signal like said bi-directional shift register portion of said first circuit generating full cyclic sequence;

a 1-bit shift register circuit which is connected to the other one of said X decoder and said Y decoder, said 1-bit shift register circuit operating in accordance with a signal which is supplied from said specific state detection circuit;

a first gate circuit for detecting whether said 1-bit shift register circuit is in an operable state or an inoperable state in accordance with a signal which is supplied from said specific state detection circuit, said first gate circuit transmitting an output from said second selector circuit to a forward direction input of said bi-directional shift register circuit if 1-bit shift register circuit is in the inoperable state but transmitting predetermined fixed data to said forward direction input of said bi-directional shift register circuit if 1-bit shift register circuit is in the operable state; and a second gate circuit for detecting whether said 1-bit shift register circuit is in an operable state or an inoperable state in accordance with a signal which is supplied from said specific state detection circuit, said second gate circuit transmitting an output from said second selector circuit to a reverse direction input of said bi-directional shift register circuit if 1-bit shift register circuit is in the inoperable state but transmitting predetermined fixed data to said reverse direction input of said bi-directional shift register circuit if 1-bit shift register circuit is in the operable state, and an input terminal of said 1-bit shift register circuit is connected to said second selector circuit.

8. The semiconductor integrated circuit device of claim 1, wherein said first circuit generating full cyclic sequence is a 1-bit circuit generating full cyclic sequence, said second circuit generating full cyclic sequence is a bi-directional circuit generating full cyclic sequence which selects one of two directions as a shifting direction of shifting data in accordance with a first operation mode switching signal which is supplied from outside, said second circuit generating full cyclic sequence comprises:

a bi-directional shift register portion which corresponds to a bit number of an address to be generated; and a bi-directional feedback circuit for returning address data which is held in said bi-directional shift register portion as feedback in the two directions so that said address data which is held in said bi-directional shift register portion is changed, and said specific state detection circuit comprises an exclusive OR circuit which receives an output from said first circuit generating full cyclic sequence and a second operation mode switching signal which is supplied from outside, said specific state detection circuit rendering said second circuit generating full cyclic sequence inoperable only when said second operation mode switching signal coincides or does not coincide with an address state of said first 1-bit circuit generating full cyclic sequence.

9. The semiconductor integrated circuit device of claim 8, wherein said address generating circuit further comprises:

a first selector circuit which selects one of output signals of two directions which are supplied from said second circuit generating full cyclic sequence in accordance with said first operation mode switching signal;

a second selector circuit which detects whether said second circuit generating full cyclic sequence is in an operable state or an inoperable state in accordance with a signal which is supplied from said specific state detection circuit, said second selector circuit selecting an output from said first selector circuit if said second circuit generating full cyclic sequence is in the inoperable state but selecting an output from said first selector circuit if said second circuit generating full cyclic sequence is in the operable state, said memory circuit further comprises:

a bi-directional shift register circuit which is structured similar to said bi-directional shift register portion of said second circuit generating full cyclic sequence and connected to said other one of said X decoder and said Y decoder, said bi-directional shift register circuit receiving an output signal from said second selector circuit at a forward input and a reverse input of said bi-directional shift register circuit, said bi-directional shift register circuit being rendered inoperable in accordance with a signal which is supplied from said specific state detection circuit like said second circuit generating full cyclic sequence, the direction of operation of said bi-directional shift register circuit being switched in response to said first operation mode switching signal;

a third selector circuit which detects whether said second circuit generating full cyclic sequence and said bi-directional shift register circuit are in an operable state or an inoperable state in accordance with a signal which is supplied from said specific state detection circuit, said third selector circuit selecting an output which is supplied from said second selector circuit when said second circuit generating full cyclic sequence and said bi-directional shift register circuit are in the inoperable state but selecting said second first operation mode switching signal when said second circuit generating full cyclic sequence and said bi-directional shift register circuit are in the operable state; and a 1-bit shift register circuit which is connected to the said one of said X decoder and said Y decoder, said 1-bit shift register circuit receiving an output signal from said third selector circuit.

10. The semiconductor integrated circuit device of claim 8, wherein said address generating circuit further comprises a selector circuit which selects one of output signals of two directions which are supplied from said second circuit generating full cyclic sequence in accordance with said first operation mode switching signal, said memory cell further comprises:

a 1-bit shift register circuit which is connected to said other one of said X decoder and said Y decoder, said 1-bit shift register circuit receiving an output signal from said first selector circuit; and a bi-directional shift register circuit which is structured similar to said bi-directional shift register portion of said second circuit generating full cyclic sequence and connected to said other one of said X decoder and said Y decoder, said bi-directional shift register circuit receiving an output signal from said selector circuit at a forward input and a reverse input of said bi-directional shift register circuit, the direction of operation of said bi-directional shift register circuit being switched in response to said first operation mode switching signal.

11. The semiconductor integrated circuit device of claim 1, wherein said address generating circuit further comprises:

an auxiliary specific state detection circuit which detects a specific address state within said second circuit generating full cyclic sequence and renders said first circuit generating full cyclic sequence if said second circuit generating full cyclic sequence is in a state other than said specific address state; and selection means which selects one of said specific state detection circuit and said auxiliary specific state detection circuit as a circuit to be rendered operable.

12. The semiconductor integrated circuit device of claim 1, wherein said address generating circuit further comprises scan path selection means which allows said first and said second circuit generating full cyclic sequences to be serially connected to each other to establish a scan path or alternatively separates said first circuit generating full cyclic sequence from said second circuit generating full cyclic sequence.

* * * * *